United States Patent
Nakao et al.

(10) Patent No.: US 7,214,465 B2
(45) Date of Patent: May 8, 2007

(54) POSITIVE PHOTOSENSITIVE COMPOSITION

(75) Inventors: Hajime Nakao, Shizuoka (JP); Yasumasa Kawabe, Shizuoka (JP); Toru Fujimori, Shizuoka (JP); Kunihiko Kodama, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 484 days.

(21) Appl. No.: 10/338,737

(22) Filed: Jan. 9, 2003

(65) Prior Publication Data

US 2003/0224285 A1    Dec. 4, 2003

(30) Foreign Application Priority Data

Jan. 10, 2002  (JP) ............................ P.2002-003899
Jan. 10, 2002  (JP) ............................ P.2002-003900

(51) Int. Cl.
G03F 7/004    (2006.01)

(52) U.S. Cl. .................... 430/170; 430/270.1; 430/905; 430/910; 430/921; 430/922

(58) Field of Classification Search ............. 430/270.1, 430/905, 907, 910, 921, 922, 170
See application file for complete search history.

(56) References Cited

U.S. PATENT DOCUMENTS

| | | | |
|---|---|---|---|
| 5,693,452 A | 12/1997 | Aoai et al. | |
| 6,090,518 A * | 7/2000 | Niinomi et al. | ............. 430/170 |
| 6,136,500 A | 10/2000 | Kobayashi et al. | |
| 6,200,728 B1 | 3/2001 | Cameron et al. | |
| 6,265,135 B1 | 7/2001 | Kodama et al. | |
| 6,338,931 B1 * | 1/2002 | Maeda et al. | ................ 430/170 |
| 6,444,397 B2 * | 9/2002 | Hada et al. | ............... 430/270.1 |
| 6,479,210 B2 * | 11/2002 | Kinoshita et al. | ......... 430/270.1 |
| 6,489,080 B2 * | 12/2002 | Uenishi et al. | ........... 430/281.1 |
| 6,492,091 B2 * | 12/2002 | Kodama et al. | .......... 430/270.1 |
| 2001/0033993 A1 | 10/2001 | Kanna et al. | |
| 2003/0134224 A1 * | 7/2003 | Mizutani et al. | .......... 430/270.1 |
| 2003/0134225 A1 * | 7/2003 | Fujimori et al. | .......... 430/270.1 |

FOREIGN PATENT DOCUMENTS

| | | |
|---|---|---|
| JP | 8-123031 | 5/1996 |
| JP | 11-125907 | 5/1999 |
| JP | 2000-187330 | 7/2000 |
| JP | 2000-241965 | 9/2000 |
| JP | 2001-75284 A | 3/2001 |
| JP | 2001-192569 A | 7/2001 |
| JP | 2001-249460 | 9/2001 |
| JP | 2001-343750 | 12/2001 |
| JP | 2002-6495 A | 1/2002 |
| WO | WO 01/42853 A2 | 6/2001 |

OTHER PUBLICATIONS

JP Office Action based on JP 2002-003899 dated Apr. 12, 2006.
JP Office Action based on JP 2002-003900 dated Apr. 12, 2006.

* cited by examiner

*Primary Examiner*—John S. Chu
(74) *Attorney, Agent, or Firm*—Sughrue Mion, PLLC

(57) ABSTRACT

A positive photosensitive composition comprising (A1) a compound that generates an aromatic sulfonic acid substituted with at least one fluorine atom and/or a group having at least one fluorine atom upon irradiation of an actinic ray or radiation, (B) a resin that has a monocyclic or polycyclic alicyclic hydrocarbon structure and is decomposed by the action of an acid to increase solubility in an alkali developing solution, and (C) a compound that has at least three hydroxy or substituted hydroxy groups and at least one cyclic structure or (A2) an onium salt of an alkanesulfonic acid in which the α-position of the sulfonic acid is not substituted with a fluorine atom and/or an onium salt of a carboxylic acid.

11 Claims, No Drawings

POSITIVE PHOTOSENSITIVE COMPOSITION

FIELD OF THE INVENTION

The present invention relates to a positive photosensitive composition used in the production process of semiconductor devices, for example, IC, in the production of circuit substrates for liquid crystals or thermal heads, or in other photofabrication processes. More specifically, the present invention pertains to a positive photosensitive composition suitable for use a far ultraviolet ray of not more than 250 nm as a light source for exposure.

BACKGROUND OF THE INVENTION

A chemical amplification type positive resist composition is a pattern formation material in which an acid is generated in the exposed area upon irradiation of radiation, for example, a far ultraviolet ray, and solubility in a developing solution between the exposed area and unexposed area is differentiated by a reaction using the acid as a catalyst, whereby a pattern is formed on a substrate.

In case of using a KrF excimer laser as the light source for exposure, since the composition is mainly composed of a resin having as a basic skeleton, poly(hydroxystyrene) that has a small absorption in a region of 248 nm, a good pattern with high sensitivity and high resolution is formed. Thus, the composition is superior to a conventional resist composition of naphthoquinonediazide/novolac resin.

However, when a light source having a shorter wavelength, e.g., an ArF excimer laser (193 nm) is used for exposure, since the aromatic group-containing compound essentially has a large absorption in a region of 193 nm, the above-described chemical amplification resist composition is still insufficient.

The use of poly(meth)acrylate as a polymer having a small absorption in a wavelength region of 193 nm is described in *J. Vac. Sci. Technol.*, B9, 3357 (1991). The polymer has, however, a problem in that resistance to dry etching, which is ordinarily conducted in the semiconductor production process, is low in comparison with conventional phenolic resins having an aromatic group.

In JP-A-2001-192569 (the term "JP-A" as used herein means an "unexamined published Japanese patent application"), there is described a mixture of a specific aliphatic sulfonium salt that generates a fluorine-substituted alkanesulfonic acid and a triphenylsulfonium salt or diphenyliodonium salt that generates a fluorine-substituted alkanesulfonic acid, as an acid generator for use in a resist composition.

However, the ArF resist has problems with development defect and PED stability. Therefore, technical developments to solve these problems have been desired.

The term "PED (post exposure delay) stability" as used herein means stability with the lapse of time in that even when a resist is allowed to stand in an exposure apparatus after the exposure until conducting a heating operation, whether a resist pattern having the same linewidth as a resist pattern obtained by conducting the heating operation just after exposure can be reproduced.

The ArF resist has also problems with line edge roughness and profile of trench pattern. The term "line edge roughness" as used herein means a phenomenon wherein an edge between a line pattern of resist and a surface of substrate irregularly fluctuates in the direction vertical to the line due to the characteristics of resist, and when the pattern is observed from just above, the edge is uneven. Since the unevenness is transferred to the substrate in an etching step where the resist is used as a mask, the unevenness causes a defect in electric properties thereby resulting in yield reduction. In particular, the line edge roughness is an extremely important subject to be improved in the field of ultra-fine pattern of not more than 0.25 μm.

Further, in the trench pattern there is a tendency of increasing the line edge roughness as compared with conventional patterns and the improvement therein has been requested.

Also, it is difficult to achieve the formation of rectangular profile in the trench pattern as compared with in the case of line pattern and pent roof-shaped profile is frequently formed by conventional ArF resists. Thus, technical developments to solve these problems have been desired.

SUMMARY OF THE INVENTION

Therefore, an object of the present invention is to provide a positive photosensitive composition that is refrained from the occurrence of development defect and is excellent in the PED stability.

Another object of the present invention is to provide a positive photosensitive composition that is improved in the line edge roughness and is excellent in the profile.

Other objects of the present invention will become apparent from the following description.

The above-described objects of the present invention are accomplished by the positive photosensitive composition described below.

(1) A positive photosensitive composition comprising (A1) a compound that generates an aromatic sulfonic acid substituted with at least one fluorine atom and/or a group having at least one fluorine atom upon irradiation of an actinic ray or radiation, (B) a resin that has a monocyclic or polycyclic alicyclic hydrocarbon structure and is decomposed by the action of an acid to increase solubility in an alkali developing solution, and (C) a compound that has at least three hydroxy or substituted hydroxy groups and at least one cyclic structure or (A2) an onium salt of an alkanesulfonic acid in which the α-position of the sulfonic acid is not substituted with a fluorine atom and/or an onium salt of a carboxylic acid.

DETAILED DESCRIPTION OF THE INVENTION

The present invention also include the following embodiments:

(1-1) A positive photosensitive composition comprising (A1) a compound that generates an aromatic sulfonic acid substituted with at least one fluorine atom and/or a group having at least one fluorine atom upon irradiation of an actinic ray or radiation, (B) a resin that has a monocyclic or polycyclic alicyclic hydrocarbon structure and is decomposed by the action of an acid to increase solubility in an alkali developing solution, and (C) a compound that has at least three hydroxy or substituted hydroxy groups and at least one cyclic structure.

(1-2) The positive photosensitive composition as described in item (1-1) above, which further comprises (D) a basic compound and (E) a fluorine-based and/or silicon-based surface active agent.

(1-3) The positive photosensitive composition as described in item (1-2) above, wherein the basic compound (D) is a compound having at least one structure selected from an imidazole structure, a diazabicyclo structure, an onium hydroxide structure, an onium carboxylate structure, a trialkylamine structure and an aniline structure.

(1-4) The positive photosensitive composition as described in any one of items (1-1) to (1-3) above, which further comprises (G) a dissolution-inhibiting low-molecular compound having a molecular weight of not more than 3,000 and a group that is decomposed by the action of an acid to increase solubility in an alkali developing solution.

(1-5) The positive photosensitive composition as described in any one of items (1-1) to (1-4) above, which further comprises (F) a mixture solvent of a hydroxy group-containing solvent and a solvent free from a hydroxy group.

(2-1) A positive photosensitive composition comprising (A1) a compound that generates an aromatic sulfonic acid substituted with at least one fluorine atom and/or a group having at least one fluorine atom upon irradiation of an actinic ray or radiation, (B) a resin that has a monocyclic or polycyclic alicyclic hydrocarbon structure and is decomposed by the action of an acid to increase solubility in an alkali developing solution, and (A2) an onium salt of an alkanesulfonic acid in which the α-position of the sulfonic acid is not substituted with a fluorine atom and/or an onium salt of a carboxylic acid.

(2-2) The positive photosensitive composition as described in item (2-1) above, wherein the onium salt (A2) is one selected from a sulfonium salt of an alkanesulfonic acid, an iodonium salt of an alkanesulfonic acid and an ammonium salt of an alkanesulfonic acid.

(2-3) The positive photosensitive composition as described in item (2-1) or (2-2) above, wherein the onium salt of a carboxylic acid (A2) is one selected from a sulfonium salt of a carboxylic acid and an iodonium salt of a carboxylic acid.

(2-4) The positive photosensitive composition as described in any one of items (2-1) or (2-3) above, wherein a carboxylate residue of the onium salt of a carboxylic acid (A2) is one that contains neither an aromatic group nor a carbon-carbon double bond.

(2-5) The positive photosensitive composition as described in any one of items (2-1) to (2-4) above, wherein a carboxylate residue of the onium salt of a carboxylic acid (A2) is a straight chain, branched or cyclic alkylcarboxylic acid anion substituted with a fluorine atom.

(2-6) The positive photosensitive composition as described in any one of items (2-1) to (2-5) above, which further comprises (D) a basic compound and (E) a fluorine-based and/or silicon-based surface active agent.

(2-7) The positive photosensitive composition as described in item (2-6) above, wherein the basic compound (D) is a compound having at least one structure selected from an imidazole structure, a diazabicyclo structure, an onium hydroxide structure, an onium carboxylate structure, a trialkylamine structure and an aniline structure.

(2-8) The positive photosensitive composition as described in any one of items (2-1) to (2-7) above, which further comprises (G) a dissolution-inhibiting low-molecular compound having a molecular weight of not more than 3,000 and a group that is decomposed by the action of an acid to increase solubility in an alkali developing solution.

(2-9) The positive photosensitive composition as described in any one of items (2-1) to (2-8) above, which further comprises (F) a mixture solvent of a hydroxy group-containing solvent and a solvent free from a hydroxy group.

The positive photosensitive composition according to the present invention will be described in more detail below.

<<(A1) Compound that Generates an Aromatic Sulfonic Acid Substituted with at Least One Fluorine Atom and/or a Group having at Least One Fluorine Atom Upon Irradiation of an Actinic Ray or Radiation>>

The compound that generates an aromatic sulfonic acid substituted with at least one fluorine atom and/or a group having at least one fluorine atom upon irradiation of an actinic ray or radiation includes, for example, compounds represented by any one of formulae (A1I) to (A1III) shown below. The aromatic sulfonic, acid includes a benzenesulfonic acid, a naphthalenesulfonic acid and an anthracenesulfonic acid.

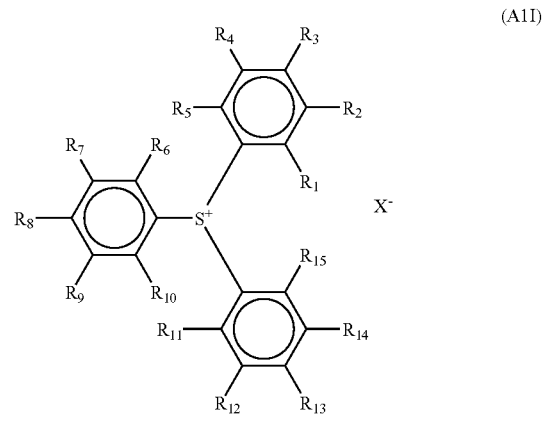

(A1I)

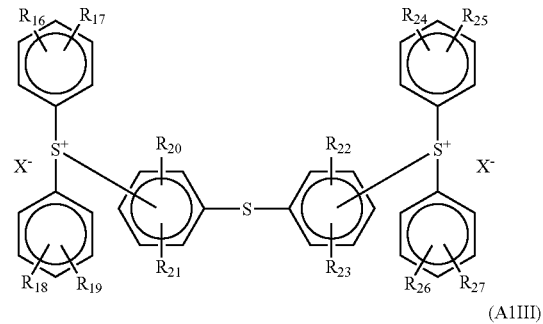

(A1II)

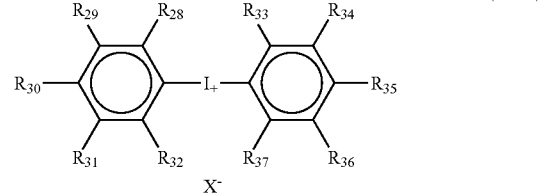

(A1III)

In the formulae, $R_1$ to $R_{37}$, which may be the same or different, each represent a hydrogen atom, a straight chain, branched or cyclic alkyl group, a straight chain, branched or cyclic alkoxy group, a hydroxy group, a halogen atom or a group of —S—$R_{38}$.

$R_{38}$ represents a straight chain, branched or cyclic alkyl group or an aryl group. Alternatively, at least two of $R_1$ to $R_{15}$, $R_{16}$ to $R_{27}$, $R_{28}$ to $R_{37}$ may be combined with each other to form a ring that includes one or more members selected from a single bond, a carbon atom, an oxygen atom, a sulfur atom and a nitrogen atom.

X⁻ represents an anion of an aromatic sulfonic acid, for example, a benzenesulfonic acid, a naphthalenesulfonic acid or an anthracenesulfonic acid, having at least one member selected from a fluorine atom, a straight chain, branched or cyclic alkyl group substituted with at least one fluorine atom, a straight chain, branched or cyclic alkoxy group substituted with at least one fluorine atom, an acyl group substituted with at least one fluorine atom, an acyloxy group substituted with at least one fluorine atom, an alkylsulfonyl or arylsulfonyl group having at least one fluorine atom, an alkylsulfonyloxy or arylsulfonyloxy group having at least one fluorine atom, an alkylsulfonylamino or arylsulfonylamino group having at least one fluorine atom, an aryl group substituted with at least one fluorine atom, an aralkyl group substituted with at least one fluorine atom and an alkoxycarbonyl group substituted with at least one fluorine atom.

In formulae (A1I) to (A1III), the straight chain or branched alkyl group represented by any one of $R_1$ to $R_{38}$ includes that having from 1 to 4 carbon atoms, which may be substituted, for example, methyl, ethyl, propyl, n-butyl, sec-butyl or tert-butyl group. The cycloalkyl group represented by any one of $R_1$ to $R_{38}$ includes that having from 3 to 8 carbon atoms, which may be substituted, for example, cyclopropyl, cyclopentyl or cyclohexyl group.

The straight chain or branched alkoxy group represented by any one of $R_1$ to $R_{37}$ includes that having from 1 to 4 carbon atoms, for example, methoxy, ethoxy, hydroxyethoxy, propoxy, n-butoxy, isobutoxy, sec-butoxy or tert-butoxy group.

The cyclic alkoxy group represented by any one of $R_1$ to $R_{37}$ includes, for example, cyclopentyloxy and cyclohexyloxy groups.

The halogen atom represented by any one of $R_1$ to $R_{37}$ includes, for example, fluorine, chlorine, bromine and iodine atoms.

The aryl group represented by $R_{38}$ includes that having from 6 to 14 carbon atoms, which may be substituted, for example, phenyl, tolyl, methoxyphenyl or naphthyl group.

The substituent for the above groups preferably includes an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

The ring, which includes one or more members selected from a single bond, a carbon atom, an oxygen atom, a sulfur atom and a nitrogen atom, formed by combining at least two of $R_1$ to $R_{15}$, $R_{16}$ to $R_{27}$, $R_{28}$ to $R_{37}$ includes, for example, furan, dihydrofuran, pyran, trihydropyran, thiophene and pyrrole rings.

In formulae (A1I) to (A1III), X⁻ represents an anion of an aromatic sulfonic acid, for example, a benzenesulfonic acid, a naphthalenesulfonic acid or an anthracenesulfonic acid, having at least one member selected from a fluorine atom, a straight chain, branched or cyclic alkyl group substituted with at least one fluorine atom, a straight chain, branched or cyclic alkoxy group substituted with at least one fluorine atom, an acyl group substituted with at least one fluorine atom, an acyloxy group substituted with at least one fluorine atom, an alkylsulfonyl or arylsulfonyl group having at least one fluorine atom, an alkylsulfonyloxy or arylsulfonyloxy group having at least one fluorine atom, an alkylsulfonylamino or arylsulfonylamino group having at least one fluorine atom, an aryl group substituted with at least one fluorine atom, an aralkyl group substituted with at least one fluorine atom and an alkoxycarbonyl group substituted with at least one fluorine atom.

The straight chain, branched or cyclic alkyl group substituted with at least one fluorine atom described above is preferably that having from 1 to 12 carbon atoms and substituted with 1 to 25 fluorine atoms. Specific examples thereof include fluoromethyl, difluoromethyl, trifluoromethyl, pentafluoroethyl, 2,2,2-trifluoroethyl, heptafluoropropyl, heptafluoroisopropyl, perfluorobutyl, perfluorooctyl, perfluorododecyl and perfluorocyclohexyl groups. Among them, a perfluoroalkyl group having from 1 to 4 carbon atoms fully substituted with fluorine atoms is preferred.

The straight chain, branched or cyclic alkoxy group substituted with at least one fluorine atom described above is preferably that having from 1 to 12 carbon atoms and substituted with 1 to 25 fluorine atoms. Specific examples thereof include trifluoromethoxy, pentafluoroethoxy, heptafluoroisopropyloxy, perfluorobutoxy, perfluorooctyloxy, perfluorododecyloxy and perfluorocyclohexyloxy groups. Among them, a perfluoroalkoxy group having from 1 to 4 carbon atoms fully substituted with fluorine atoms is preferred.

The acyl group substituted with at least one fluorine atom described above is preferably that having from 2 to 12 carbon atoms and substituted with 1 to 23 fluorine atoms. Specific examples thereof include trifluoroacetyl, fluoroacetyl, pentafluoropropionyl and pentafluorobenzoyl groups.

The acyloxy group substituted with at least one fluorine atom described above is preferably that having from 2 to 12 fluorine atoms and substituted with 1 to 23 carbon atoms. Specific examples thereof include trifluoroacetoxy, fluoroacetoxy, pentafluoropropionyloxy and pentafluorobenzoyloxy groups.

The alkylsulfonyl or arylsulfonyl group having at least one fluorine atom described above is preferably that having from 1 to 12 carbon atoms and substituted with 1 to 25 fluorine atoms. Specific examples thereof include trifluoromethanesulfonyl, pentafluoroethanesulfonyl, perfluorobutanesulfonyl, perfluorooctanesulfonyl, pentafluorobenzenesulfonyl and 4-trifluoromethylbenzenesulfonyl groups.

The alkylsulfonyloxy or arylsulfonyloxy group having at least one fluorine atom described above is preferably that having from 1 to 12 carbon atoms and substituted with 1 to 25 fluorine atoms. Specific examples thereof include trifluoromethanesulfonyloxy, perfluorobutanesulfonyloxy and 4-trifluoromethylbenzenesulfonyloxy groups.

The alkylsulfonylamino or arylsulfonylamino group having at least one fluorine atom described above is preferably that having from 1 to 12 carbon atoms and substituted with 1 to 25 fluorine atoms. Specific examples thereof include trifluoromethanesulfonylamino, perfluorobutanesulfonylamino, perfluorooctanesulfonylamino and pentafluorobenzenesulfonylamino groups.

The aryl group having at least one fluorine atom described above is preferably that having from 6 to 14 carbon atoms and substituted with 1 to 9 fluorine atoms. Specific examples thereof include pentafluorophenyl, 4-trifluoromethylphenyl, heptafluoronaphthyl, nonafluoroanthryl, 4-fluorophenyl and 2,4-difluorophenyl groups.

The aralkyl group having at least one fluorine atom described above is preferably that having from 7 to 10 carbon atoms and substituted with 1 to 15 fluorine atoms. Specific examples thereof include pentafluorophenylmethyl, pentafluorophenylethyl, perfluorobenzyl and perfluorophenethyl groups.

The alkoxycarbonyl group substituted with at least one fluorine atom described above is preferably that having from 2 to 13 carbon atoms and substituted with 1 to 25 fluorine atoms. Specific examples thereof include trifluoromethoxycarbonyl, pentafluoroethoxycarbonyl, pentafluoropenoxycarbonyl, perfluorobutoxycarbonyl and perfluorooctyloxycarbonyl groups.

$X^-$ preferably represents a benzenesulfonic acid anion substituted with a fluorine atom or a benzenesulfonic acid anion substituted with a trifluoromethyl group, and more preferably a pentafluorobenzenesulfonic acid anion, a 2-, 3- or 4-trifluoromethylbenzenesulfonic acid anion or a 3,5-bistrifluoromethylbenzenesulfonic acid anion.

The aromatic sulfonic acid having the fluorine-containing substituent may further substituted with a substituent, for example, a straight chain, branched or cyclic alkoxy group, an acyl group, an acyloxy group, a sulfonyl group, a sulfonyloxy group, a sulfonylamino group, an aryl group, an aralkyl group or an alkoxycarbonyl group (the numbers of carbon atoms included in these groups are same as those defined above respectively), or a halogen atom other than a fluorine atom, a hydroxy group or a nitro group.

Specific preferred examples of the compound represented by formula (A1I) of Component (A1) are set forth below, but the present invention should not be construed as being limited thereto.

(A1I-1)

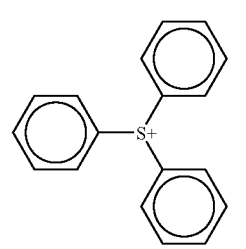

(A1I-2)

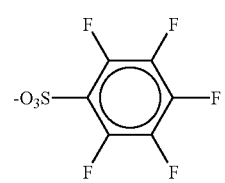

(A1I-3)

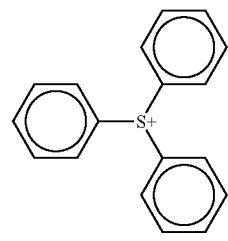

(A1I-4)

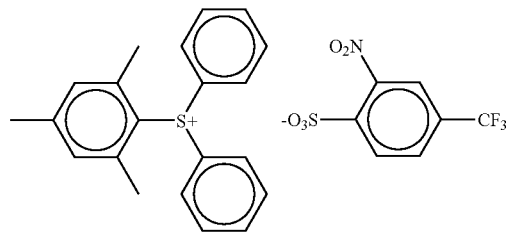

(A1I-5)

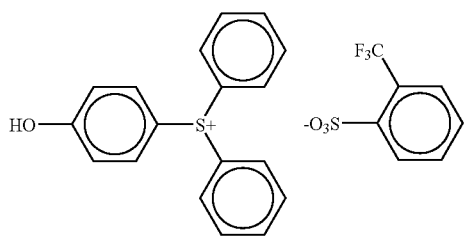

(A1I-6)

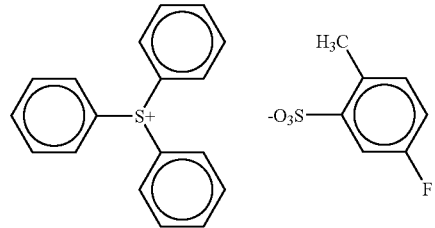

(A1I-7)

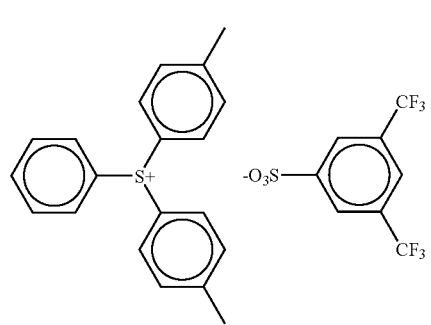

(A1I-8)

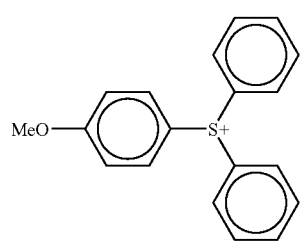

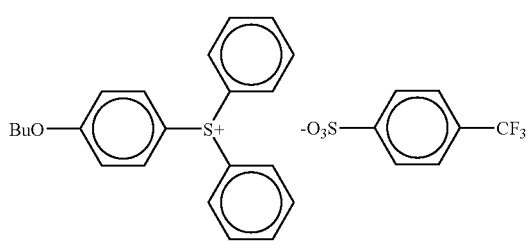

-continued
(A1I-9)
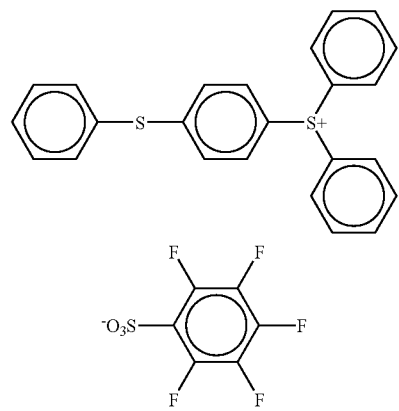
(A1I-10)
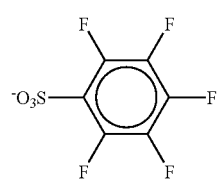
(A1I-11)
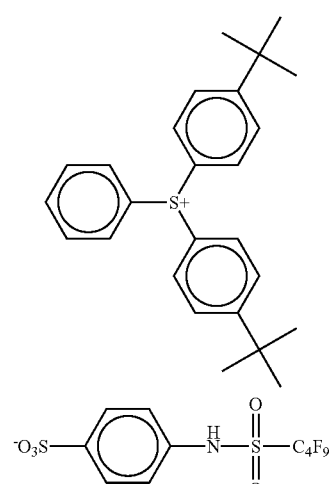
-continued
(A1I-12)
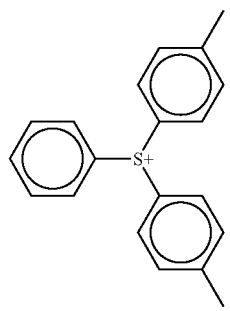
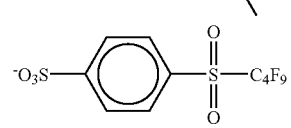
(A1I-13)
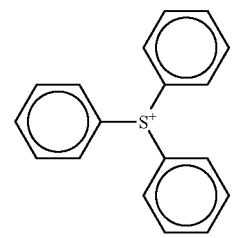
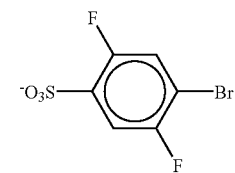
(A1I-14)
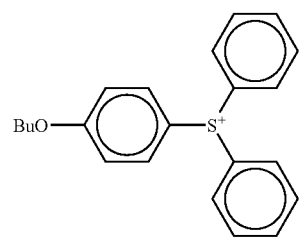
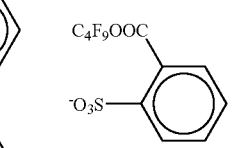
(A1I-15)
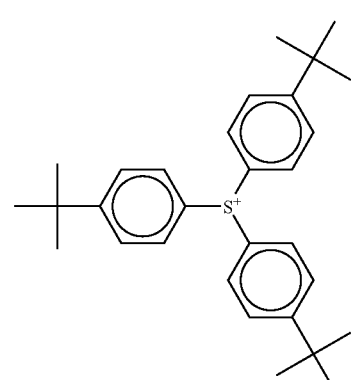
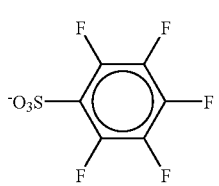

-continued
(A1I-16)
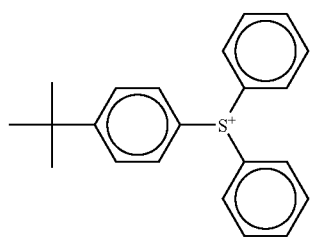 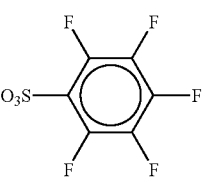
(A1I-17)
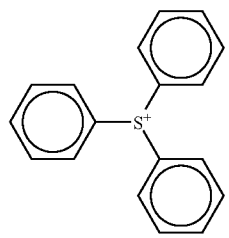 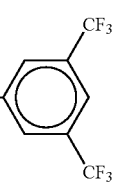
(A1I-18)
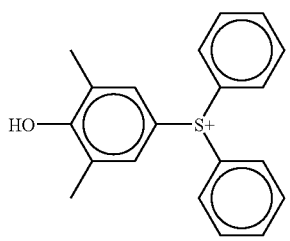 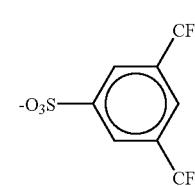
(A1I-19)
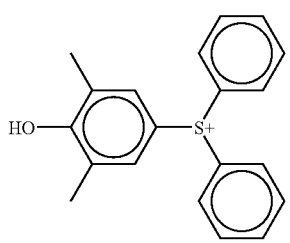 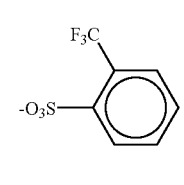
(A1I-20)
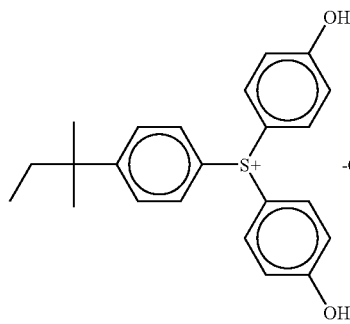
-continued
(A1I-21)
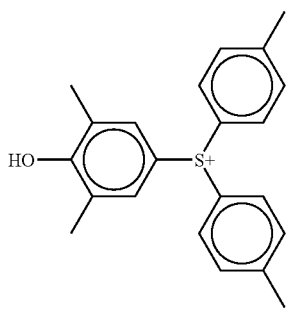 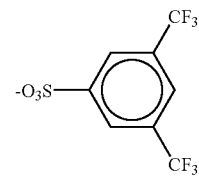
(A1I-22)
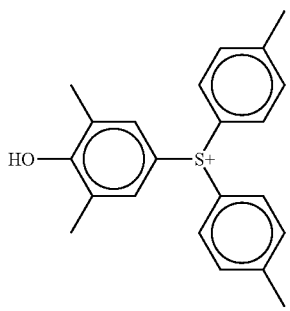 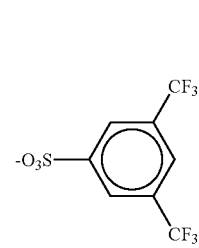
(A1I-23)
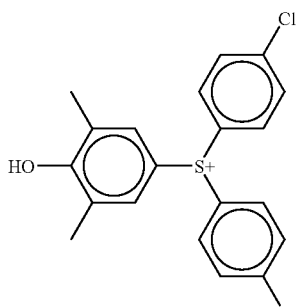 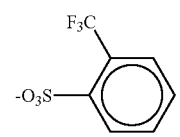
(A1I-24)
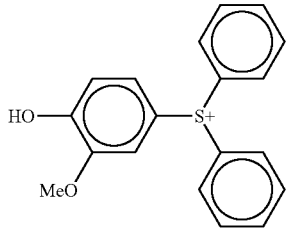 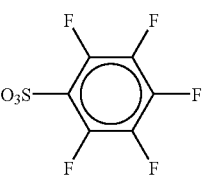
(A1I-25)
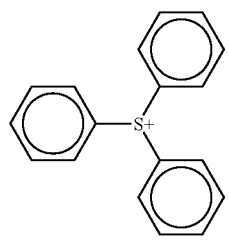 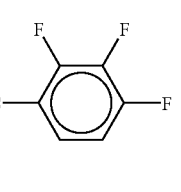

(A1I-26)
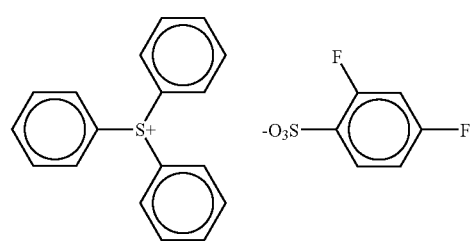
(A1I-27)
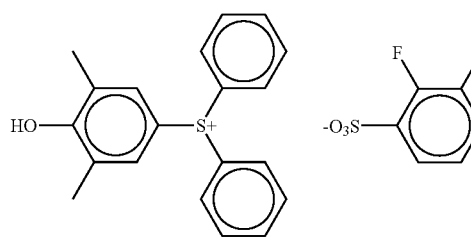
(A1I-28)
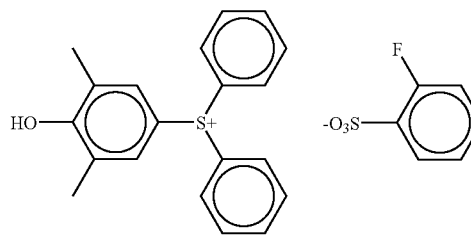
Specific preferred examples of the compound represented by formula (A1II) of Component (A1) are set forth below, but the present invention should not be construed as being limited thereto.
(A1II-1)
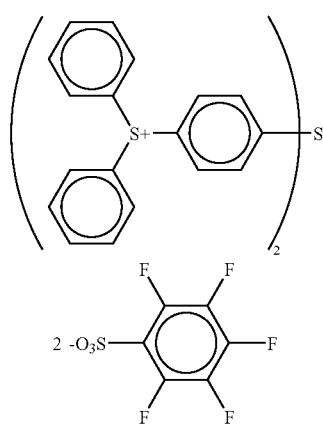
(A1II-2)
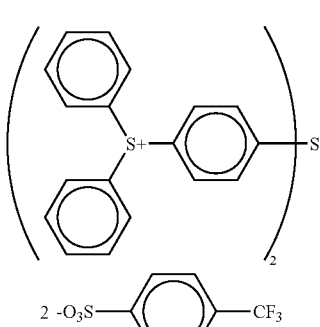
(A1II-3)
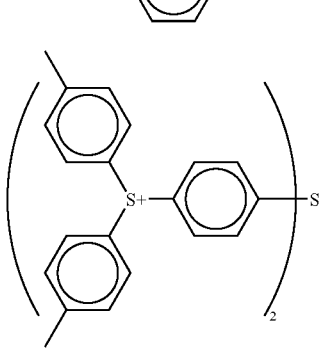
(A1II-4)
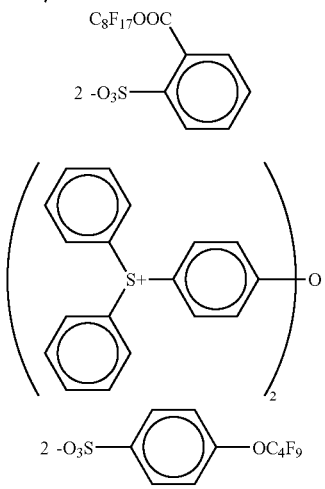
(A1II-5)
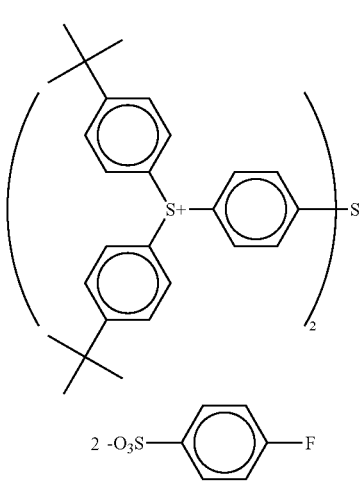

Specific preferred examples of the compound represented by formula (A1III) of Component (A1) are set forth below, but the present invention should not be construed as being limited thereto.

(A1III-1)
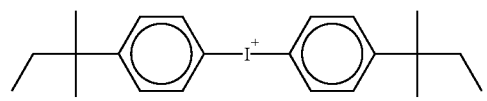

(A1III-2)
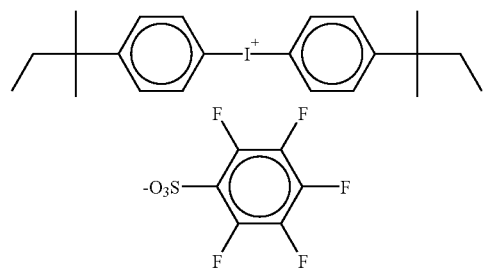

(A1III-3)
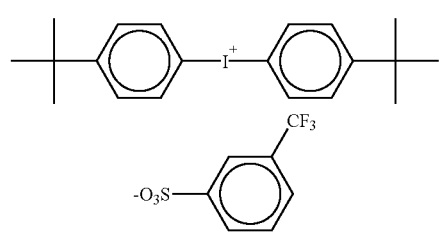

(A1III-4)
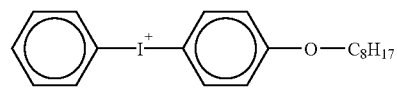

(A1III-5)
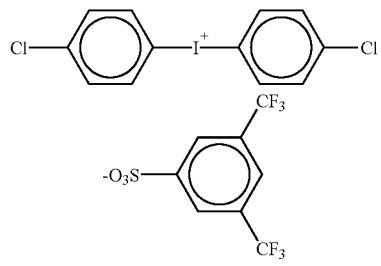

(A1III-6)
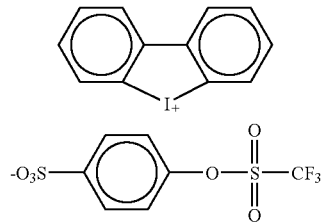

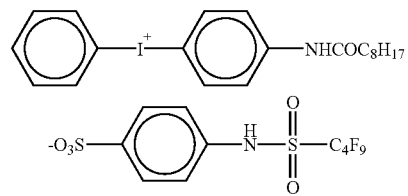

-continued (A1III-7)
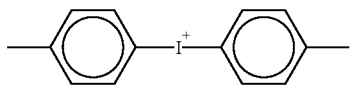

(A1III-8)
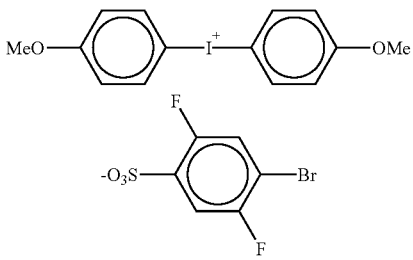

The compounds represented by formulae (A1IV) to (A1VII) shown below are also preferred as the compound of Component (A1) according to the present invention.

(A1IV)
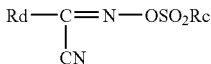

(A1V)
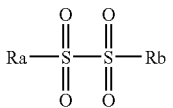

(A1VI)
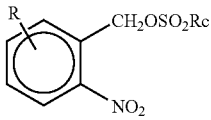

(A1VII)
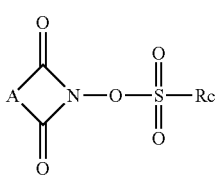

In the formulae, $R_a$ and $R_b$, which may be the same or different, each represent a straight chain, branched or cyclic alkyl group which may be substituted, an aryl group which may be substituted, a heteroaryl group which may be substituted or an aralkyl group which may be substituted, provided that at least one of $R_a$ and $R_b$ represents a phenyl group, naphthyl group or anthryl group substituted with at least one fluorine atom and/or a group having at least one fluorine atom.

$R_c$ represents a phenyl group, naphthyl group or anthryl group substituted with at least one fluorine atom and/or a group having at least one fluorine atom.

$R_d$ represents a straight chain, branched or cyclic alkyl group which may be substituted, an aryl group which may be substituted, a heteroaryl group which may be substituted or an aralkyl group which may be substituted.

R represents a hydrogen atom, a straight chain, branched or cyclic alkyl, a nitro group or an alkoxy group.

A represents a substituted or unsubstituted alkylene group, a substituted or unsubstituted arylene geoup or a substituted or unsubstituted alkenylene group.

Specific preferred examples of the compound represented by any one of formulae (A1IV) to (A1VII) of Component (A1) are set forth below, but the present invention should not be construed as being limited thereto.

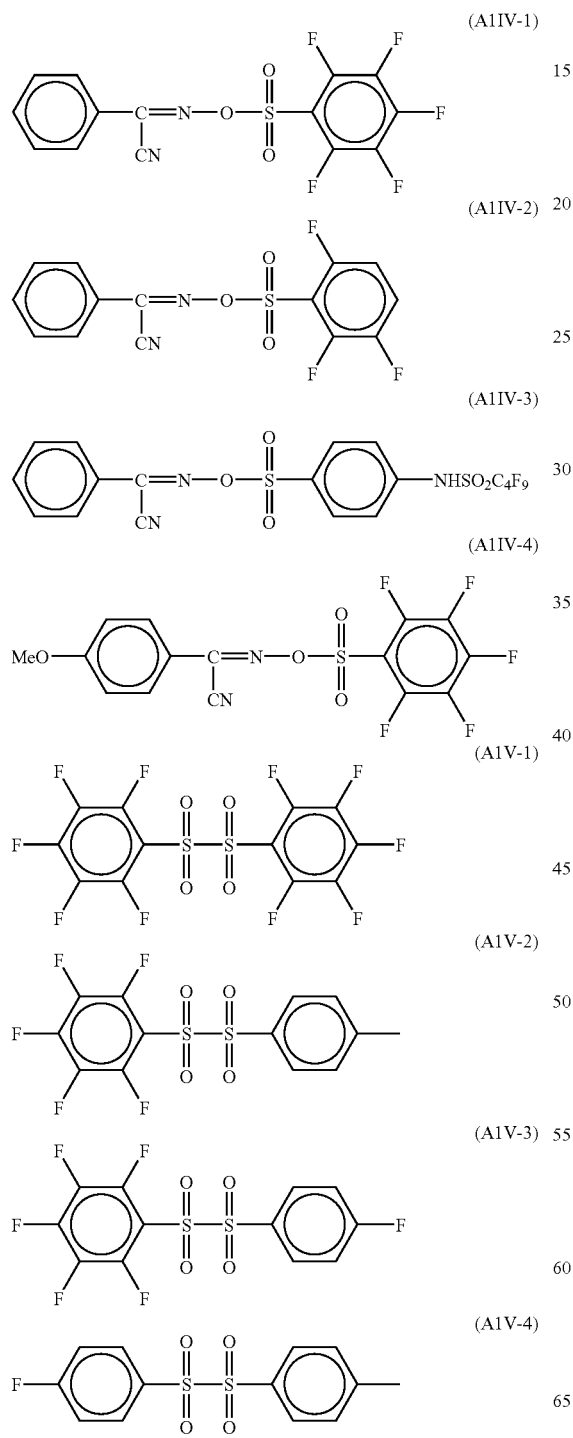
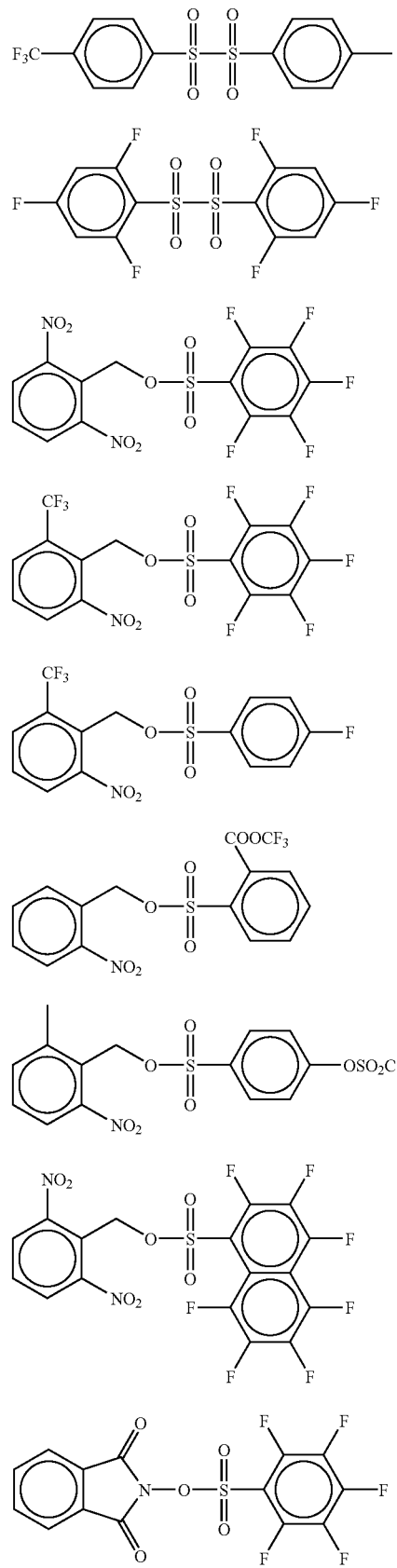

-continued

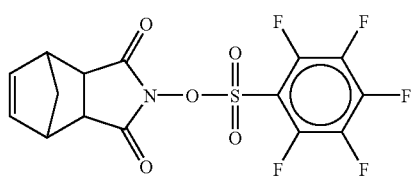
(A1VII-2)

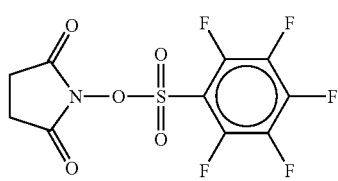
(A1VII-3)

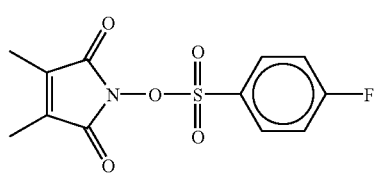
(A1VII-4)

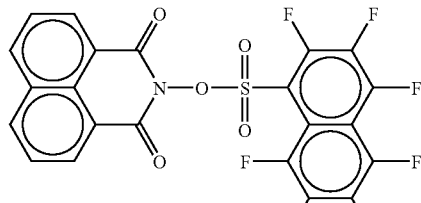
(A1VII-5)

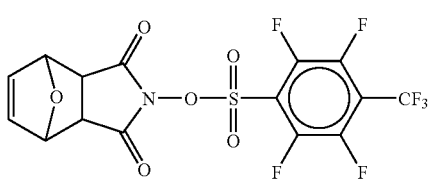
(A1VII-6)

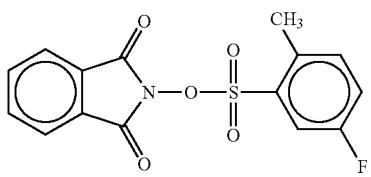
(A1VII-7)

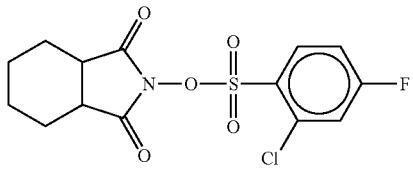
(A1VII-8)

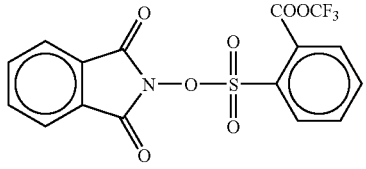
(A1VII-9)

The compounds represented by formulae (A1VIII) to (A1IX) shown below are also preferred as the compound of Component (A1) according to the present invention.

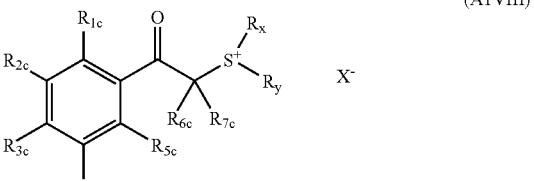
(A1VIII)

In formula (A1VIII), $R_{1c}$ to $R_{5c}$, $R_{6c}$, $R_{7c}$, $R_x$ and $R_y$ have the same meanings as $R_{1c}$, to $R_{5c}$, $R_{6c}$, $R_{7c}$, $R_x$ and $R_y$ defined in formula (A2I) described hereinafter, respectively.

$X^-$ in formula (A1VIII) has the same meanings as $X^-$ defined in any one of formulae (A1I) to (A1III) described above.

(A1IX)

In formula (A1IX), $R^{1b}$ to $R^{3b}$ have the same meanings as $R^{1b}$ to $R^{3b}$ defined in formula (A2II) described hereinafter, respectively.

$X^-$ in formula (A1IX) has the same meanings as $X^-$ defined in any one of formulae (A1I) to (A1III) described above.

Specific preferred examples of the compound represented by any one of formulae (A1VIII) to (A1IX) of Component (A1) are set forth below, but the present invention should not be construed as being limited thereto.

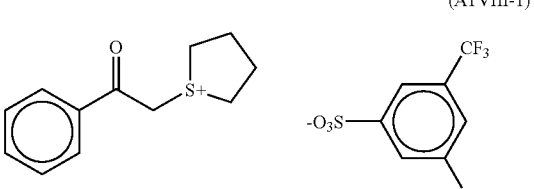
(A1VIII-1)

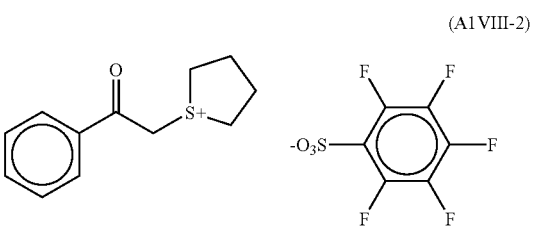
(A1VIII-2)

-continued
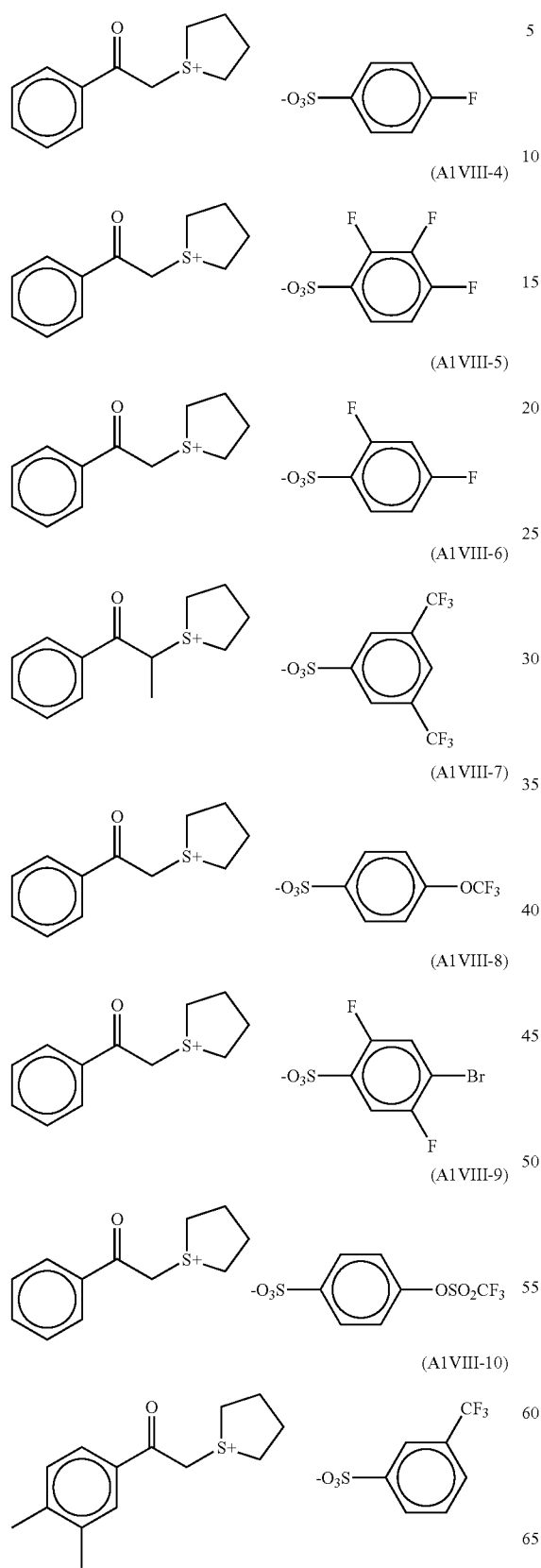
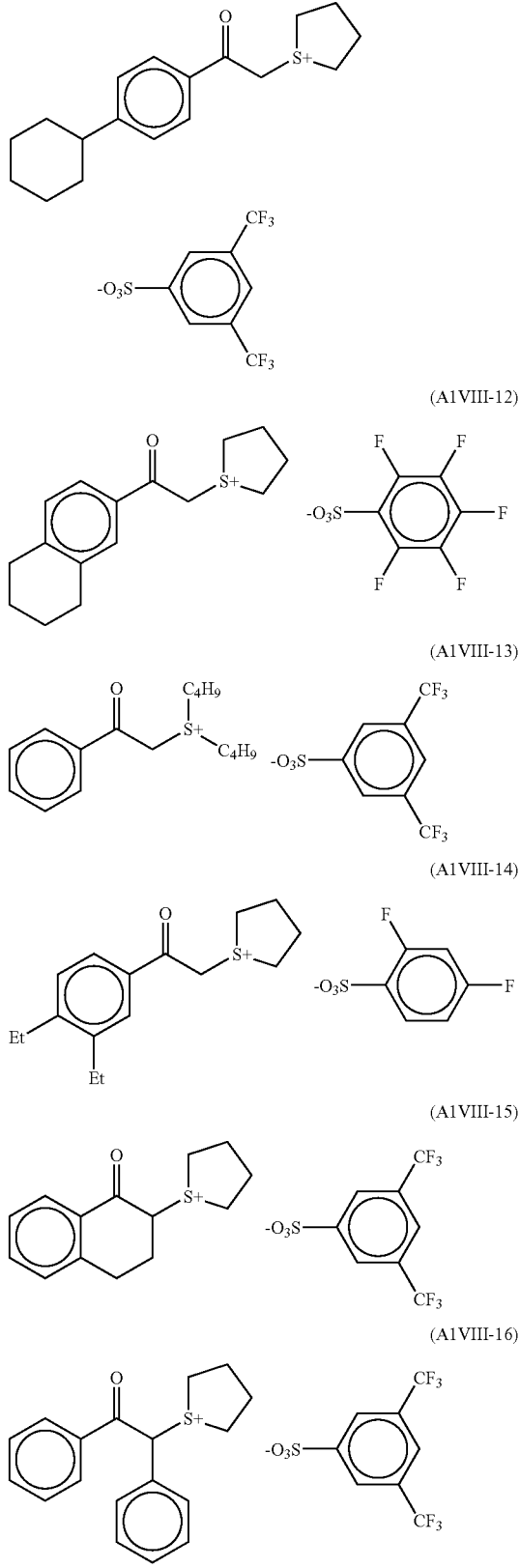

-continued
(A1VIII-17)
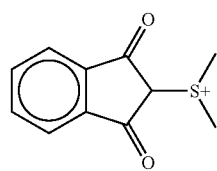 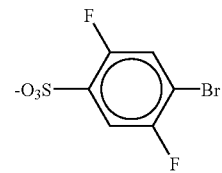
(A1VIII-18)
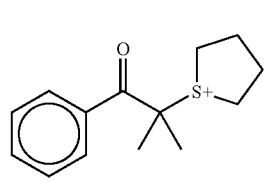 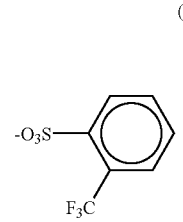
(A1VIII-19)
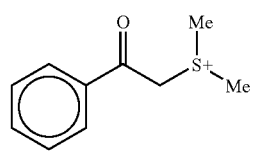 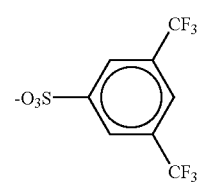
(A1VIII-20)
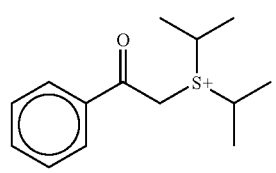 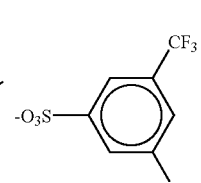
(A1VIII-21)
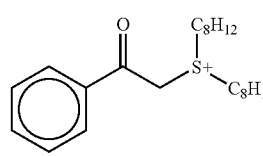 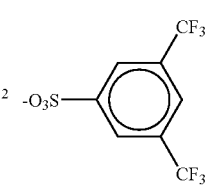
(A1VIII-22)
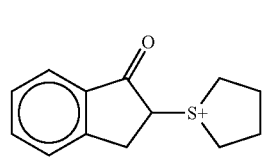 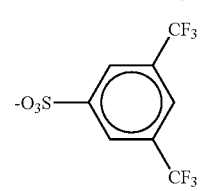
(A1VIII-23)
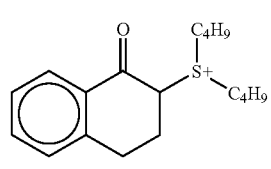 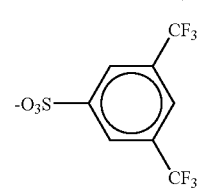
-continued
(A1VIII-24)
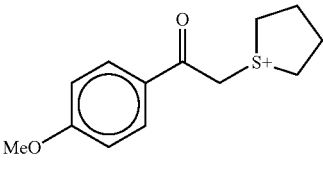 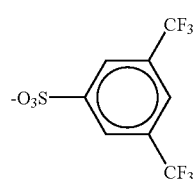
(A1VIII-25)
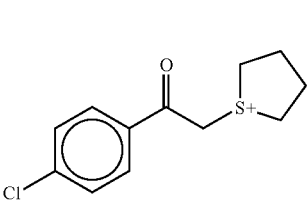 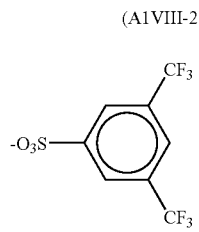
(A1VIII-26)
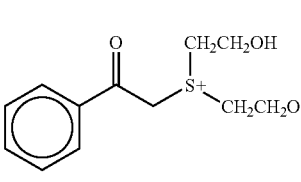 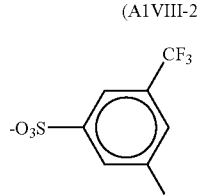
(A1IX-1)
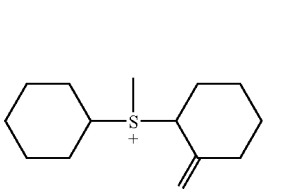 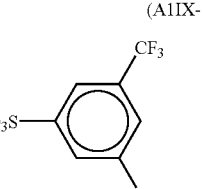
(A1IX-2)
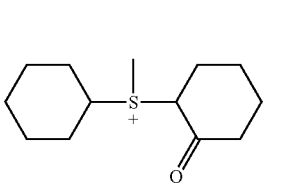 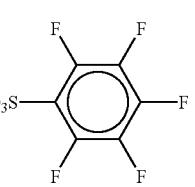
(A1IX-3)
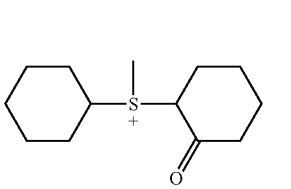 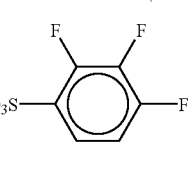
(A1IX-4)
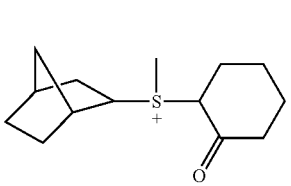 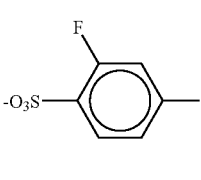

-continued
(A1IX-5)
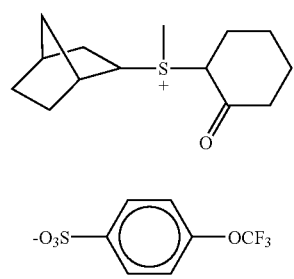
(A1IX-6)
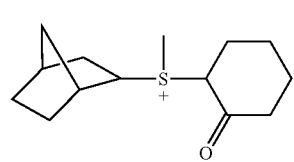
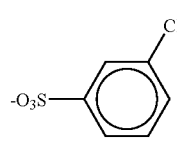
(A1IX-7)
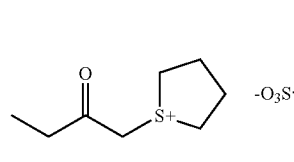
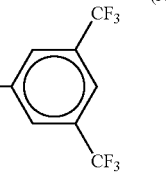
(A1IX-8)
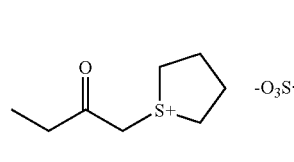
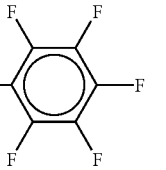
(A1IX-9)
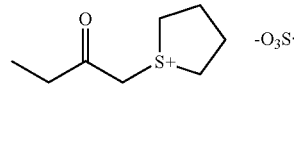
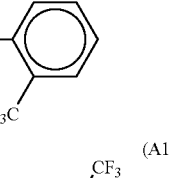
(A1IX-10)
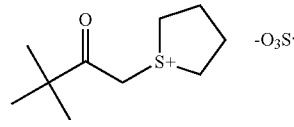
(A1IX-11)
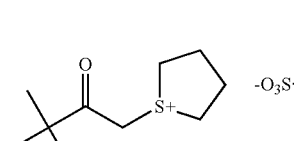
(A1IX-12)
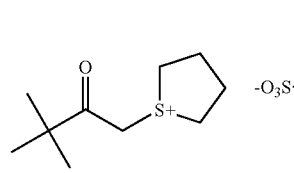
-continued
(A1IX-13)
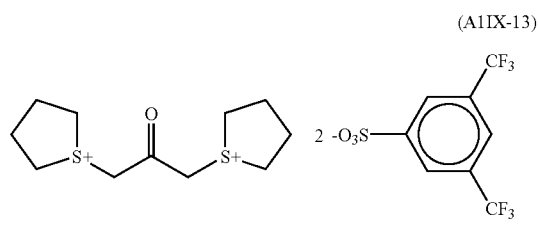
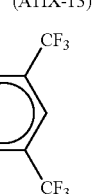
(A1IX-14)
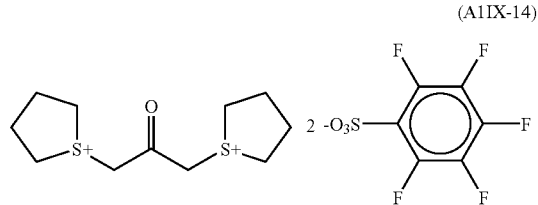
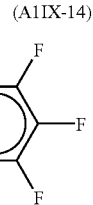
(A1IX-15)
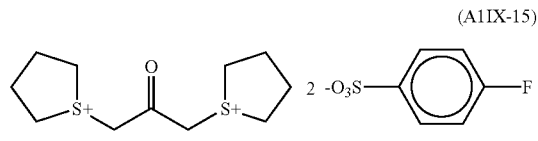
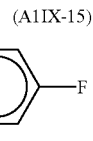
(A1IX-16)
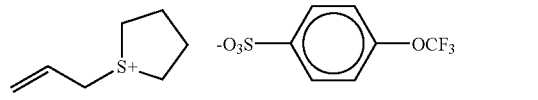
(A1IX-17)
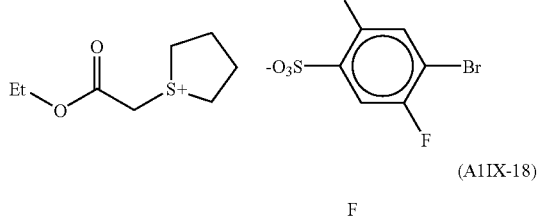
(A1IX-18)
(A1IX-19)
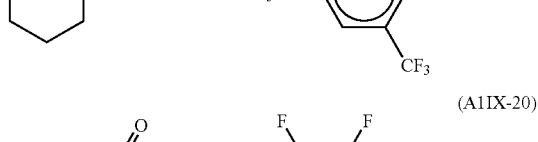
(A1IX-20)
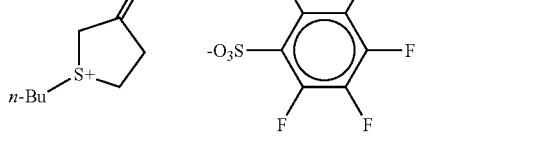

-continued

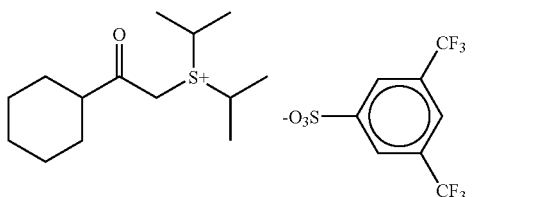
(A1IX-21)

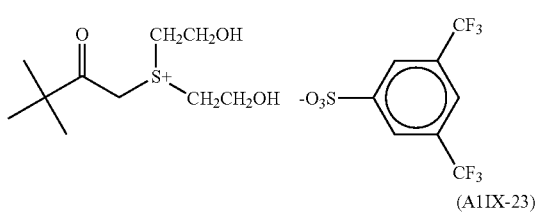
(A1IX-22)

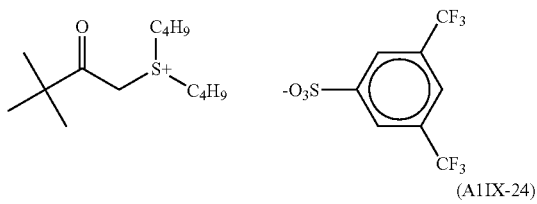
(A1IX-23)

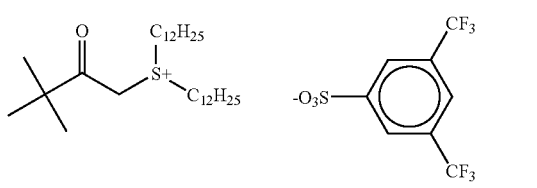
(A1IX-24)

The compounds represented by formulae (A1I) to (A1IX) of Component (A1) may be used individually or in combination with two or more thereof.

The content of the compound of Component (A1) is ordinarily from 0.05 to 15% by weight, preferably from 0.1 to 10% by weight, and more preferably from 0.2 to 5% by weight based on the total solid content of the positive photosensitive composition of the present invention.

The compound represented by any one of formulae (A1I) and (A1II) can be synthesized, for example, by a method comprising reacting an aryl Grignard reagent, e.g., an aryl magnesium bromide with a substituted or unsubstituted phenylsulfoxide and then subjecting the resulting triaryl sulfonium halide to salt exchange with a corresponding sulfonic acid, a method comprising condensing a substituted or unsubstituted phenyl sulfoxide with a corresponding aromatic compound in the presence of an acid catalyst, e.g., methanesulfonic acid/diphosphorus pentaoxide or aluminum chloride and then subjecting the resulting condensate to salt exchange, or a method comprising condensing a diaryl iodonium salt with a diaryl sulfide in the presence of a catalyst, e.g., copper acetate and then subjecting the resulting condensate to salt exchange.

The compound represented by formula (A1III) can be synthesized by reacting an aromatic compound with a periodate and subjecting the resulting iodonium salt to salt exchange with a corresponding sulfonic acid.

The sulfonic acid or sulfonate for use in the salt exchange can be obtained by according to a method of hydrolyzing a commercially available sulfonic acid chloride, a method of reacting an aromatic compound with chlorosulfonic acid or a method of reacting an aromatic compound with sulfamic acid.

<<(A2) Onium Salt of an Alkanesulfonic Acid in which the α-Position of the Sulfonic Acid is not Substituted with a Fluorine Atom and/or Onium Salt of a Carboxylic Acid (Hereinafter Also Referred to as Component (A2))>>

Any onium salt of an alkanesulfonic acid in which the α-position is not substituted with a fluorine atom can be used as the onium salt of an alkanesulfonic acid in which the α-position of the sulfonic acid is not substituted with a fluorine atom of Component (A2) in the present invention. The onium salt of Component (A2) is preferably a sulfonium salt, an iodonium salt or an ammonium salt.

Examples of the onium salt of Component (A2) include compounds represented by the following formulae (A2-1), (A2-2) and (A2-3):

(A2-1)

(A2-2)

(A2-3)

In the formulae, $R^{1d}$, $R^{2d}$ and $R^{3d}$ each independently represent an organic residue.

A number of carbon atoms included in the organic residue represented by $R^{1d}$, $R^{2d}$ or $R^{3d}$ is ordinarily from 1 to 30, and preferably from 1 to 20.

Alternatively, two of $R^{1d}$, $R^{2d}$ and $R^{3d}$ may be combined with each other to form a ring, and the ring may contain an oxygen atom, a sulfur atom, an ester bond, an amido bond or a carbonyl group. The group formed by combining two of $R^{1d}$, $R^{2d}$ and $R^{3d}$ includes an alkylene group (e.g., butylene or pentylene group).

The organic residue for $R^{1d}$, $R^{2d}$ or $R^{3d}$ specifically includes a substituted or unsaturated alkyl group and a substituted or unsaturated aryl group, and preferably an alkyl group having from 1 to 8 carbon atoms, an aryl group having from 6 to 14 carbon atoms and the substituted derivatives thereof Preferred examples of the substituent for the aryl group include an alkoxy group having from 1 to 8 carbon atoms, an alkyl group having from 1 to 8 carbon atoms, a nitro group, a carboxy group, a hydroxy group and a halogen atom. Preferred examples of the substituent for the alkyl group include an alkoxy group having from 1 to 8 carbon atoms, a carboxy group and an alkoxycarbonyl group.

$R^{1e}$, $R^{2e}$, $R^{1f}$, $R^{2f}$, $R^{3f}$ and $R^{4f}$ each independently represent a substituted or unsaturated alkyl group or a substituted or unsaturated aryl group. The alkyl group is preferably an alkyl group having from 1 to 8 carbon atoms. The aryl group is preferably an aryl group having from 6 to 14 carbon atoms.

Also, $R^{1f}$, $R^{2f}$, $R^{3f}$, and $R^{4f}$ each may be a hydrogen atom.

$R^{1e}$ and $R^{2e}$ each preferably represent a substituted or unsaturated aryl group. $R^{1f}$, $R^{2f}$, $R^{3f}$ and $R^{4f}$ each preferably represent a substituted or unsaturated-alkyl group.

Preferred examples of the substituent for the aryl group include an alkoxy group having from 1 to 8 carbon atoms, an alkyl group having from 1 to 8 carbon atoms, a nitro group, a carboxy group, a hydroxy group and a halogen atom. Preferred examples of the substituent for the alkyl group include an alkoxy group having from 1 to 8 carbon atoms, a carboxy group, an alkoxycarbonyl group having from 2 to 9 carbon atoms and an alkoxyalkoxy group having from 2 to 9 carbon atoms.

An anion portion represented by $X^-$ is an alkanesulfonic acid anion in which the carbon atom at the α-position is not substituted with a fluorine atom and represented by $RSO_3^-$.

The alkane portion of the alkanesulfonic acid represented by R is not particularly restricted and includes a straight chain, branched or cyclic alky group having from 1 to 20 carbon atoms, e.g., methyl, ethyl, propyl, butyl, hexyl, octyl, dodecyl, tetradecyl or hexadecyl group, and preferably a straight chain, branched or cyclic alkyl group having from 4 to 16 carbon atoms.

The alkane portion may have a substituent provided that it does not constitute the alkanesulfonic acid in which the carbon atom at the α-position has a fluorine atom. Examples of the substituent include an alkyl group, a hydroxy group, a halogen atom, an alkoxy group (preferably having from 1 to 5 carbon atoms, e.g., methoxyl ethoxy, propoxy or butoxy group), an alkoxycarbonyl group (preferably having from 2 to 6 carbon atoms, e.g., methoxycarbonyl, ethoxycarbonyl, propoxycarbonyl or butoxycarbonyl group), an acyl group (preferably having from 2 to 15 carbon atoms), an acyloxy group (preferably having from 2 to 15 carbon atoms), an amino group, a carboxy group, an alkylsulfonylamino group (preferably having from 1 to 5 carbon atoms), an alkylsulfonyloxy group (preferably having from 1 to 5 carbon atoms), a cyano group and an oxo group.

Preferred examples of the alkanesulfonic acid for $X^-$ include an alkanesulfonic acid having from 4 to 16 carbon atoms and an alkanesulfonic acid having a polycyclic alicyclic structure, e.g., camphorsulfonic acid.

Specific examples of the onium salt of an alkanesulfonic acid in which the α-position is not substituted with a fluorine atom of Component (A2) are set forth as A2-1-1 to A2-3-9 below, but the present invention should not be construed as being limited thereto.

A2-1-1
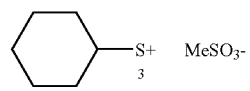

A2-1-2
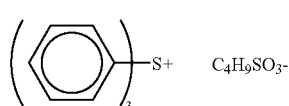

A2-1-3
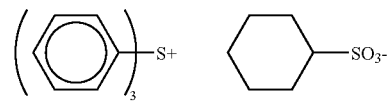

A2-1-4
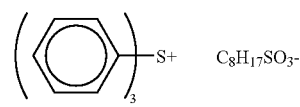

A2-1-5
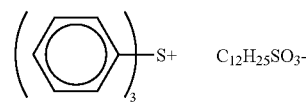

A2-1-6
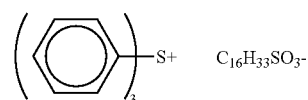

A2-1-7
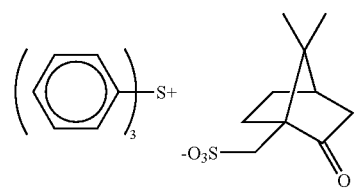

A2-1-8
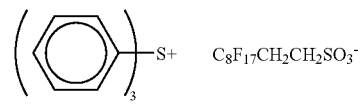

A2-1-9
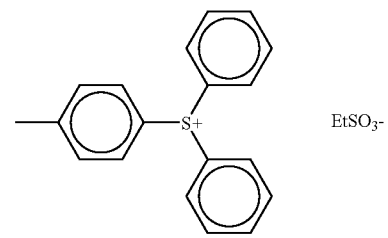

A2-1-10
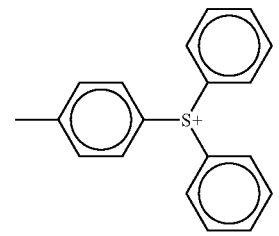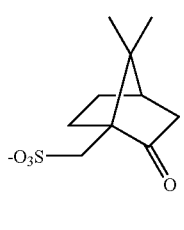

A2-1-11
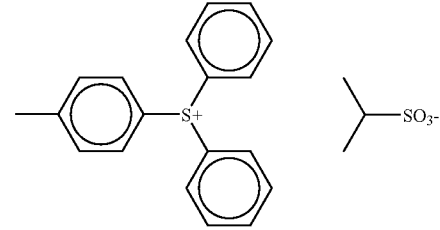

A2-1-12
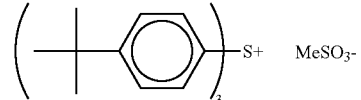

-continued
A2-1-13
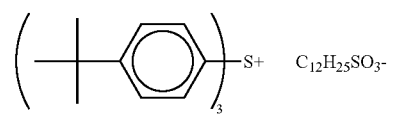
A2-1-14
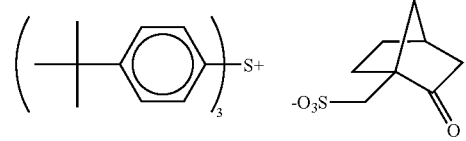
A2-1-15
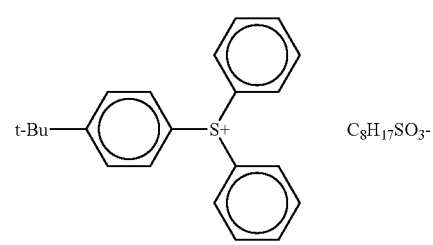
A2-1-16
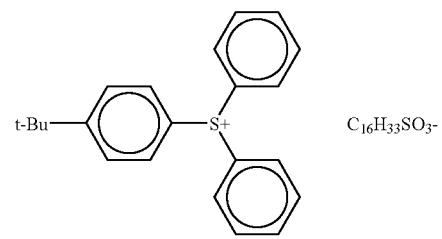
A2-1-17
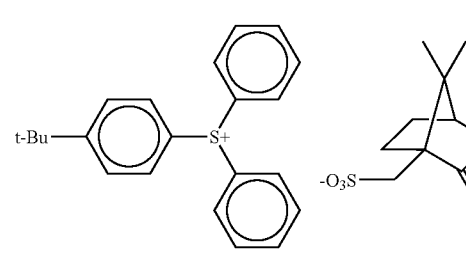
A2-1-18
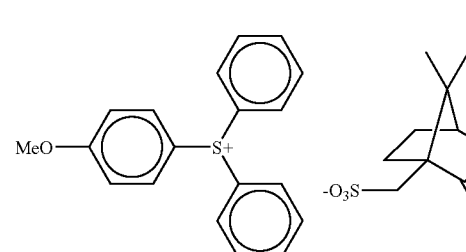
A2-1-19
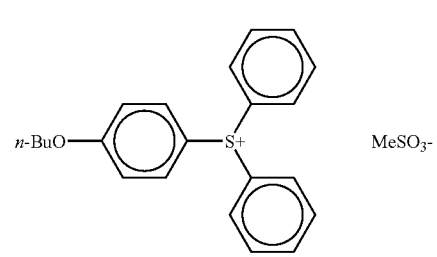
-continued
A2-1-20
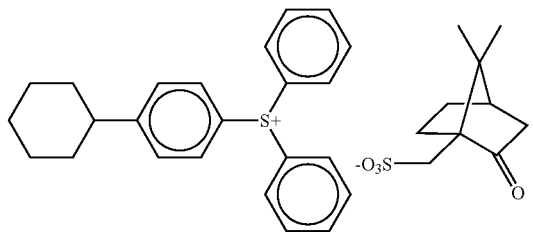
A2-1-21
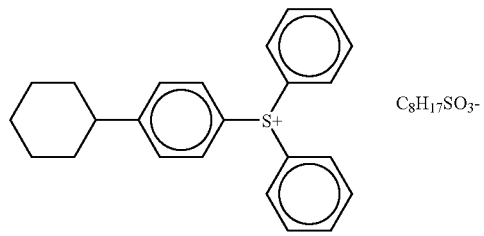
A2-1-22
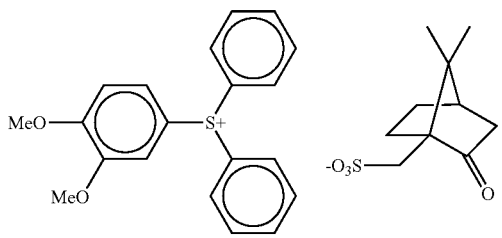
A2-1-23
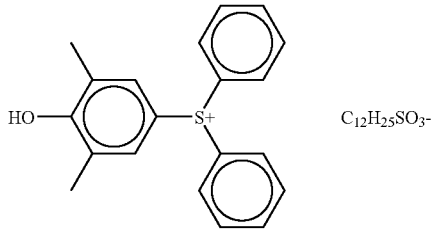
A2-1-24
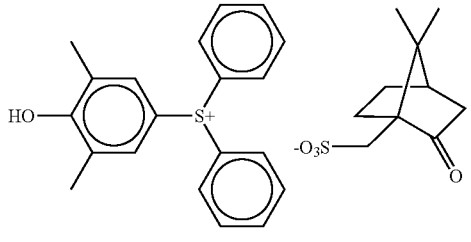
A2-1-25
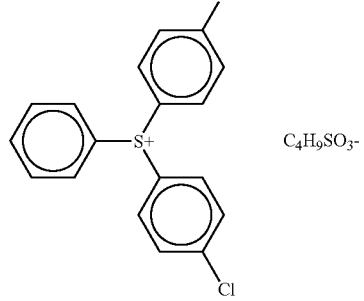

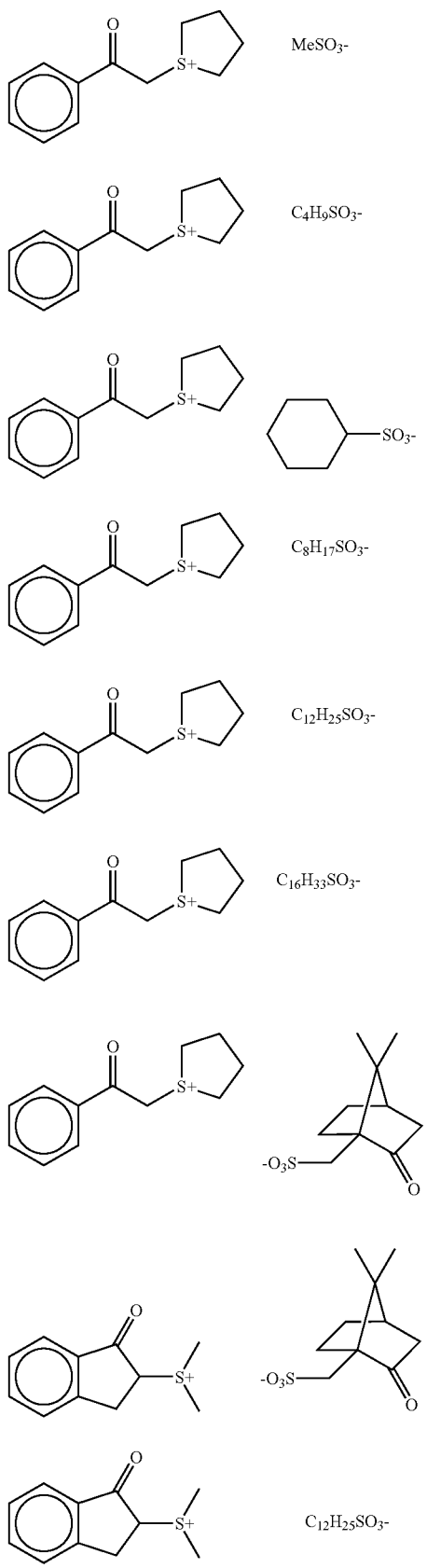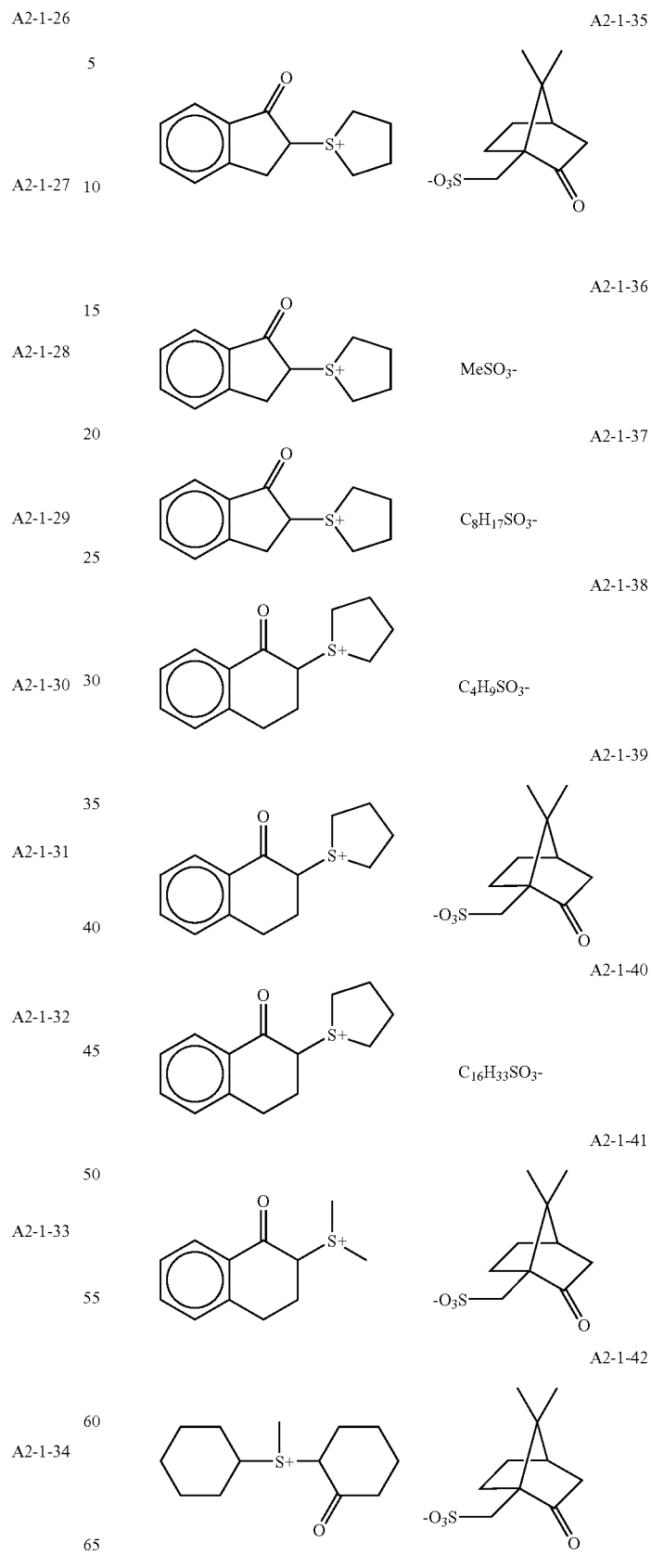

-continued

A2-1-43
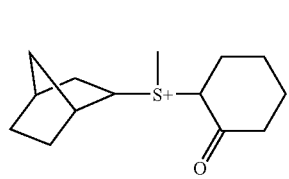

A2-1-44
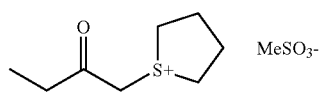 MeSO$_3$-

A2-1-45
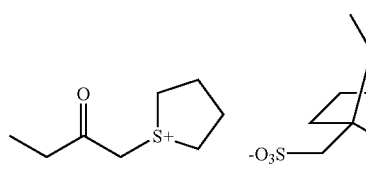

A2-1-46
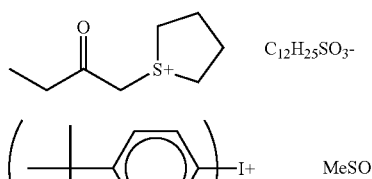 C$_{12}$H$_{25}$SO$_3$-

A2-2-1
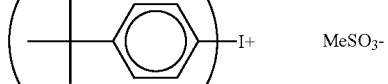 MeSO$_3$-

A2-2-2
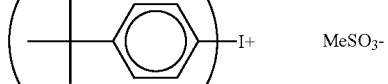 C$_8$H$_{17}$SO$_3$-

A2-2-3
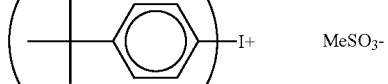 C$_{16}$H$_{33}$SO$_3$-

A2-2-4
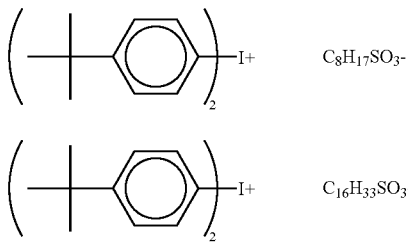

A2-2-5
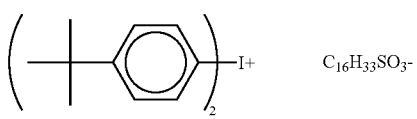 C$_{12}$H$_{25}$SO$_3$-

A2-2-6
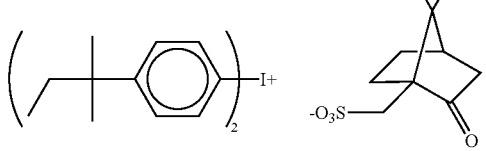

-continued

A2-3-1
Bu$_4$N+    C$_{12}$H$_{25}$SO$_3$-

A2-3-2
Bu$_4$N+    -O$_3$S

A2-3-3
Bu$_4$N+    C$_4$H$_9$SO$_3$-

A2-3-4
Bu$_4$N+    C$_8$F$_{17}$CH$_2$CH$_2$SO$_3$-

A2-3-5
Me$_4$N+    -O$_3$S

A2-3-6

A2-3-7
+N—(CH$_2$CH$_2$OCH$_2$CH$_2$OMe)$_4$   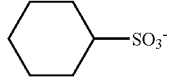

A2-3-8
Me—N$^+$—(CH$_2$CH$_2$OH)$_3$
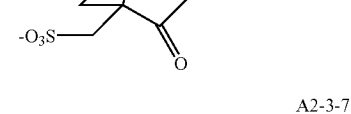

A2-3-9
Bu$_4$N+C$_{16}$H$_{33}$SO$_3$-

The onium salt of a carboxylic acid of Component (A2) according to the present invention includes, for example, a carboxylic acid sulfonium salt, a carboxylic acid iodonium salt and a carboxylic acid ammonium salt.

Examples of the onium salt of a carboxylic acid, which can be used in the present invention, include compounds represented by the following formulae (AI) to (AVI):

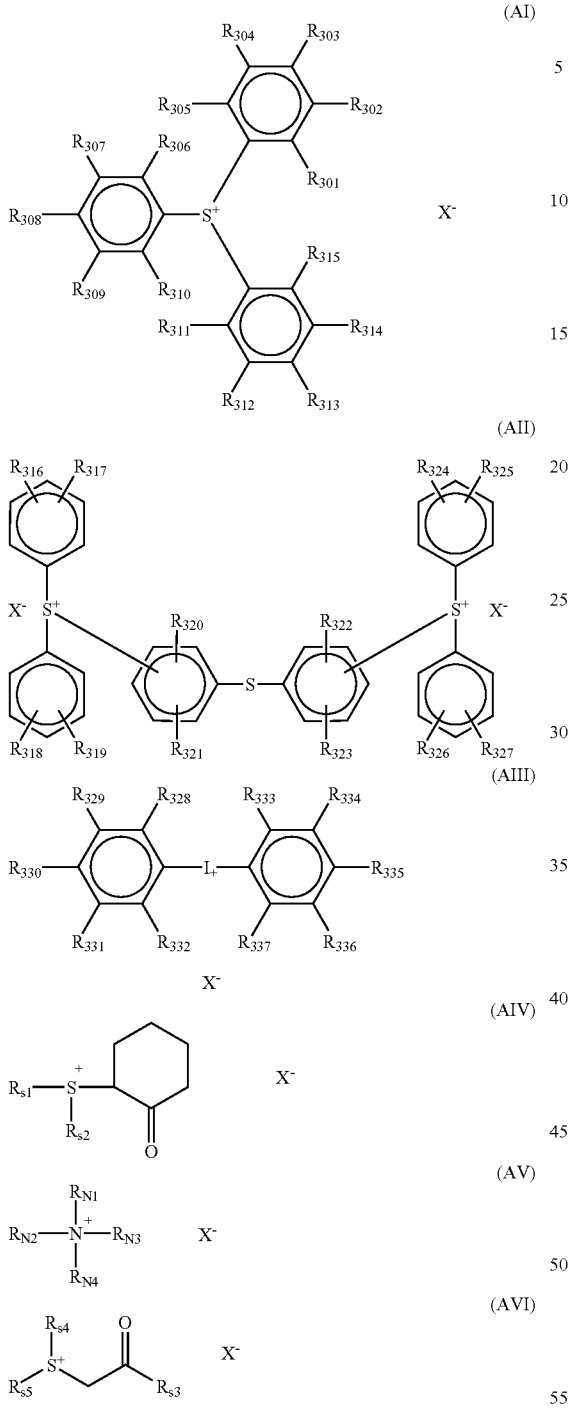

(AI)

(AII)

(AIII)

(AIV)

(AV)

(AVI)

In the above formulae, $R_{301}$ to $R_{337}$ each independently represent a hydrogen atom, a straight chain, branched or cyclic alkyl group, a straight chain, branched or cyclic alkoxy group, a hydroxy group, a halogen atom or a group of —S—$R_0$. $R_0$ represents a straight chain, branched or cyclic alkyl group or an aryl group.

$R_{s1}$ to $R_{s2}$ each independently represent a straight chain, branched or cyclic alkyl group.

$R_{N1}$ to $R_{N4}$ each independently represent a straight chain, branched or cyclic alkyl group which may have a substitu-ent. Alternatively, two substituents of $R_{N1}$ to $R_{N4}$ may be combined with each other to form a ring.

Also, in formula (AV), one of $R_{N1}$ to $R_{N4}$ and $X^-$ may be combined with each other in the molecule.

$R_{s3}$ to $R_{s5}$ each independently represent a straight chain, branched or cyclic alkyl group which may have a substituent or an aryl group which may have a substituent. Alternatively, two or more of $R_{s3}$ to $R_{s5}$ may be combined with each other to form a ring.

The compound represented by formula (AVI) includes compounds having two or more sulfonium structures.

$X^-$ represents an anion of a carboxylic acid compound represented by any one of the following formulae (C1) to (C10)

(C1)

(C2)

(C3)

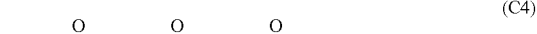

(C4)

(C5)

(C6)

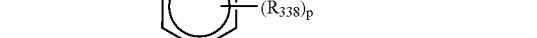

(C7)

(C8)

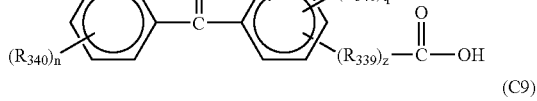

(C9)

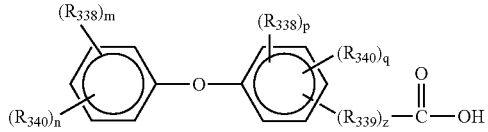

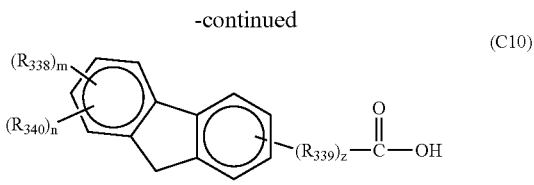

In the above formulae, $R_{338}$ represents a substituted or unsubstituted straight chain or branched alkyl group having from 1 to 30 carbon atoms, a substituted or unsubstituted cycloalkyl group having from 3 to 30 carbon atoms (wherein the alkyl group or cycloalkyl group may contain an oxygen atom or a nitrogen atom in the chain thereof), a straight chain, branched or cyclic alkenyl group having from 2 to 20 carbon atoms, a straight chain, branched or cyclic alkynyl group having from 2 to 20 carbon atoms, a straight chain, branched or cyclic alkoxy group having from 1 to 20 carbon atoms, a substituted or unsubstituted aryl group having from 6 to 20 carbon atoms, a halogen atom, a nitro group or a camphor residue.

In the alkyl group or cycloalkyl group, the hydrogen atoms are partially substituted with a halogen atom and/or a hydroxy group. Also, in the alkenyl group, the hydrogen atoms are partially substituted with a halogen atom and/or a hydroxy group.

Examples of the substituent for the aryl group include an alkyl group, a nitro group, a hydroxy group, an alkoxy group, an acyl group, an alkoxycarbonyl group and a halogen atom.

$R_{339}$ represents a single bond, a straight chain, branched or cyclic alkylene group having from 1 to 20 carbon atoms (wherein the alkylene group may contain an oxygen atom or a nitrogen atom in the chain thereof), a straight chain, branched or cyclic alkenylene group having from 1 to 20 carbon atoms or an alkoxyalkylene group having from 2 to 20 carbon atoms. The plural $R_{338}$'s and $R_{339}$'s may be the same or different from each other.

In the alkylene group, the hydrogen atoms are partially substituted with a halogen atom and/or a hydroxy group. Also, in the alkenylene group, the hydrogen atoms are partially substituted with a halogen atom and/or a hydroxy group.

$R_{340}$ represents a hydroxy group or a halogen atom. The plural $R_{340}$'s may be the same or different from each other. m, n, p and q each independently represent an integer of from 0 to 3, provided that m+n≦5 and p+q≦5. z represents 0 or 1.

In formulae (AI) to (AVI), the straight chain or branched alkyl group represented by any one of $R_{301}$ to $R_{337}$, $R_{s1}$ to $R_{s5}$ and $R_{N1}$ to $R_{N4}$ includes that having from 1 to 4 carbon atoms, which may have a substituent, for example, methyl, ethyl, propyl, n-butyl, sec-butyl or tert-butyl group.

The cycloalkyl group includes that having from 3 to 8 carbon atoms, which may have a substituent, for example, cyclopropyl, cyclopentyl or cyclohexyl group.

The alkoxy group represented by any one of $R_{301}$ to $R_{337}$ includes that having from 1 to 4 carbon atoms, for example, methoxy, ethoxy, hydroxyethoxy, propoxy, n-butoxy, isobutoxy, sec-butoxy or tert-butoxy group.

The halogen atom represented by any one of $R_{301}$ to $R_{337}$ includes for example, fluorine, chlorine, bromine and iodine atoms.

The aryl group represented by any one of $R_0$ and $R_{s3}$ to $R_{s5}$ includes that having from 6 to 14 carbon atoms, which may be substituted, for example, phenyl, tolyl, methoxyphenyl or naphthyl group.

The substituent for the above groups preferably includes an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

The aromatic ring or monocyclic or polycyclic aliphatic hydrocarbon ring (the ring may contain an oxygen atom or a nitrogen atom) formed by combining two of $R_{N1}$ to $R_{N4}$ includes, for example, benzene, naphthalene, cyclohexane, norbornene and oxabicyclo structures.

The sulfonium, iodonium or ammonium compound represented by any one of formulae (AI) to (AVI) for use in the present invention includes as the counter anion represented by $X^-$, an anion (—COO⁻) of a carboxy group (—COOH) of at least one of the carboxylic compounds represented by any one of formulae (C1) to (C10) described above.

The straight chain or branched alkyl group having from 1 to 30 carbon atoms (wherein the alkyl group may contain an oxygen atom or a nitrogen atom in the chain thereof) represented by $R_{338}$ includes, for example, methyl, ethyl, propyl, butyl, pentyl, hexyl, dodecyl, 2-ethoxyethyl and 2-hydroxyethyl groups.

The cycloalkyl group having from 3 to 30 carbon atoms includes a monocyclic or polycyclic alicyclic group, for example, cyclohexyl, adamantyl, cyclopentyl group, or a group containing a bicyclo ring, an oxabicyclo ring or a tricyclo ring.

Representative structural examples of the monocyclic or polycyclic alicyclic portion include the followings:

(1)

(2)

(3)

(4)

(5)

(6)

(7)

-continued
(8) 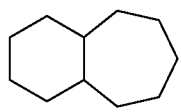
(9) 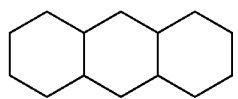
(10) 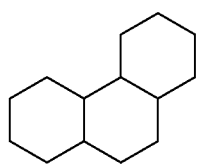
(11) 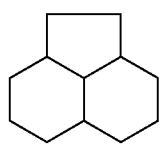
(12) 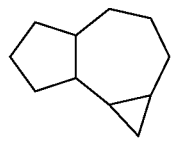
(13) 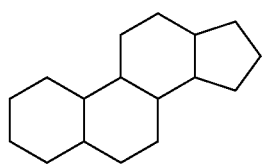
(14) 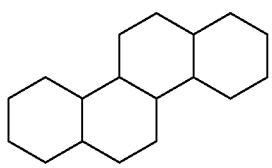
(15) 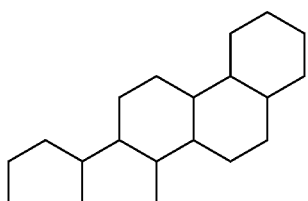
(16) 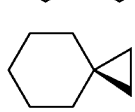
(17) 
(18) 
-continued
(19) 
(20) 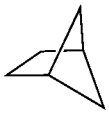
(21) 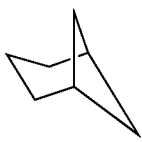
(22) 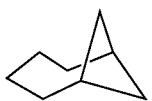
(23) 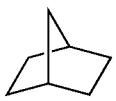
(24) 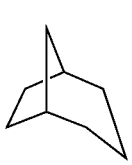
(25) 
(26) 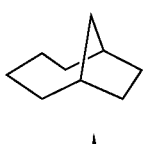
(27) 
(28) 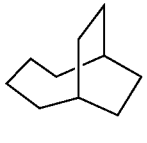
(29) 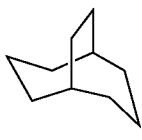
(30)

-continued

(31) 

(32) 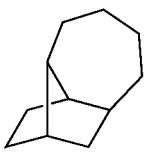

(33) 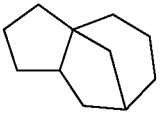

(34) 

(35) 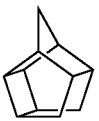

(36) 

(37)

(38)

(39)

(40)

(41)

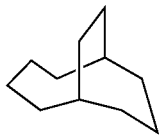
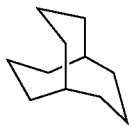
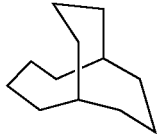
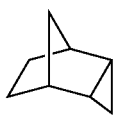
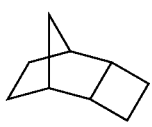
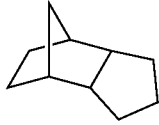
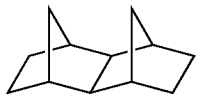
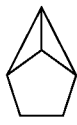
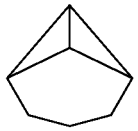

-continued (42)

(43)

(44)

(45)

(46)

(47)

(48)

(49)

(50)

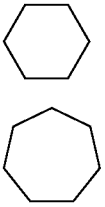
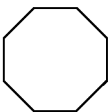

The straight chain, branched or cyclic alkenyl group having from 2 to 20 carbon atoms includes, for example, ethenyl, propenyl, isopropenyl and cyclohexenyl groups.

The straight chain, branched or cyclic alkynyl group having from 2 to 20 carbon atoms includes, for example, ethynyl and propynyl groups.

The straight chain, branched or cyclic alkoxy group having from 1 to 20 carbon atoms includes, for example, methoxy, ethoxy, propyloxy, butoxy, cyclohexyloxy, isobutoxy and dodecyloxy groups.

The substituted or unsubstituted aryl group having from 6 to 20 carbon atoms includes, for example, phenyl, naphthyl and anthryl groups.

The substituent for the straight chain or branched alkyl group, cycloalkyl group or aryl group includes, for example, an alkyl group, a nitro group, a hydroxy group, an alkoxy group, an acyl group, an alkoxycarbonyl group and a halogen atom.

The straight chain, branched or cyclic alkylene group having from 1 to 20 carbon atoms (wherein the alkylene group may contain an oxygen atom or a nitrogen atom in the chain thereof) represented by $R_{339}$ includes, for example, methylene, ethylene, propylene, butylene, isobutylene, ethoxyethylene and cyclohexylene groups.

The straight chain, branched or cyclic alkenylene group having from 1 to 20 carbon atoms includes, for example, vinylene and allylene groups.

The onium salt of a carboxylic acid of Component (A2) according to the present invention is preferably an iodonium salt of a carboxylic acid or a sulfonium salt of a carboxylic acid.

Further, it is preferred that the carboxylate residue of the onium salt of a carboxylic acid of Component (A2) according to the present invention contains neither an aromatic residue nor a carbon-carbon double bond.

X⁻ preferably represents a straight chain, branched, monocyclic or polycyclic alkylcarboxylic acid anion, and more preferably an alkylcarboxylic acid anion wherein the alkyl group is partially or wholly fluorine-substituted. The alkyl chain may contain an oxygen atom.

Examples of the fluorine-substituted alkylcarboxylic acid anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid.

Specific examples of the onium salt of a carboxylic acid of Component (A2) are set forth below, but the present invention should not be construed as being limited thereto.

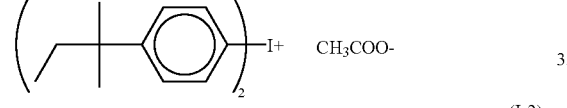

(I-1)

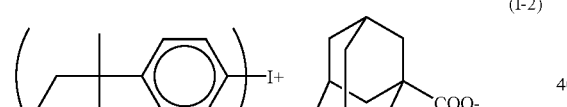

(I-2)

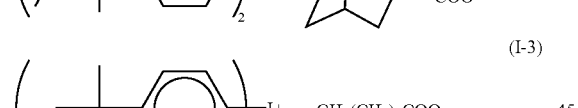

(I-3)

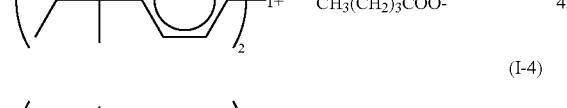

(I-4)

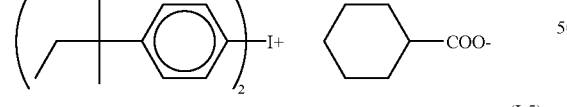

(I-5)

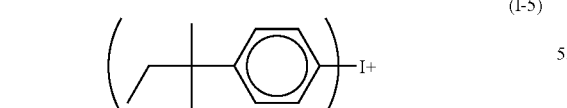

-continued

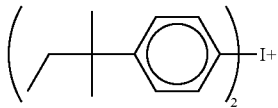

(I-6)

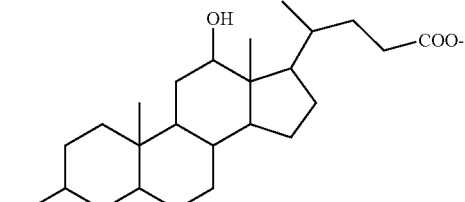

(I-7)

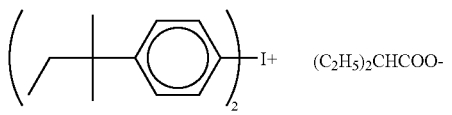

(I-8)

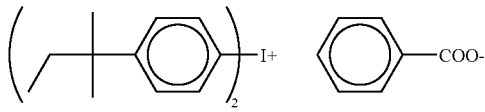

(I-9)

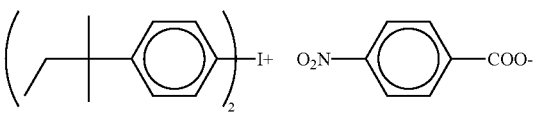

(I-10)

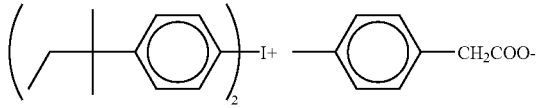

(I-11)

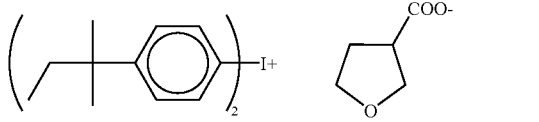

(I-12)

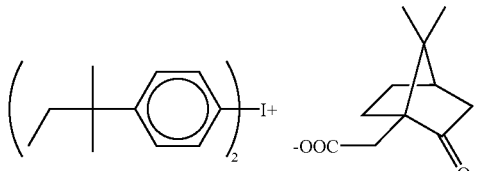

(I-13)

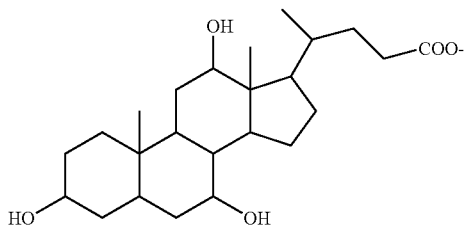

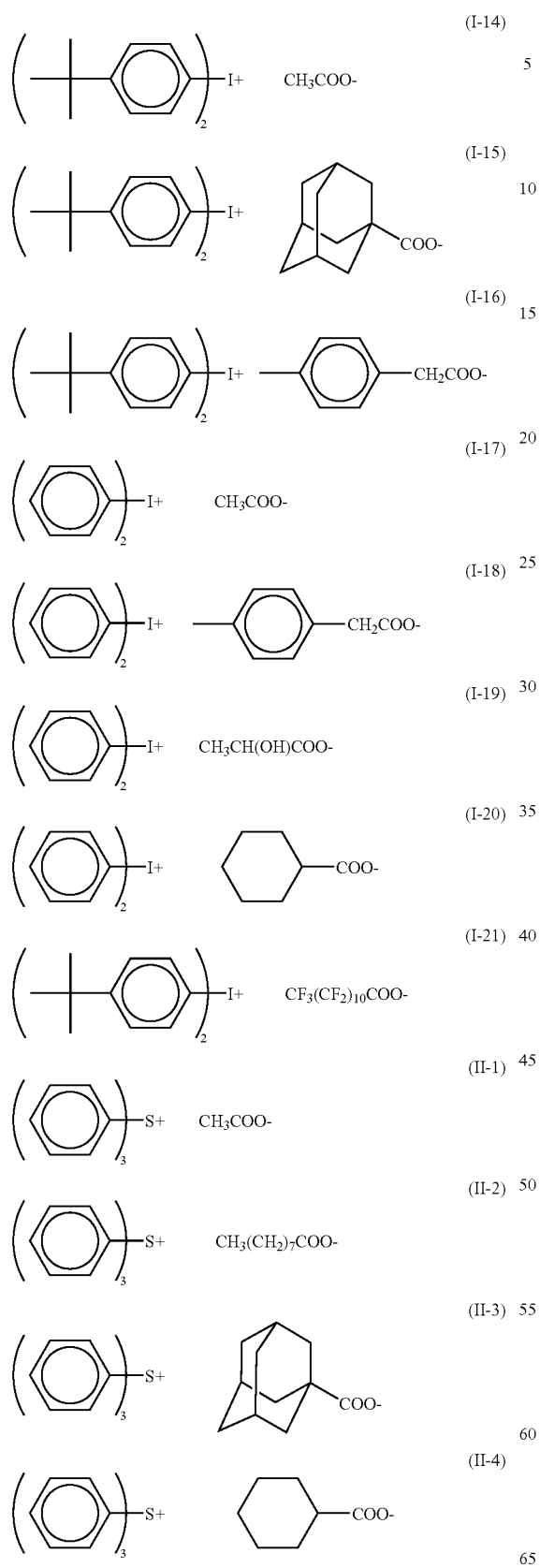
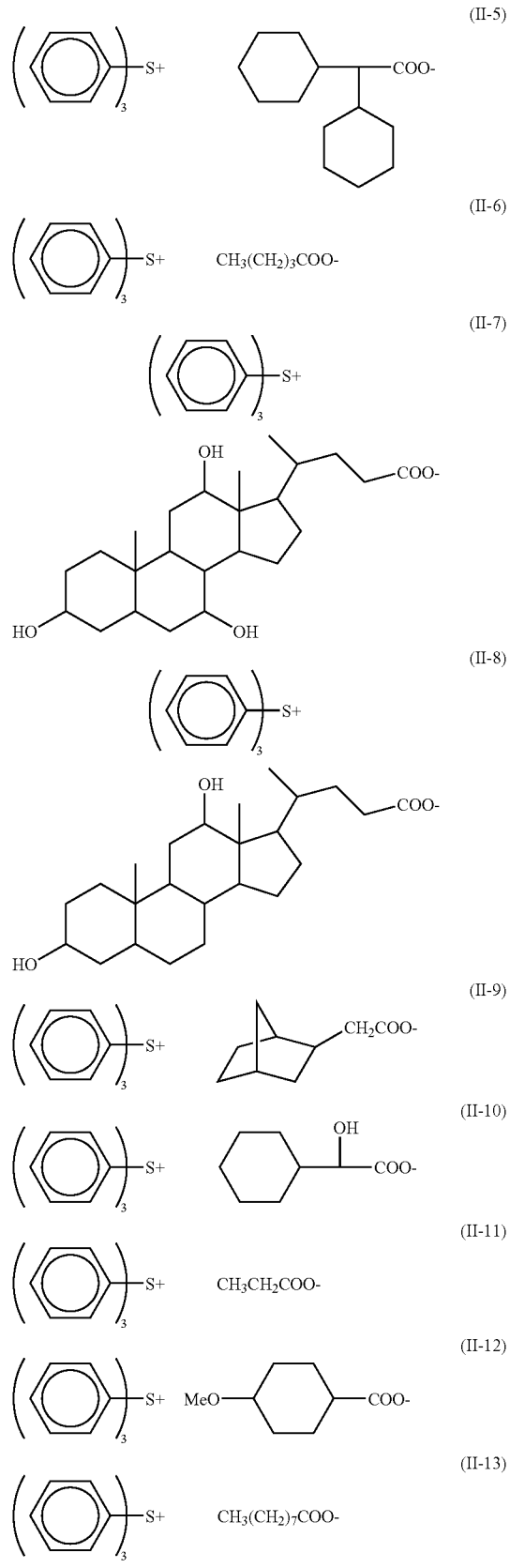

-continued
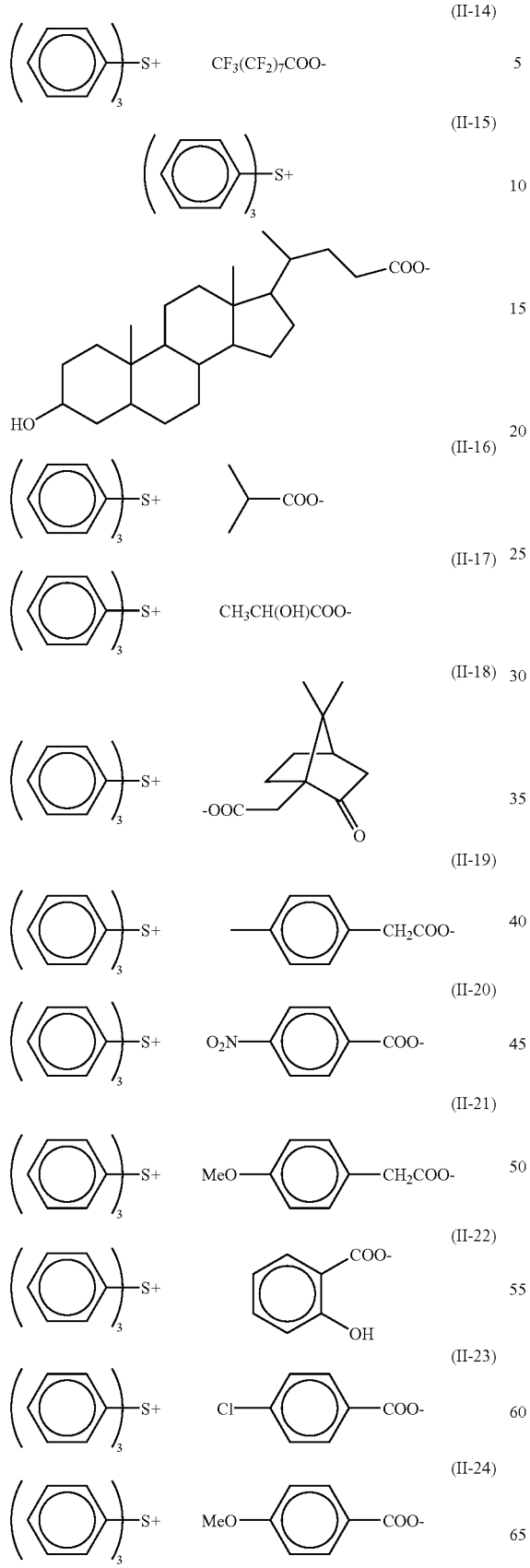
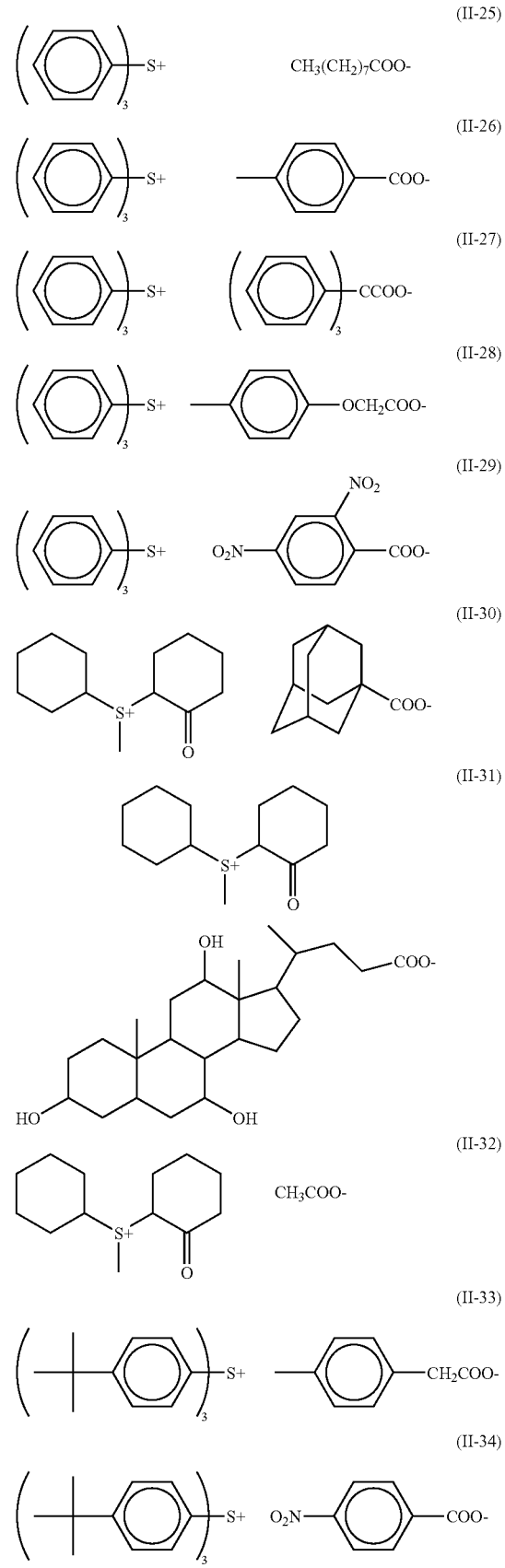

-continued
(II-35)
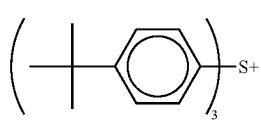 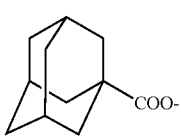
(II-36)
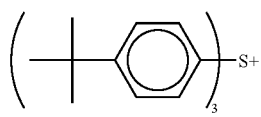 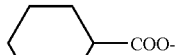
(II-37)
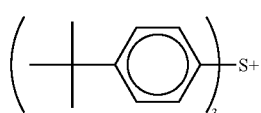 CH₃COO-
(II-38)
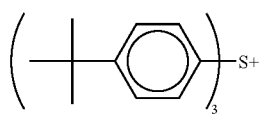 CH₃(CH₂)₃COO-
(II-39)
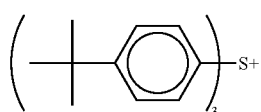 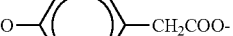
(II-40)
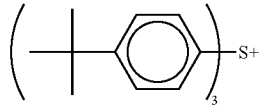 
(II-41)
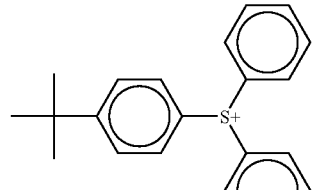
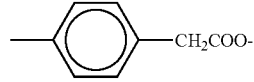
(II-42)
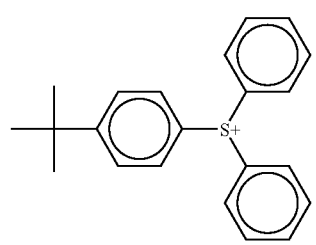
-continued
(II-43)
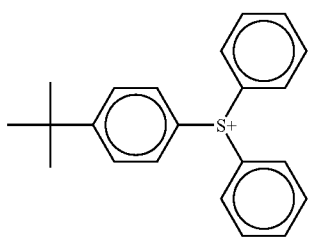 CH₃CH₂COO-
(II-44)
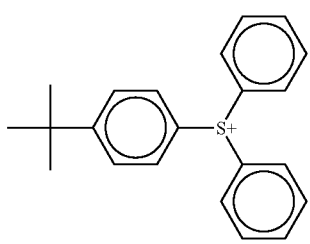 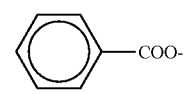
(II-45)
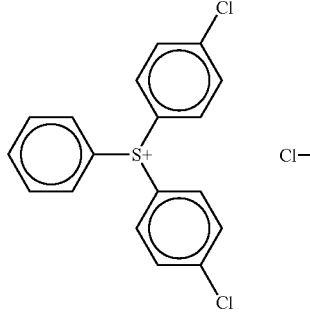 
(II-46)
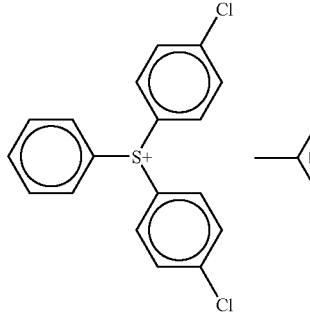 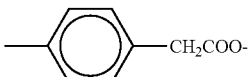
(II-47)
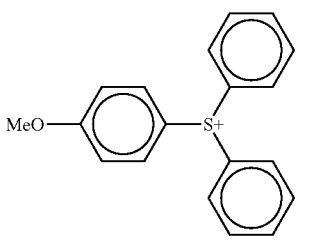 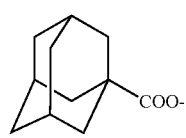

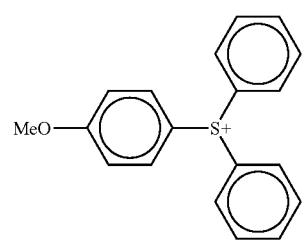
(II-48)
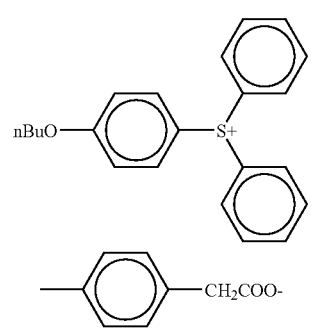
(II-49)
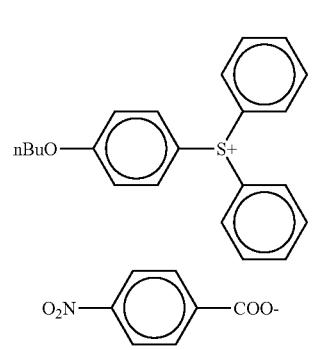
(II-50)
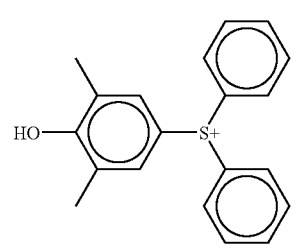
(II-51)
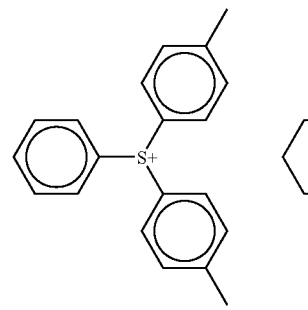
(II-52)
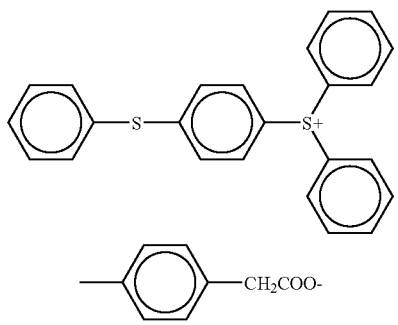
(II-53)
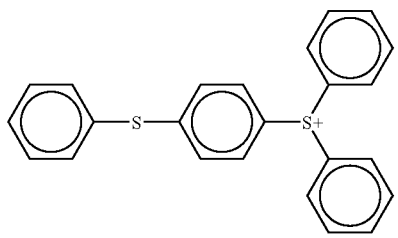
(II-54)
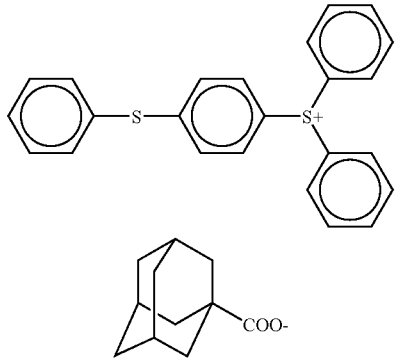
(II-55)
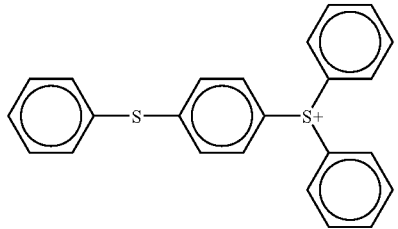
(II-56)
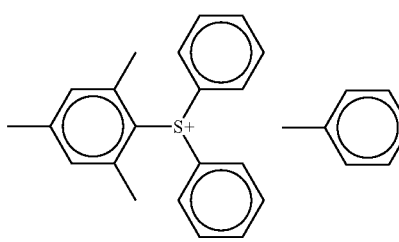
(II-57)

-continued (II-58) Trimethylphenyl-diphenylsulfonium CH₃COO⁻

(II-59) (3,4-dimethoxyphenyl)diphenylsulfonium 2-methoxyphenylacetate (II-60) (3,4-dimethoxyphenyl)diphenylsulfonium CH₃CH(OEt)COO⁻

(II-61) (4-methylphenyl)diphenylsulfonium CH₃CH₂COO⁻

(II-62) bis-sulfonium with thioether bridge, 2 CH₃COO⁻

(II-63) (phenyl)₃S⁺ CF₃(CF₂)₁₂COO⁻

(II-64) (phenyl)₃S⁺ CF₃(CF₂)₂COO⁻

(II-65) (phenyl)₃S⁺ CF₃COO⁻

(II-66) (phenyl)₃S⁺ CF₃(CF₂)₁₀COO⁻

(II-67) (t-butylphenyl)₃S⁺ perfluorocyclohexanecarboxylate (II-68) norbornyl-methyl-(2-oxocyclohexyl)sulfonium CH₃COO⁻

(II-69) tetrahydrothiophenium-propan-2-one CH₃COO⁻

(II-70) bis(tetrahydrothiophenium)acetone 2 CH₃COO⁻

(II-71) phenacyl-tetrahydrothiophenium CH₃COO⁻

(II-72) phenacyl-tetrahydrothiophenium adamantanecarboxylate (II-73) phenacyl-tetrahydrothiophenium cholate (IV-1) (C₄H₉)₄N⁺ CH₃COO⁻

-continued

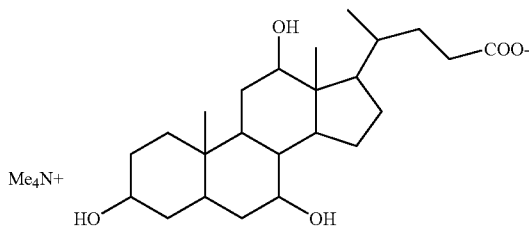

In the above formulae, Me represents a methyl group and Et represents an ethyl group.

The compounds represented by formulae (AI) to (AVI) may be used individually or in combination with two or more thereof.

The compound represented by any one of formulae (AI) to (AVI) can be synthesized by reacting a sulfonium hydroxide, iodonium hydroxide or ammonium hydroxide with a carboxylic acid in an appropriate solvent. The sulfonium hydroxide, iodonium hydroxide or ammonium hydroxide can be obtained by reacting sulfonium iodide, iodonium iodide or ammonium iodide with silver oxide in an appropriate solvent.

The total content of the compound of Component (A2) is ordinarily from 0.01 to 10% by weight, preferably from 0.03 to 7% by weight, and more preferably from 0.05 to 3% by weight based on the total solid content of the positive photosensitive composition of the present invention.

A ratio of the content (weight ratio) of Component (A1) to Component (A2) is ordinarily from 99/1 to 1/99, preferably from 99/1 to 20/80, and more preferably from 90/10 to 40/60. It is preferred that the content of Component (A1) is larger than the content of Component (A2).

<<Acid Generating Compound Usable Together with the Compounds of Components (A1) and (A2)>>

In the present invention, a compound that decomposes upon irradiation of an actinic ray or radiation to generate an acid may be further used together with the compounds of Components (A1) and (A2). Hereinafter, the compounds of Components (A1) and (A2) are also collectively referred to as the compounds of Component (A).

An amount of the photo-acid generating compound used together with the compounds of Component (A) according to the present invention is ordinarily from 100/0 to 20/80, preferably from 100/0 to 40/60, and more preferably from 100/0 to 50/50, in terms of a molar ratio of the compounds of Component (A)/other photo-acid generating compounds.

In particular, when the photo-acid generating compound having an aromatic ring structure is used together, the amount thereof is preferably not more than 60% by weight, more preferably not more than 50% by weight, based on the total amount of the acid generators.

Such a photo-acid generating compound used together with the compounds of Component (A) can be appropriately selected from photoinitiators for photo-cationic polymerization, photoinitiators for photo-radical polymerization, photo-achromatic agents for dyes, photo-discoloring agents, known compounds capable of generating an acid upon irradiation of an actinic ray or radiation used for microresists, and mixtures thereof.

Examples of the photo-acid generating compound include diazonium salts, phosphonium salts, sulfonium salts, iodonium salts, imidosulfonates, oxymesulfonates, diazodisulfones, disulfones and o-nitrobenzylsulfonates.

The sulfonium salts are particularly preferred, and triarylsulfonium salts, phenacylsulfonium salts and sulfonium salts having an 2-oxoalkyl group are most preferred.

Also, polymer compounds in which a group or compound capable of generating an acid upon irradiation of an actinic ray or radiation is introduced into the main chain or side chain thereof, for example, compounds as described, e.g., in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

Further, compounds capable of generating an acid with light as described, for example, in U.S. Pat. No. 3,779,778 and European Patent 126,712 can be used.

Particularly preferred examples of the photo-acid generating compound used together with the compounds of Component (A) according to the present invention are set -continued
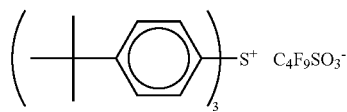 (z3)
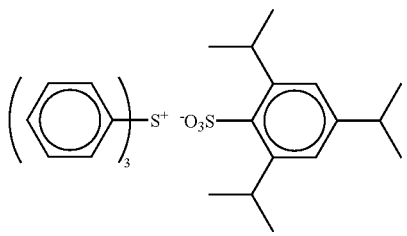 (z4)
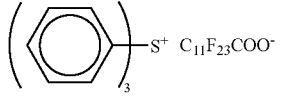 (z6)
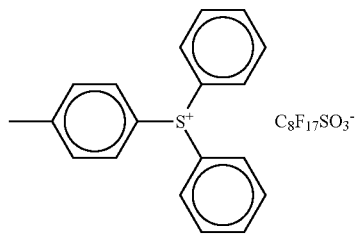 (z7)
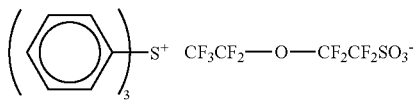 (z8)
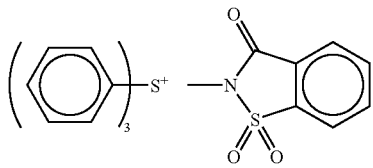 (z11)
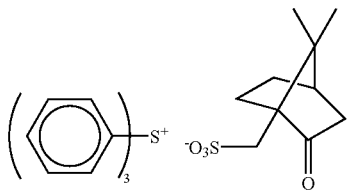 (z12)
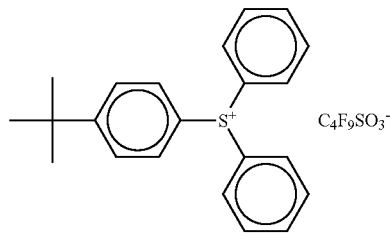 (z13)
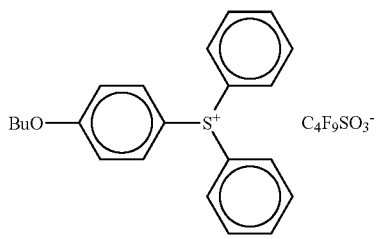 (z14)
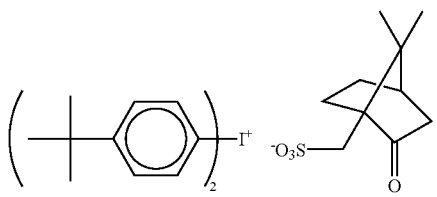 (z15)
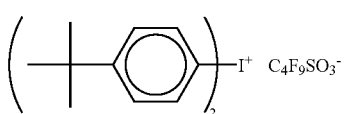 (z16)
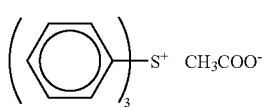 (z18)
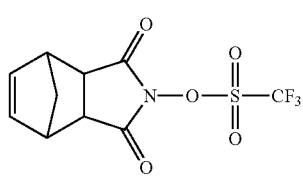 (z22)
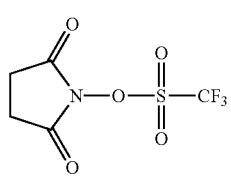 (z23)
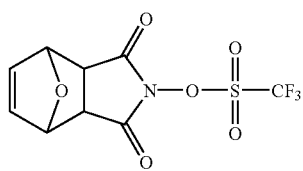 (z24)
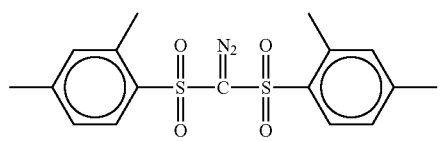 (z25)

-continued

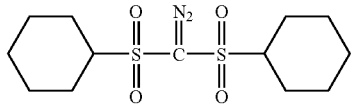 (z26)

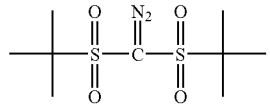 (z27)

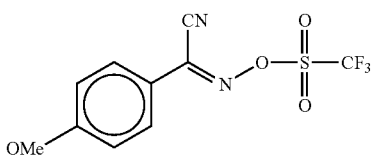 (z28)

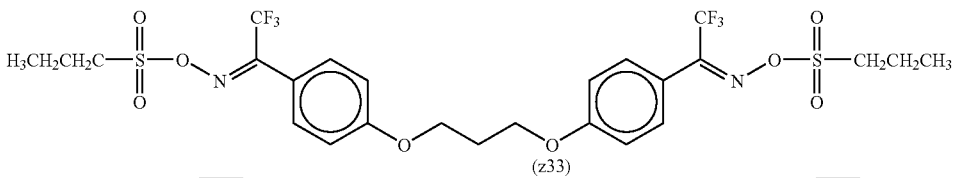 (z29)

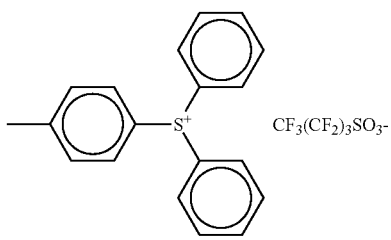 (z33)

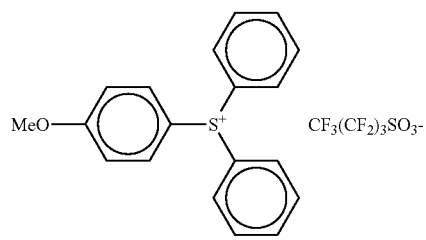 (z34)

<<(B) Resin that is Decomposed by the Action of an Acid to Increase Solubility in an Alkali Developing Solution (Hereinafter, Also Referred to as an "Acid-decomposable Resin")>>

Any resin that has a monocyclic or polycyclic alicyclic hydrocarbon structure and is decomposed by the action of an acid to increase solubility in an alkali developing solution can be used as the acid-decomposable resin of Component (B) according to the present invention. Preferred examples of the resin of Component (B) include resins containing at least one repeating unit selected from a repeating unit having a partial structure including an alicyclic hydrocarbon represented by formula (pI), (pII), (pIII), (pIV), (pV) or (pVI) described below and a repeating unit represented by formula (II-AB) described below.

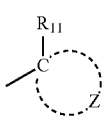 (pI)

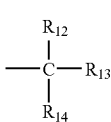 (pII)

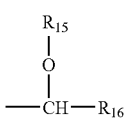 (pIII)

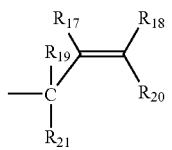 (pIV)

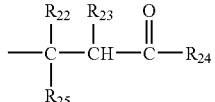 (pV)

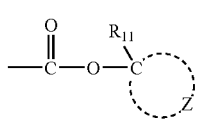 (pVI)

In the above formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

$R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group.

$R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group.

$R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, provided that at least one of $R_{22}$ to $R_{25}$ represents an alicyclic hydrocarbon group. Alternatively, $R_{23}$ and $R_{24}$ may be combined with each other to form a ring.

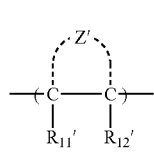

(II-AB)

In formula (II-AB), $R_{11}'$ and $R_{12}'$ each independently represent a hydrogen atom, a cyano group, a halogen atom or an alkyl group which may have a substituent.

Z' represents an atomic group necessary for forming an alicyclic structure, which may be substituted, together with the connected two carbon atoms (C—C).

Of the repeating units represented by formula (II-AB), those represented by formulae (II-A) and (II-B) shown below are more preferred.

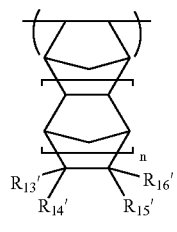

(II-A)

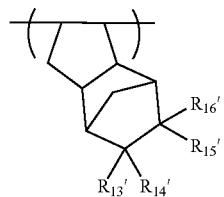

(II-B)

In formulae (II-A) and (II-B), $R_{13}'$ to $R_{16}'$ each independently represent a hydrogen atom, a halogen atom, a cyano group, —COOH, —COOR$_5$, a group capable of being decomposed by the action of an acid, —C(=O)—X-A'-R$_{17}'$, an alkyl group which may have a substituent or a cyclic hydrocarbon group which may have a substituent.

$R_5$ represents an alkyl group which may have a substituent, a cyclic hydrocarbon group which may have a substituent or a group represented by Y.

X represents an oxygen atom, a sulfur atom, —NH—, —NHSO$_2$— or —NHSO$_2$NH—.

A' represents a single bond or a divalent linkage group.

Alternatively, at least two of $R_{13}'$ to $R_{16}'$ may be combined with each other to form a ring. n represents 0 or 1.

$R_{17}'$ represents —COOH, —COOR$_5$, a cyano group, a hydroxy group, an alkoxy group which may have a substituent, —CO—NH—R$_6$, —CO—NH—SO$_2$—R$_6$ or a group represented by Y. $R_6$ represents an alkyl group which may have a substituent or a cyclic hydrocarbon group which may have a substituent.

The group represented by Y has the following structure:

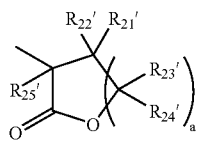

or

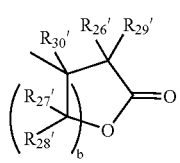

wherein $R_{21}'$ to $R_{30}'$ each independently represent a hydrogen atom or an alkyl group which may have a substituent, and a and b each represent 1 or 2.

In formulae (pI) to (pVI), the alkyl group for $R_{12}$ to $R_{25}$ includes a straight chain or branched alkyl group having from 1 to 4 carbon atoms, which may be substituted. Examples of the alkyl group include methyl, ethyl, n-propyl, isopropyl, n-butyl, isobutyl, sec-butyl and tert-butyl groups.

Examples of the substituent for the alkyl group include an alkoxy group having from 1 to 4 carbon atoms, a halogen atom (e.g., fluorine, chlorine, bromine or iodine atom), an acyl group, an acyloxy group, a cyano group, a hydroxy group, a carboxy group, an alkoxycarbonyl group and a nitro group.

The alicyclic hydrocarbon group in $R_{11}$ to $R_{25}$ or the alicyclic hydrocarbon group formed by Z and the carbon atoms may be a monocyclic group or a polycyclic group, and includes specifically a group having not less than 5 carbon atoms and including, for example, a monocyclo, bicyclo, tricyclo or tetracyclo structure. The number of carbon atoms included is preferably from 6 to 30, and more preferably from 7 to 25. The alicyclic hydrocarbon group may have a substituent.

Examples of the structure of alicyclic portion in the alicyclic hydrocarbon group are set forth below.

(1)

(2)

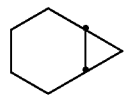

(3)

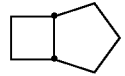

(4)

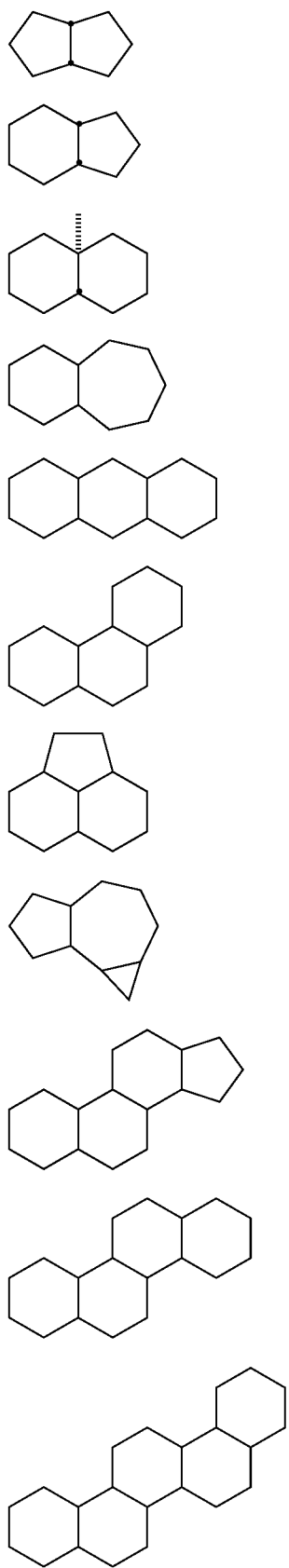
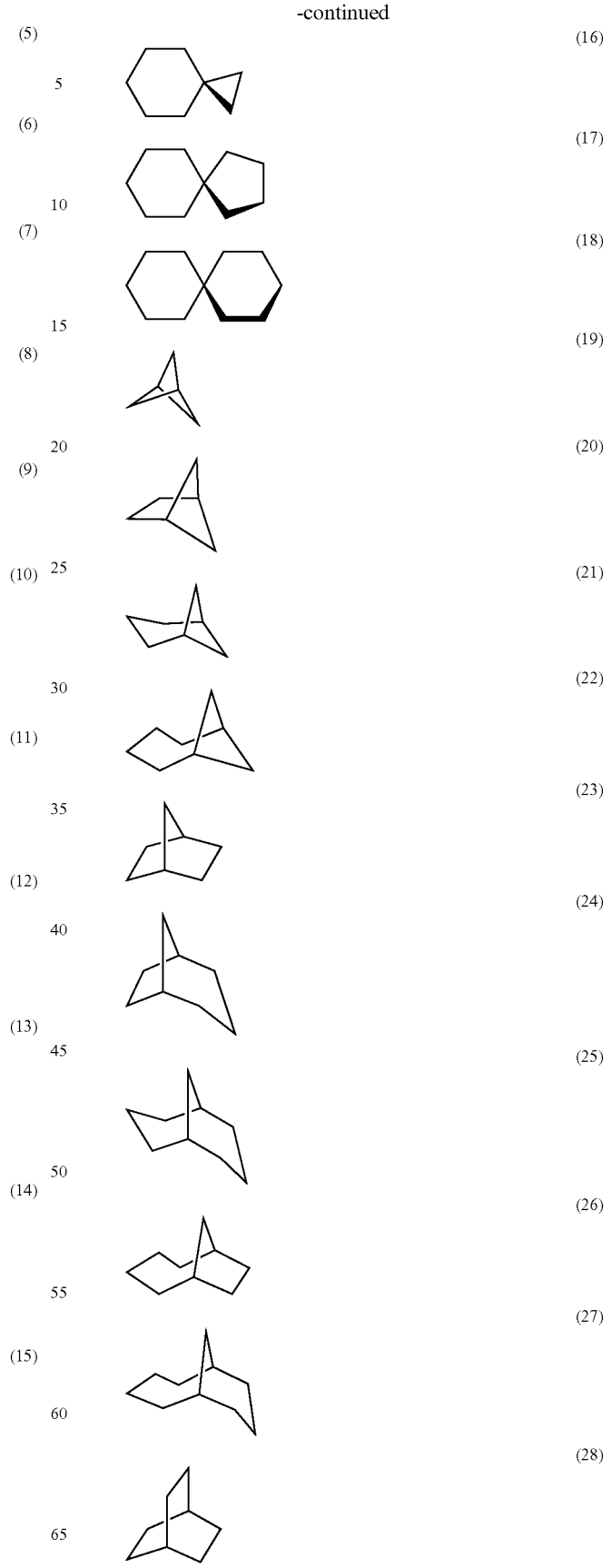

-continued

(29) 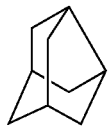

(30) 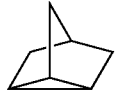

(31) 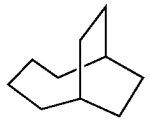

(32) 

(33) 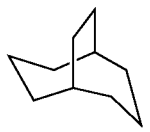

(34) 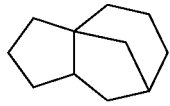

(35) 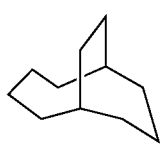

(36) 

(37) 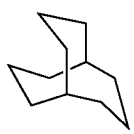

(38) 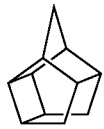

(39) 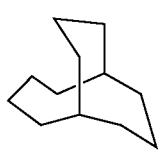

(40) 

(41) 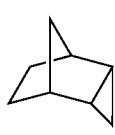

(42) 

(43) 

(44) 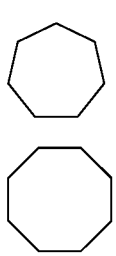

(45) 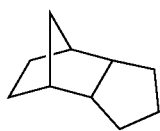

(46) 

(47) 

(48) 

(49) 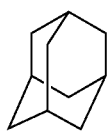

(50)

Preferred examples of the alicyclic portion for use in the present invention include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group and a cyclododecanyl group are more preferred.

Examples of the substituent for the alicyclic hydrocarbon group include an alkyl group, a substituted alkyl group, a halogen atom, a hydroxy group, an alkoxy group, a carboxy group and an alkoxycarbonyl group. The alkyl group is preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group.

The structure represented by any one of formulae (pI) to (pVI) in the resin can be used for protecting an alkali-soluble group. The alkali-soluble group includes various groups known in the field of art.

Specific examples of the alkali-soluble group include a carboxylic acid group, a sulfonic acid group, a phenol group and a thiol group, and a carboxylic acid group and a sulfonic acid group are preferably used.

The alkali-soluble group protected by the structure represented by any one of formulae (pI) to (pVI) in the resin preferably includes groups represented by the following formulae (pVII) to (pXI):

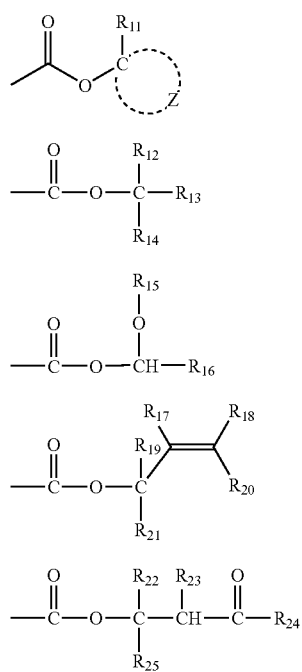

In the above formulae, $R_{11}$ to $R_{25}$ and Z have the same meanings as defined above, respectively.

A repeating unit having the alkali-soluble group protected by the structure represented by any one of formulae (pI) to (pVI) in the resin is preferably represented by the following formula (pA):

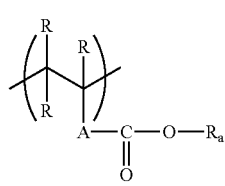

In the formula, R represents a hydrogen atom, a halogen atom or a straight chain or branched alkyl group having from 1 to 4 carbon atoms, which may be substituted. Plural R's may be the same or different from each other.

A represents a single bond, an alkylene group, a substituted alkylene group, an ether group, a thioether group, a carbonyl group, an ester group, an amido group, a sulfonamido group, a urethane group, a urea group or a combination of two or more thereof.

$R_a$ represents any one of the groups represented by formulae (pI) to (pVI).

Specific examples of the monomer corresponding to the repeating unit represented by formula (pA) are set forth below, but the present invention should not be construed as being limited thereto.

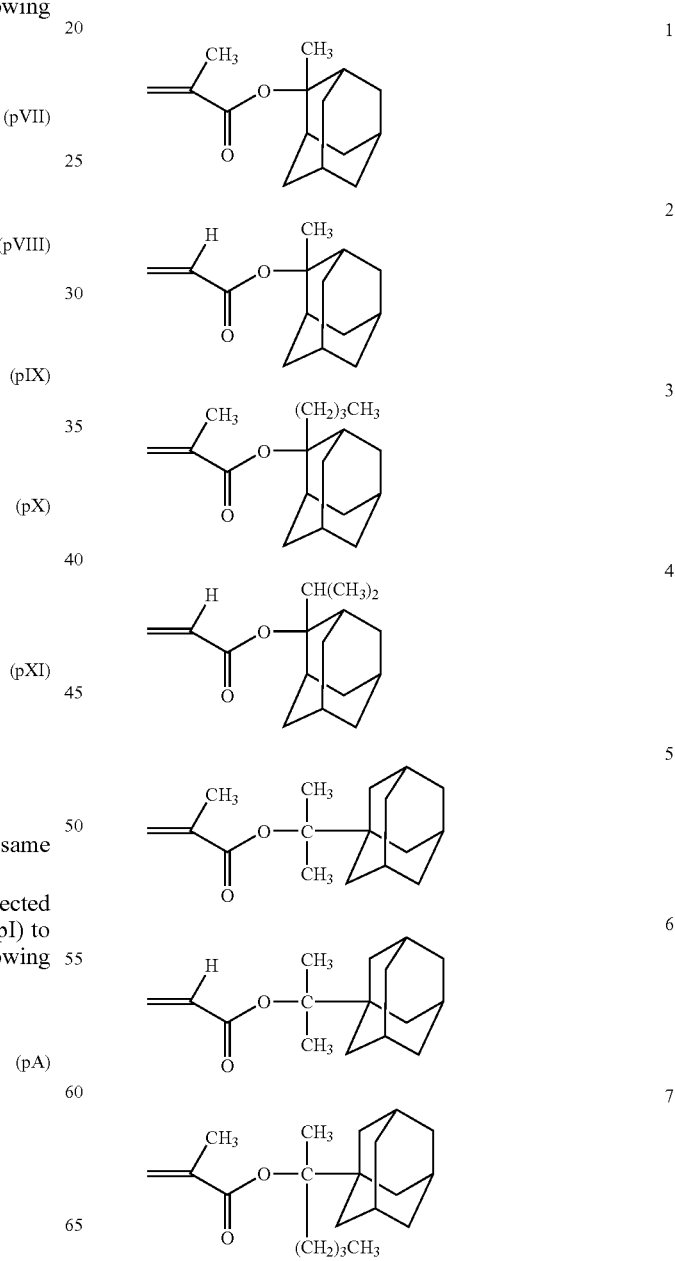

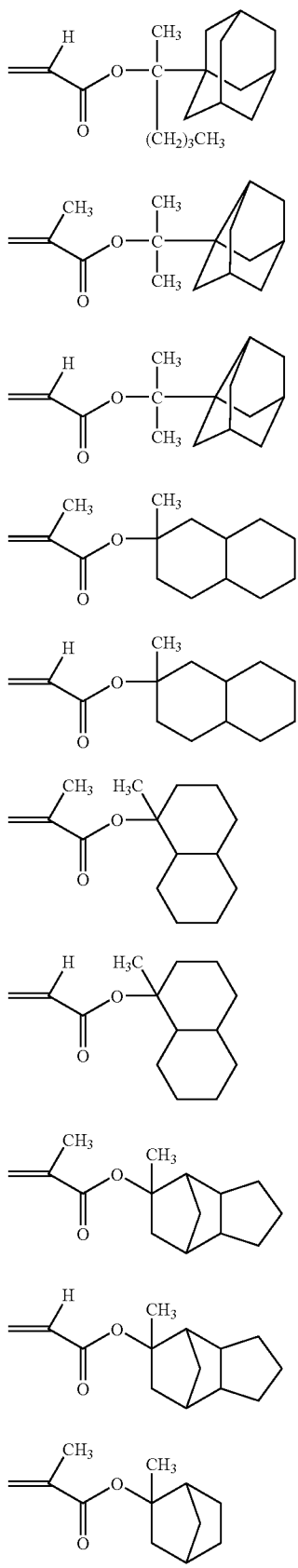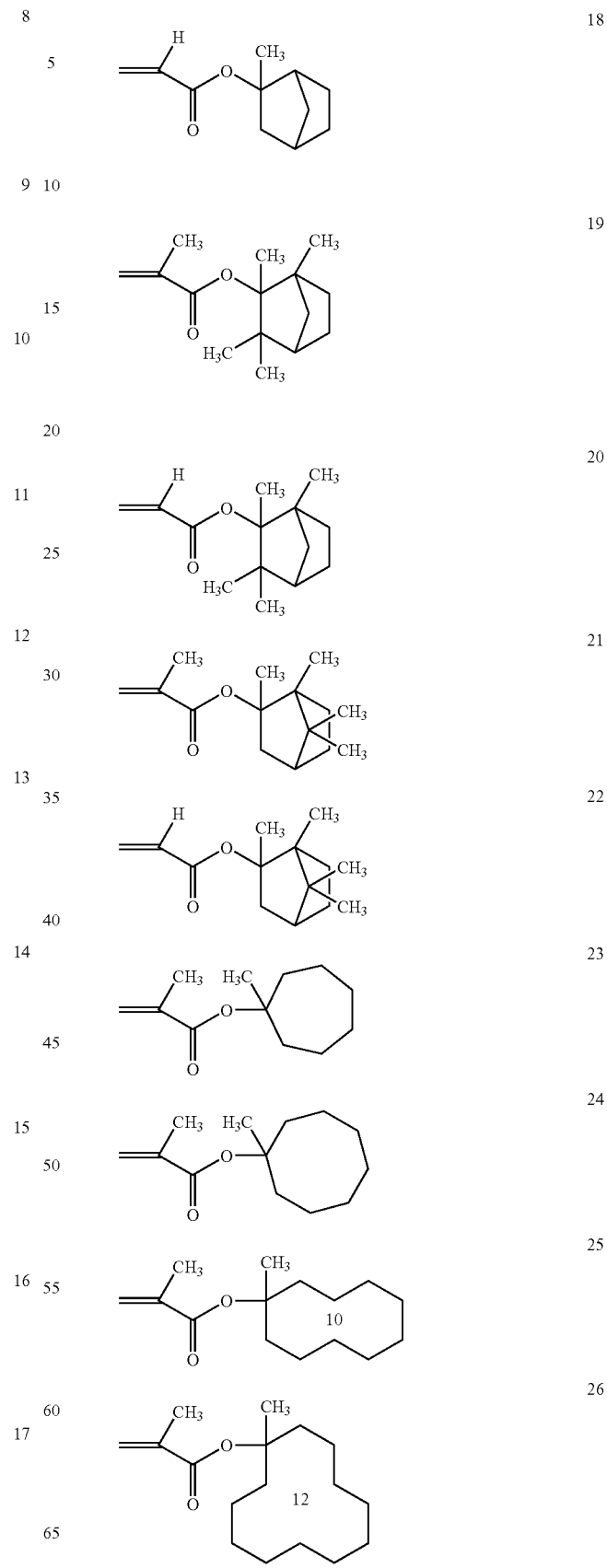

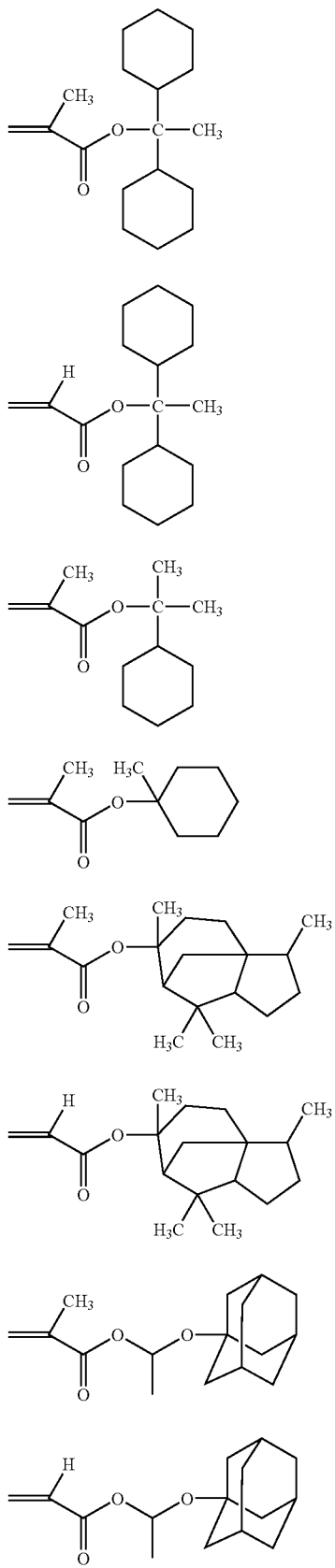

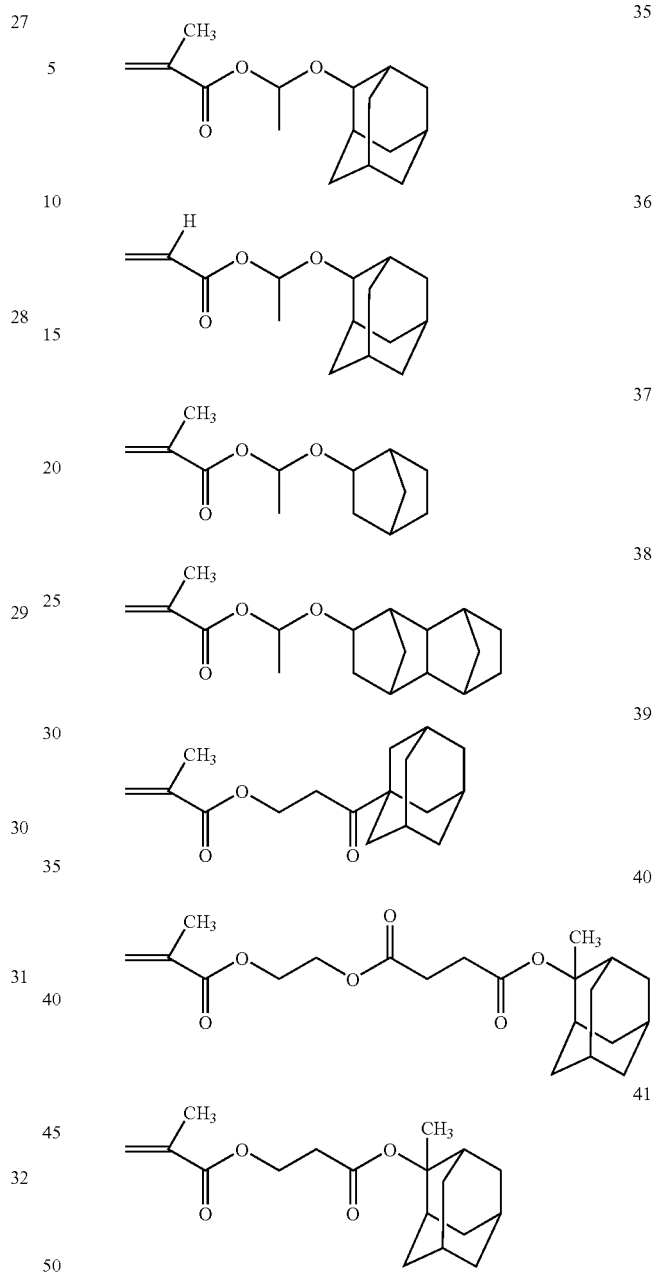

In formula (II-AB), $R_{11}'$ and $R_{12}'$ each independently represent a hydrogen atom, a cyano group, a halogen atom or an alkyl group which may have a substituent.

Z' represents an atomic group necessary for forming an alicyclic structure, which may be substituted, together with the connected two carbon atoms (C—C).

The halogen atom for $R_{11}'$ or $R_{12}'$ includes, for example, chlorine, bromine, fluorine and iodine atoms.

The alkyl group for each of $R_{11}'$, $R_{12}'$ and $R_{21}'$ to $R_{30}'$ includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

Examples of the substituent for the alkyl group include a hydroxy group, a halogen atom, a carboxy group, an alkoxy group, an acyl group, a cyano group and an acyloxy group. The halogen atom includes chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl and acetyl groups. The acyloxy group includes, for example, an acetoxy group.

The atomic group necessary for forming an alicyclic structure represented by Z' is an atomic group necessary for forming a repeating unit of alicyclic hydrocarbon moiety, which may be substituted. In particular, an atomic group necessary for forming a bridged alicyclic structure, by which a repeating unit of the bridged alicyclic hydrocarbon is completed, is preferred.

The skeleton of the bridged alicyclic hydrocarbon formed includes those described below.

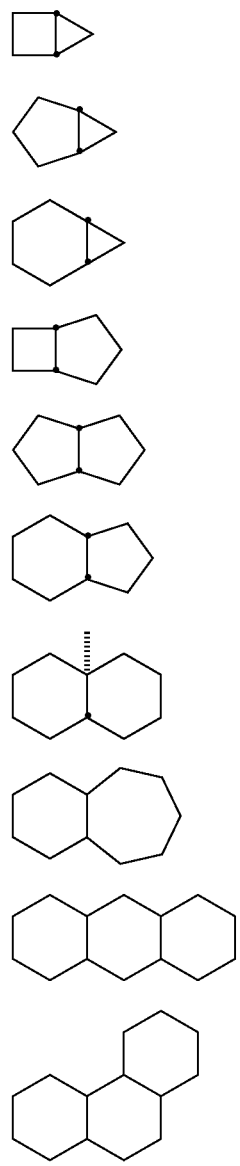

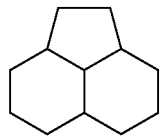

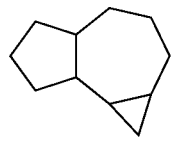

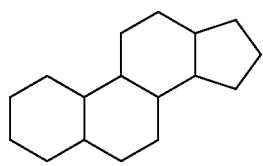

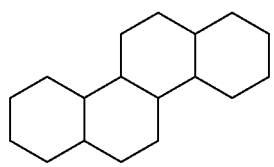

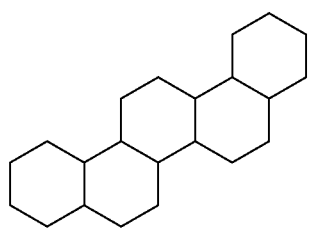

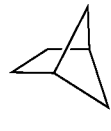

-continued
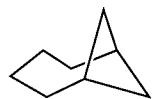
(22)
(23)
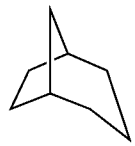
(24)
(25)
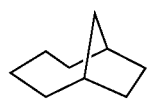
(26)
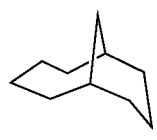
(27)
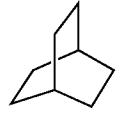
(28)
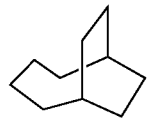
(29)
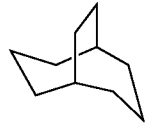
(30)
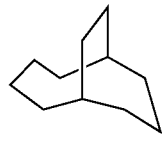
(31)
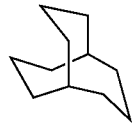
(32)
-continued
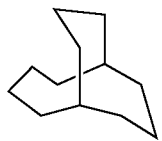
(33)
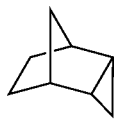
(34)
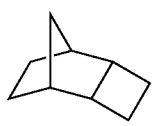
(35)
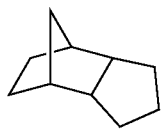
(36)
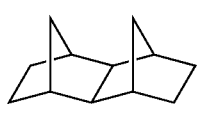
(37)
(38)
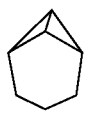
(39)
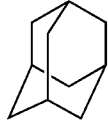
(40)
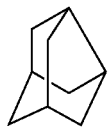
(41)
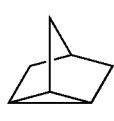
(42)
(43)
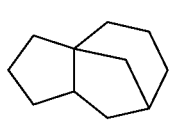
(44)

(45)

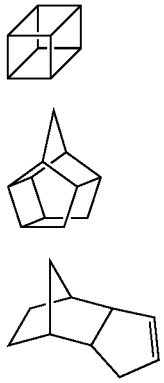

(46)

(47)

Of the skeletons of the bridged alicyclic hydrocarbon described above, (5), (6), (7), (9), (10), (13), (14), (15), (23), (28), (36), (37), (42) and (47) are preferred.

The skeleton of the alicyclic hydrocarbon may have a substituent. Examples of the substituent include the atoms and groups represented by $R_{13}'$ to $R_{16}'$ in formula (II-A) or (II-B).

Of the repeating units containing the bridged alicyclic hydrocarbon, those represented by formulae (II-A) and (II-B) described above are more preferred.

In formulae (II-A) and (II-B), $R_{13}'$ to $R_{16}'$ each independently represent a hydrogen atom, a halogen atom, a cyano group, —COOH, —COOR$_5$, a group capable of being decomposed by the action of an acid, —C(=O)—X-A'-$R_{17}'$, an alkyl group which may have a substituent or a cyclic hydrocarbon group which may have a substituent.

$R_5$ represents an alkyl group which may have a substituent, a cyclic hydrocarbon group which may have a substituent or a group represented by Y.

X represents an oxygen atom, a sulfur atom, —NH—, —NHSO$_2$— or —NHSO$_2$NH—.

A' represents a single bond or a divalent linkage group.

Alternatively, at least two of $R_{13}'$ to $R_{16}'$ may be combined with each other to form a ring. n represents 0 or 1.

$R_{17}'$ represents —COOH, —COOR$_5$, a cyano group, a hydroxy group, an alkoxy group which may have a substituent, —CO—NH—R$_6$, —CO—NH—SO$_2$—R$_6$ or a group represented by Y.

$R_6$ represents an alkyl group which may have a substituent or a cyclic hydrocarbon group which may have a substituent.

In the group represented by Y, $R_{21}'$ to $R_{30}'$ each independently represent a hydrogen atom or an alkyl group which may have a substituent, and a and b each represent 1 or 2.

In the resin according to the present invention, an acid-decomposable group may be incorporated into the above described —C(=O)—X-A'-$R_{17}'$ or as a substituent for Z' in formula (II-AB).

The acid-decomposable group includes a group represented by the following formula:

—C(=O)—X$_1$—R$_0$

In the formula, $R_0$ represents a tertiary alkyl group, for example, tert-butyl or tert-amyl group, an isobornyl group, an 1-alkoxyethyl group, for example, 1-ethoxyethyl, 1-butoxyethyl, 1-isobutoxyethyl or 1-cyclohexyloxyethyl group, an alkoxymethyl group, for example, 1-metoxymethyl or 1-ethoxymethyl group, a 3-oxoalkyl group, a tetrahydropyranyl group, a tetrahydrofuryl group, a trialkylsilyl ester group, a 3-oxocyclohexyl ester group, a 2-methyl-2-adamantyl group or a mevalonic lactone residue, and $X_1$ has the same meaning as X defined above.

The halogen atom for each of $R_{13}'$ or $R_{16}'$ includes, for example, chlorine, bromine, fluorine and iodine atoms.

The alkyl group for each of $R_5$, $R_6$ and $R_{13}'$ to $R_{16}'$ includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

The cyclic hydrocarbon group for each of $R_5$, $R_6$ and $R_{13}'$ to $R_{16}'$ includes a cyclic alkyl group and a bridged hydrocarbon moiety, for example, cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl or tetracyclododecanyl group.

The ring formed by combining at least two of $R_{13}'$ to $R_{16}'$ includes a ring having from 5 to 12 carbon atoms, for example, cyclopentene, cyclohexene, cycloheptane or cyclooctane ring.

The alkoxy group for $R_{17}'$ includes an alkoxy group having from 1 to 4 carbon atoms, for example, methoxy, ethoxy, propoxy or butoxy group.

Examples of the substituent for the alkyl group, cyclic hydrocarbon group or alkoxy group described above include a hydroxy group, a halogen atom, a carboxy group, an alkoxy group, an acyl group, a cyano group, an acyloxy group, an alkyl group and a cyclic hydrocarbon group. The halogen atom includes, for example, chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl and acetyl groups. The acyloxy group includes, for example, an acetoxy group.

The alkyl group and cyclic hydrocarbon group include those described above.

The divalent linkage group for A' includes a single bond, an alkylene group, a substituted alkylene group, an ether group, a thioether group, a carbonyl group, an ester group, an amido group, a sulfonamido group, a urethane group, a urea group and a combination of two or more thereof.

Examples of the alkylene group or substituted alkylene group for A' include a group represented by the following formula:

—[C(R$_a$)(R$_b$)]$_r$—

In the formula, $R_a$ and $R_b$, which may be the same or different, each represent a hydrogen atom, an alkyl group, a substituted alkyl group, a halogen atom, a hydroxy group or an alkoxy group, and r represents an integer of from 1 to 10.

The alkyl group includes preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

In the resin of Component (B) according to the present invention, the acid-decomposable group may be incorporated into at least one repeating unit selected from the repeating unit having a partial structure including an alicyclic hydrocarbon represented by formula (pI), (pII), (pIII), (pIV), (pV) or (pVI), the repeating unit represented by formula (II-AB), and a repeating unit of a copolymerization component described hereinafter.

Various atoms and groups represented by any one of $R_{13}'$ to $R_{16}'$ in formula (II-A) or (II-B) constitute substituents for the atomic group necessary for forming an alicyclic structure or bridged alicyclic structure represented by Z' in formula (II-AB).

Specific examples of the repeating unit represented by formula (II-A) or (II-B) are set forth below as [II-1] to [II-175], but the present invention should not be construed as being limited thereto.

[II-1]
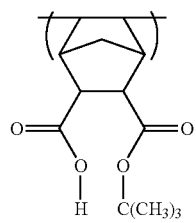

[II-2]
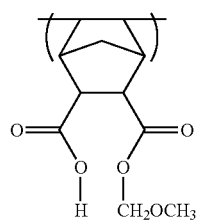

[II-3]
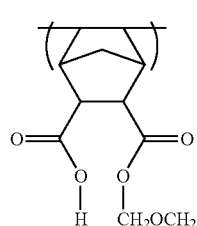

[II-4]
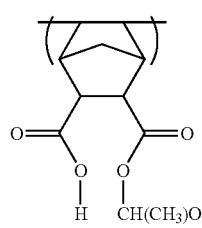

[II-5]
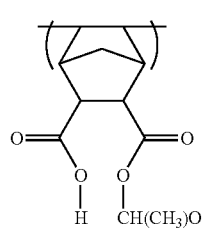

[II-6]
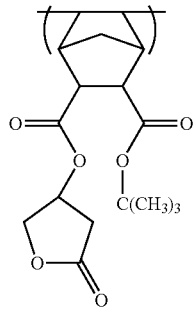

[II-7]
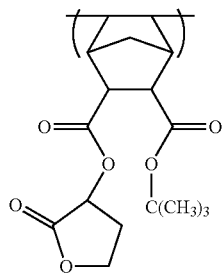

[II-8]
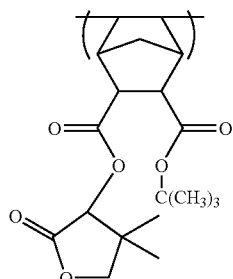

[II-9]
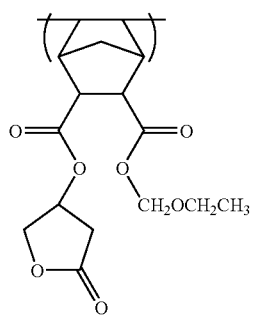

[II-10]
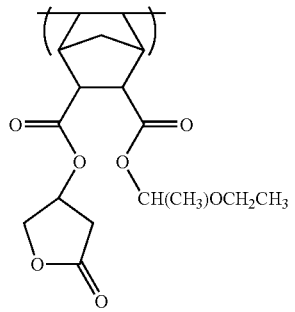

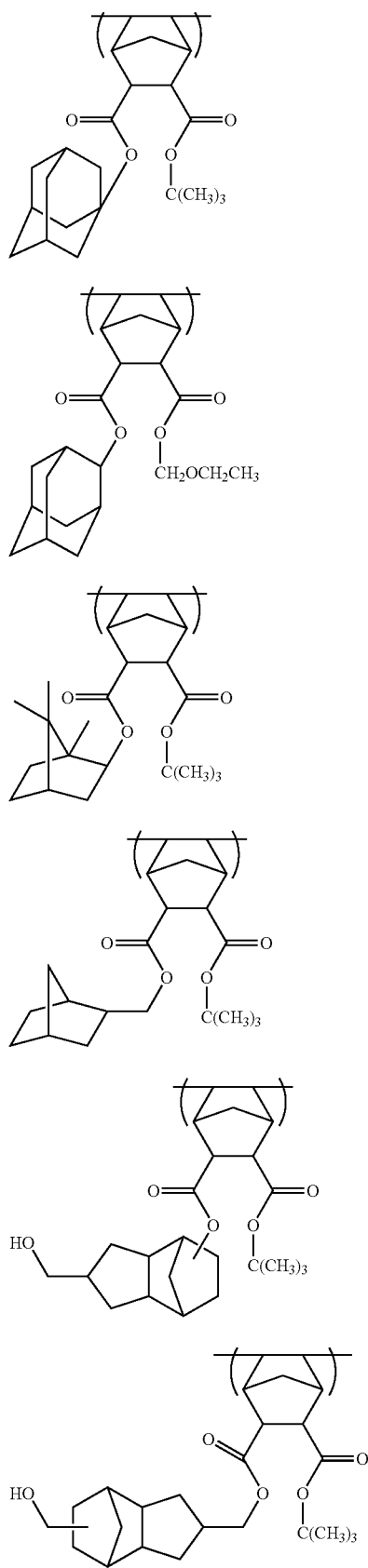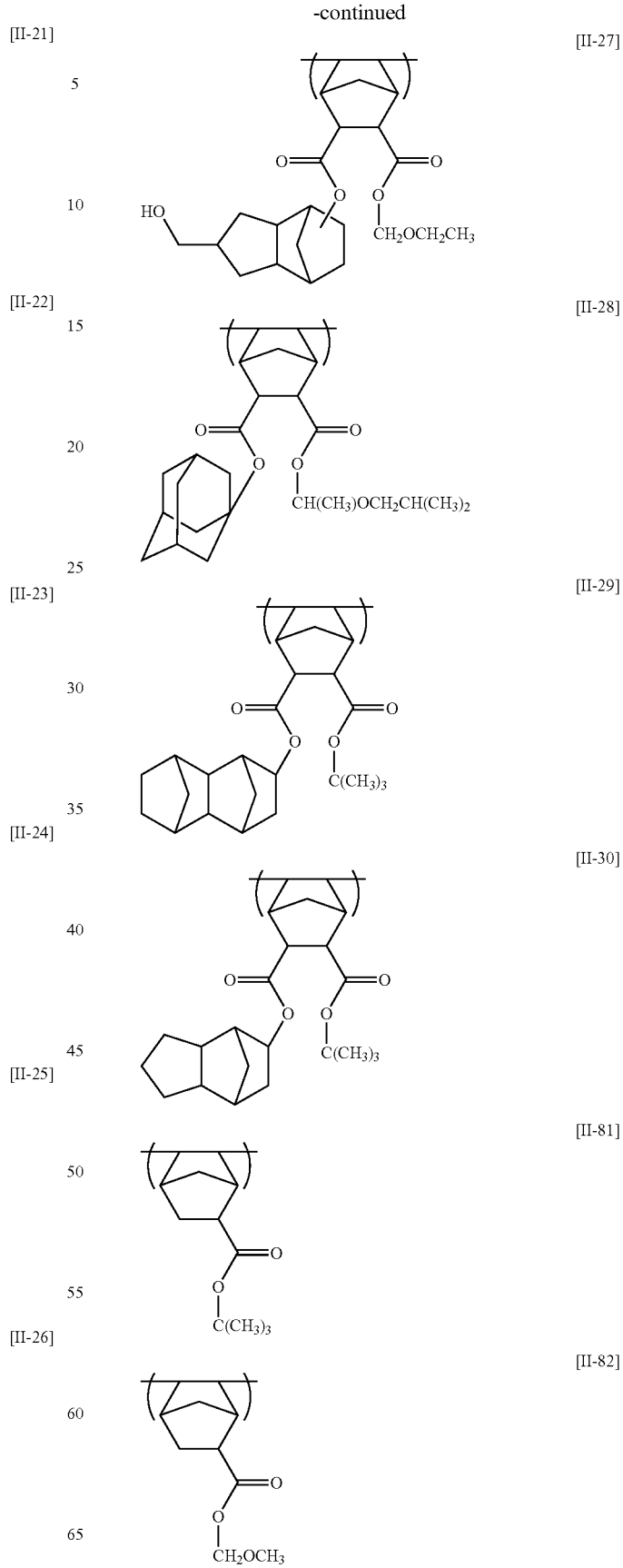

-continued
[II-83]
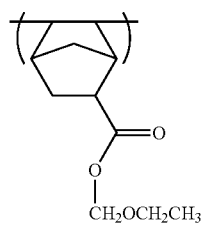
CH₂OCH₂CH₃
[II-84]
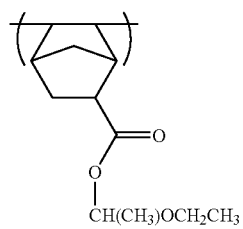
CH(CH₃)OCH₂CH₃
[II-85]
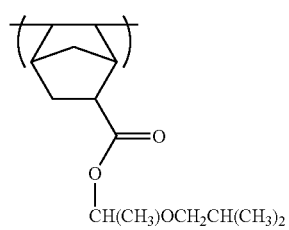
CH(CH₃)OCH₂CH(CH₃)₂
[II-86]
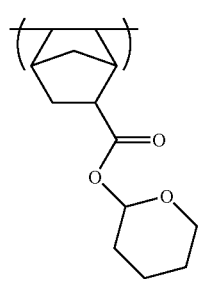
[II-87]
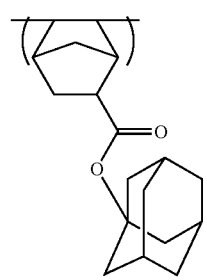
[II-88]
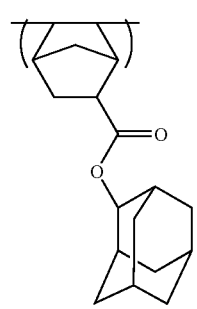
-continued
[II-89]
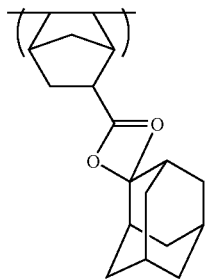
[II-90]
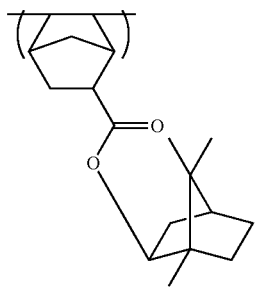
[II-91]
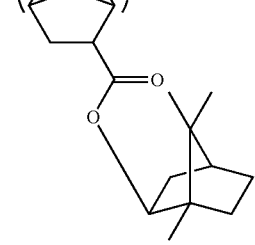
[II-92]
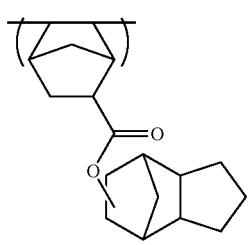
[II-93]
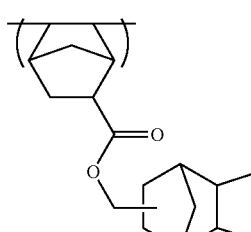
OH
[II-94]
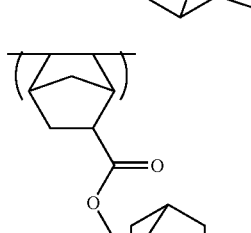
COOH

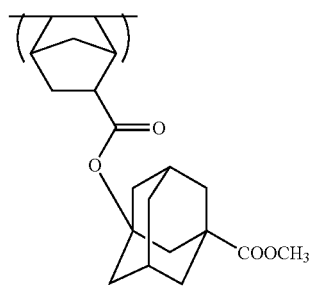
[II-95]
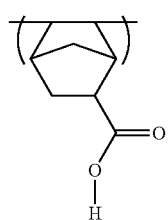
[II-96]
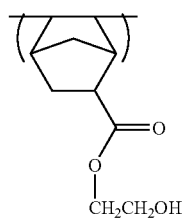
[II-97]
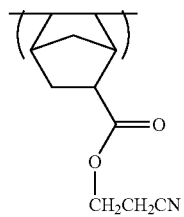
[II-98]
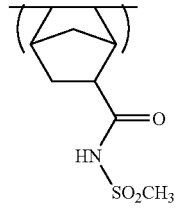
[II-99]
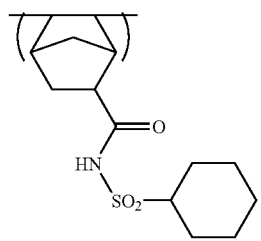
[II-100]
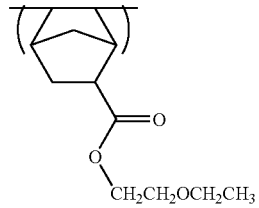
[II-101]
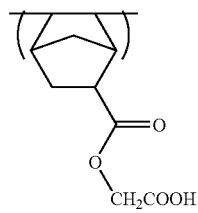
[II-102]
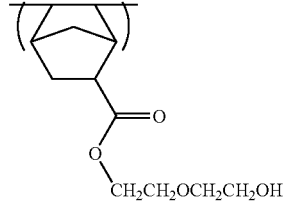
[II-103]
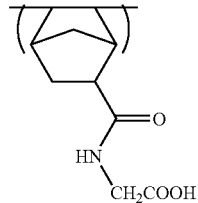
[II-104]
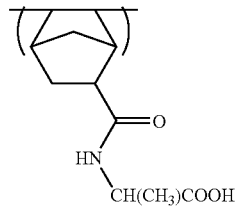
[II-105]
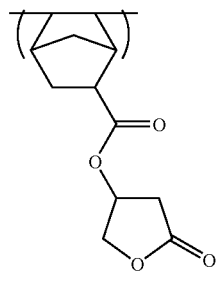
[II-106]

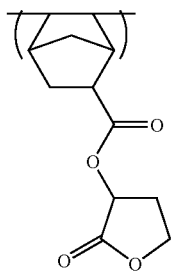
[II-107]
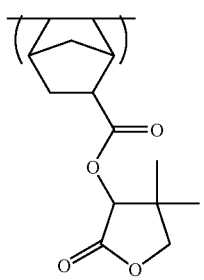
[II-108]
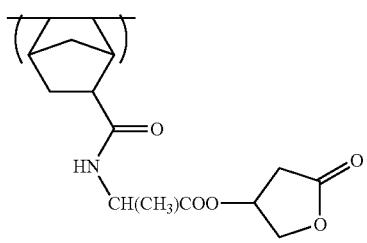
[II-109]
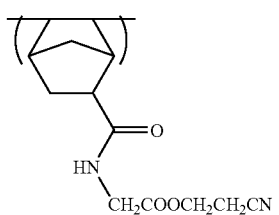
[II-110]
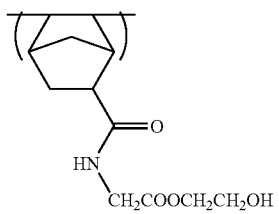
[II-111]
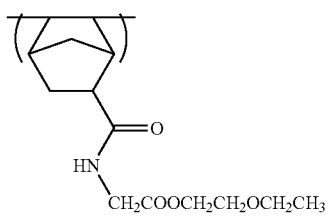
[II-112]
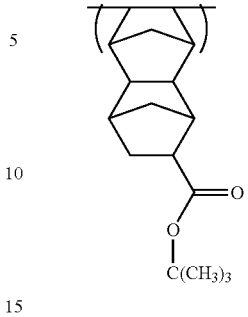
[II-113]
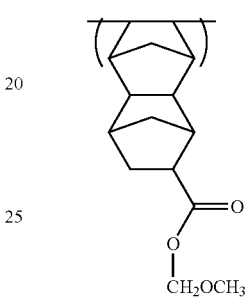
[II-114]
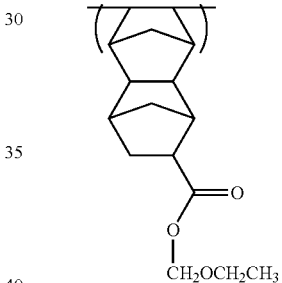
[II-115]
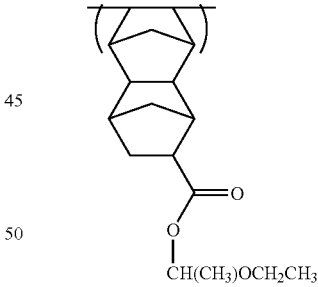
[II-116]
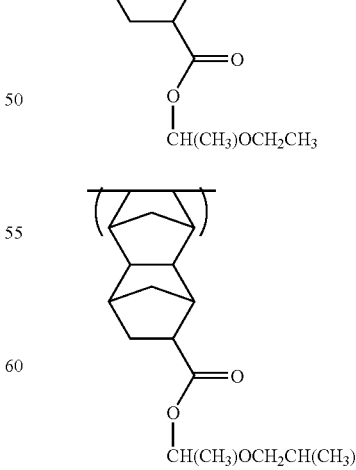
[II-117]

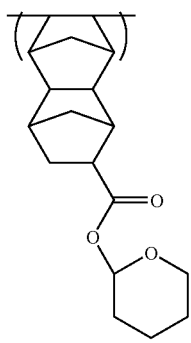
[II-118]
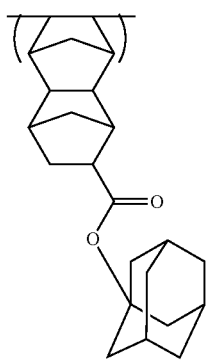
[II-119]
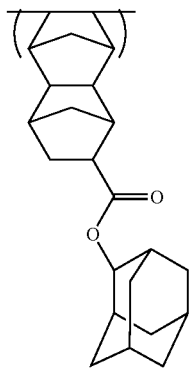
[II-120]
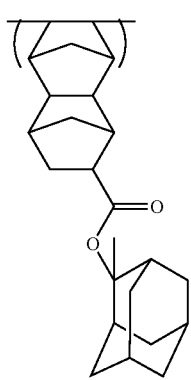
[II-121]
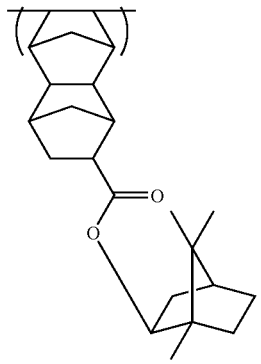
[II-122]
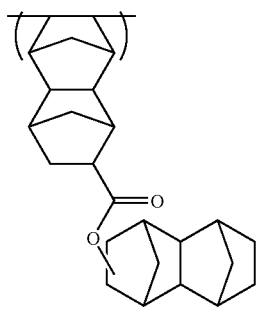
[II-123]
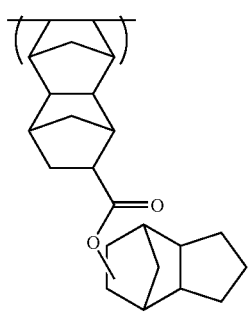
[II-124]
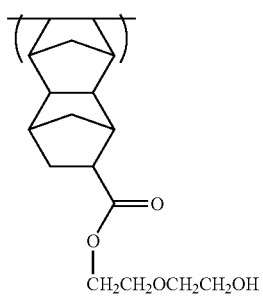
[II-135]
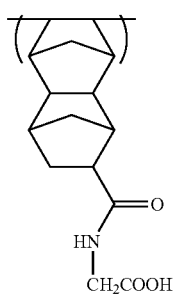
[II-136]

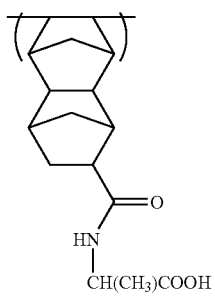 [II-137]
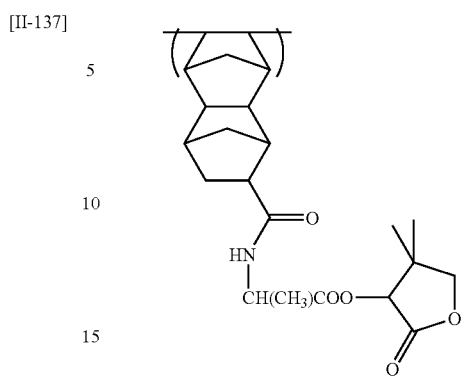 [II-141]
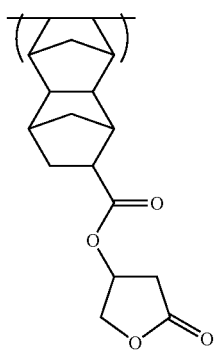 [II-138]
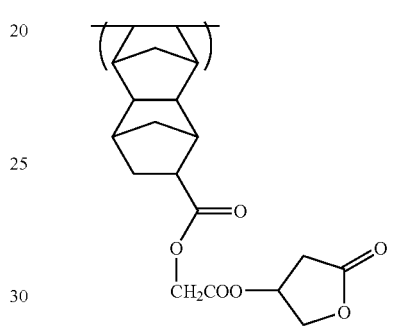 [II-142]
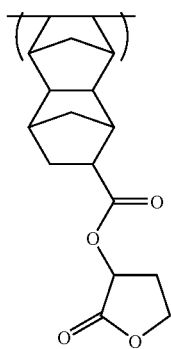 [II-139]
[II-143]
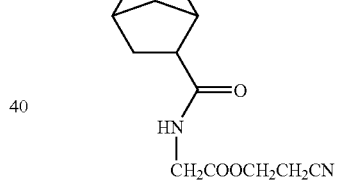
[II-144]
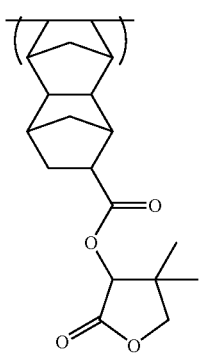 [II-140]
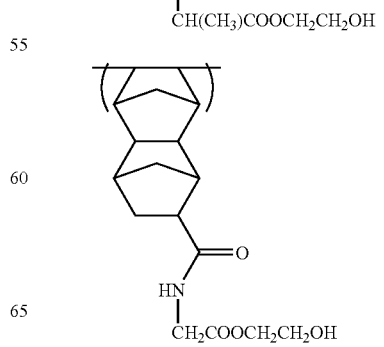 [II-145]

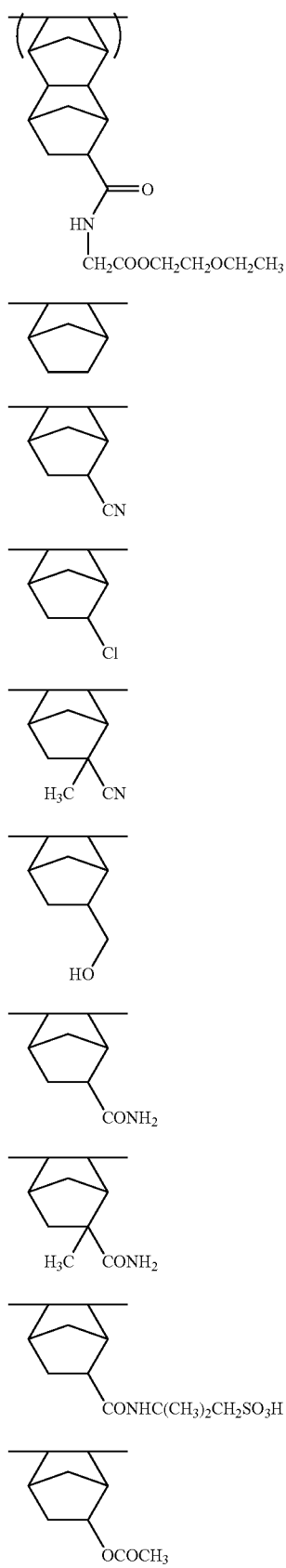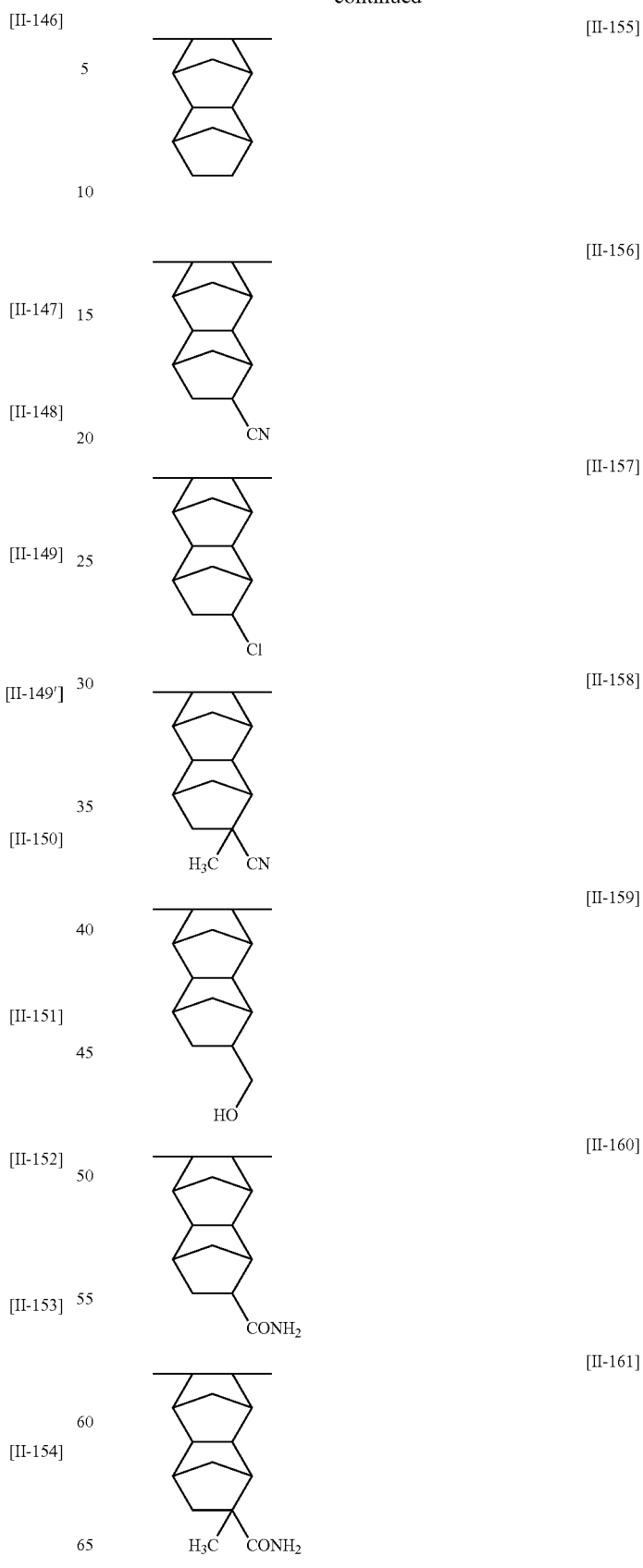

-continued
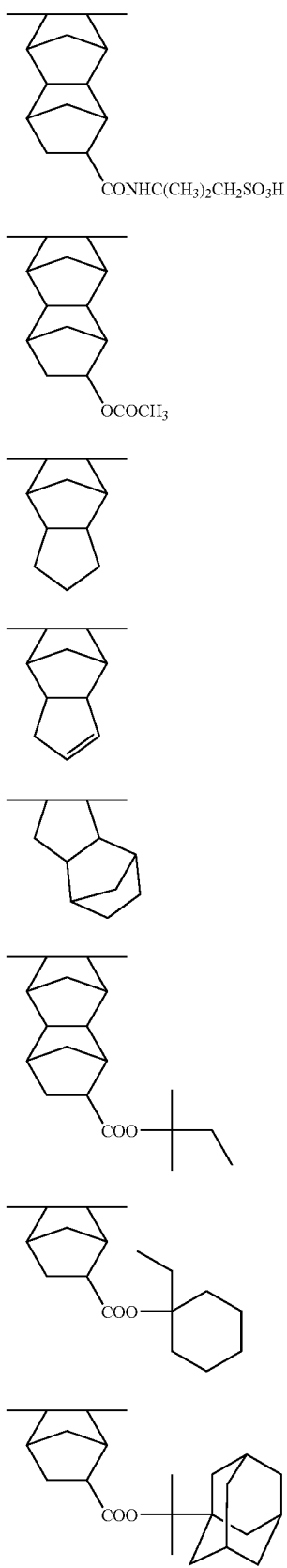
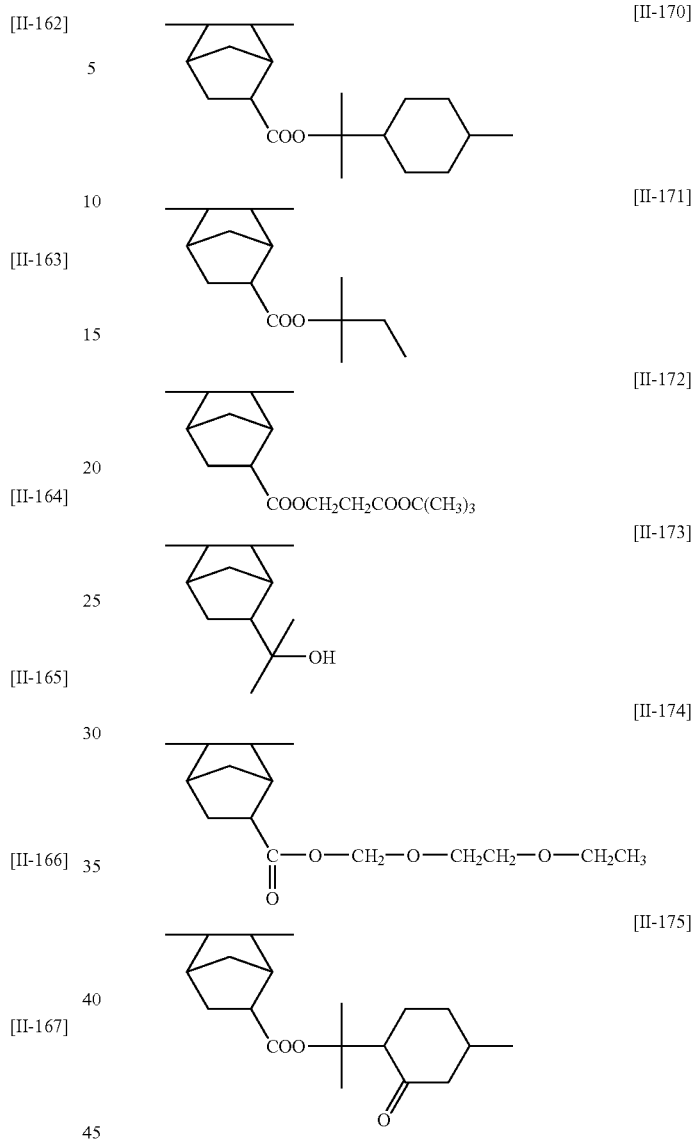
The acid-decomposable resin of Component (B) according to the present invention may further contain a repeating unit having a lactone structure represented by the following formula (IV):
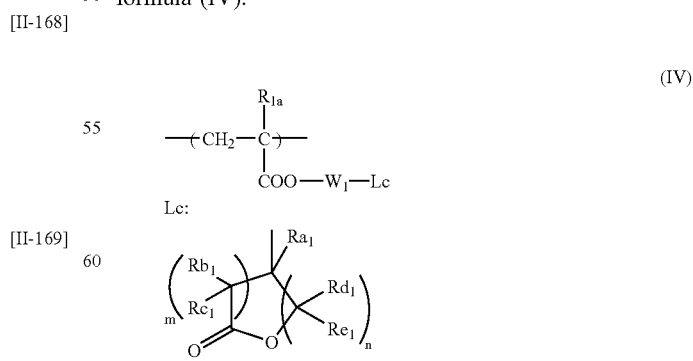
In formula (IV), $R_{1a}$ represents a hydrogen atom or a methyl group.

W₁ represents a single bond, an alkylene group, an ether group, a thioether group, a carbonyl group, an ester group or a combination of two or more of thereof.

$R_{a1}$, $R_{b1}$, $R_{c1}$, $R_{d1}$ and $R_{e1}$ each independently represent a hydrogen atom or an alkyl group having from 1 to 4 carbon atoms. m and n each independently represent an integer of from 0 to 3, provided that the sum total of m and n is from 2 to 6.

The alkyl group having from 1 to 4 carbon atoms represented by $R_{a1}$, $R_{b1}$, $R_{c1}$, $R_{d1}$ or $R_{e1}$ includes, for example, methyl, ethyl, propyl, isopropyl, n-butyl, isobutyl, sec-butyl and tert-butyl groups.

The alkylene group represented by $W_1$ in formula (IV) includes a group represented by the following formula:

—[C(Rf)(Rg)]$_{r_1}$—

In the above formula, Rf and Rg, which may be the same or different, each represent a hydrogen atom, an alkyl group, a substituted alkyl group, a halogen atom, a hydroxy group or an alkoxy group, and $r_1$ represents an integer of from 1 to 10.

The alkyl group is preferably a lower alkyl group, for example, methyl, ethyl, propyl, isopropyl or butyl group, more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

Examples of further substituent for the alkyl group include a carboxy group, an acyloxy group, a cyano group, an alkyl group, a substituted alkyl group, a halogen atom, a hydroxy group, an alkoxy group, a substituted alkoxy group, an acetylamido group, an alkoxycarbonyl group and an acyl group.

The alkyl group includes a lower alkyl group, for example, methyl, ethyl, propyl, isopropyl, butyl, cyclopropyl, cyclobutyl or cyclopentyl group. A substituent for the substituted alkyl group includes, for example, a hydroxy group, a halogen atom and an alkoxy group. A substituent for the substituted alkoxy group includes, for example, an alkoxy group. The alkoxy group includes an alkoxy group having from 1 to 4 carbon atoms, for example, methoxy, ethoxy, propoxy or butoxy group. The acyloxy group includes, for example, an acetoxy group. The halogen atom includes, for example, chlorine, bromine, fluorine and iodine atoms.

Specific examples of the repeating unit represented by formula (IV) are set forth below, but the present invention should not be construed as being limited thereto.

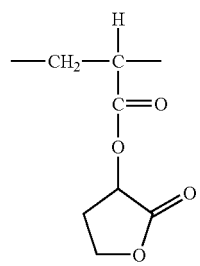

(IV-1)

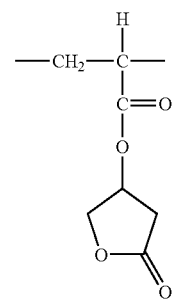

(IV-2)

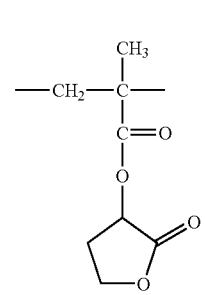

(IV-3)

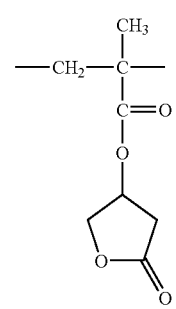

(IV-4)

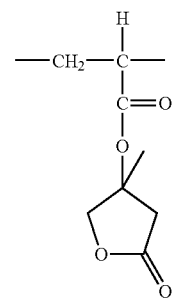

(IV-5)

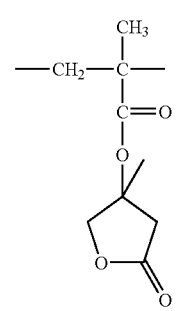

(IV-6)

-continued
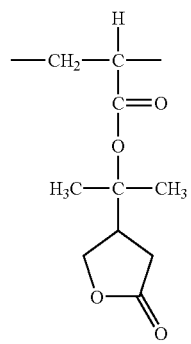
(IV-7)
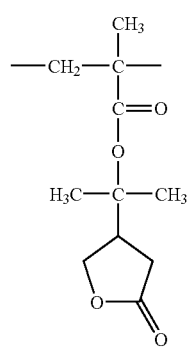
(IV-8)
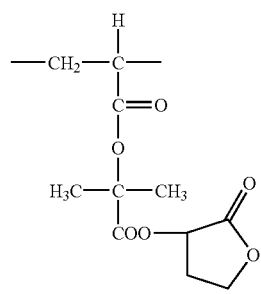
(IV-9)
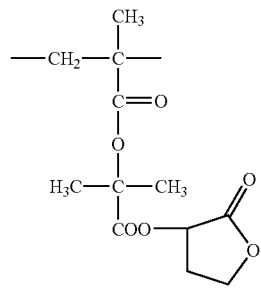
(IV-10)
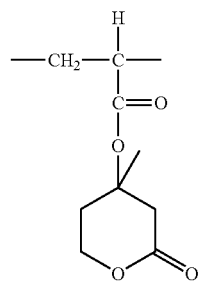
(IV-11)
-continued
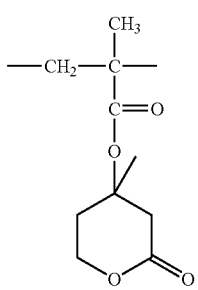
(IV-12)
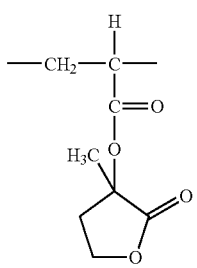
(IV-13)
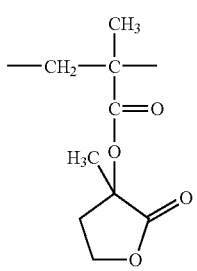
(IV-14)
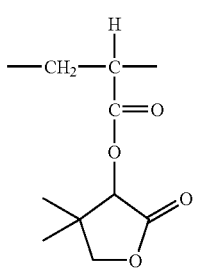
(IV-15)
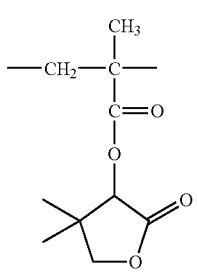
(IV-16)

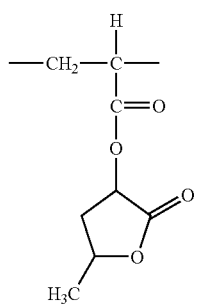 (IV-17)
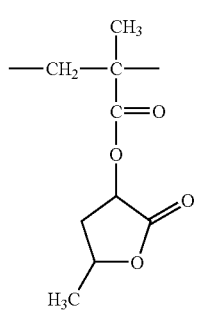 (IV-18)
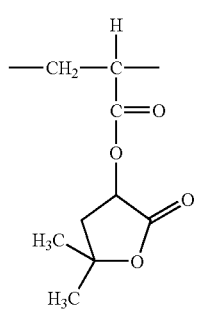 (IV-19)
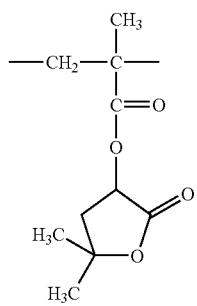 (IV-20)
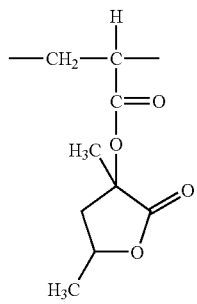 (IV-21)
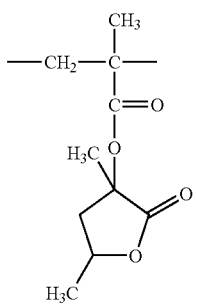 (IV-22)
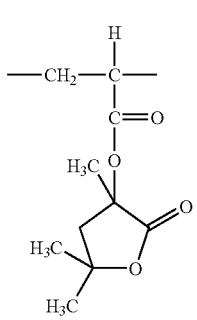 (IV-23)
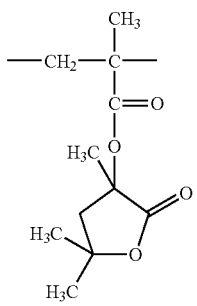 (IV-24)
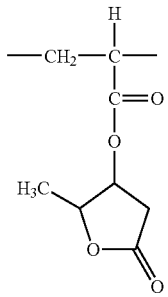 (IV-25)
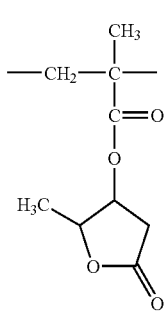 (IV-26)

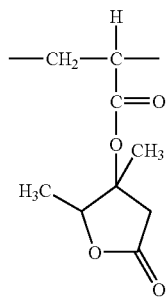 (IV-27)
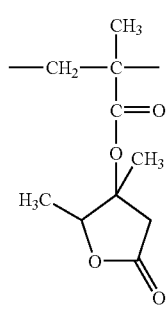 (IV-28)
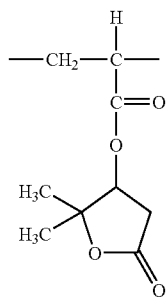 (IV-29)
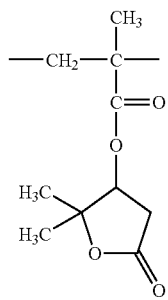 (IV-30)
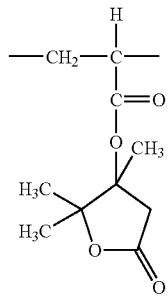 (IV-31)
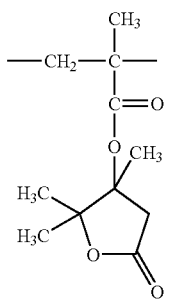 (IV-32)
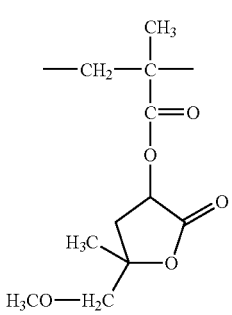 (IV-33)
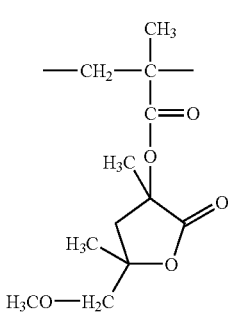 (IV-34)
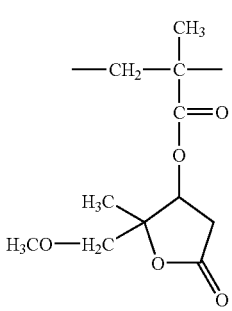 (IV-35)
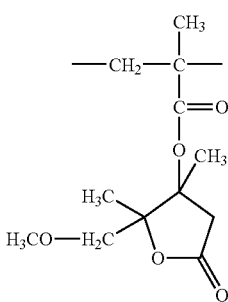 (IV-36)

Of the specific examples of the repeating unit represented by formula (IV), (IV-17) to (IV-36) are preferred in view of more improved exposure margin.

Further, the repeating units represented by formula (IV) wherein an acrylate structure is included are preferred from a standpoint of good edge roughness.

The resin of Component (B) according to the present invention may contain a repeating unit having a group represented by any one of the following formulae (V-1) to (V-5):

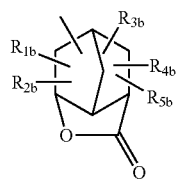
(V-1)

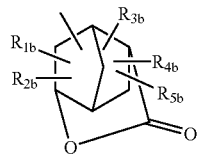
(V-2)

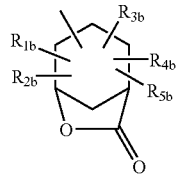
(V-3)

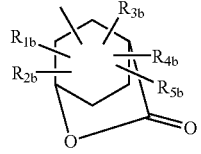
(V-4)

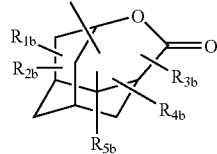
(V-5)

In formulae (V-1) to (V-5), $R_{1b}$, $R_{2b}$, $R_{3b}$, $R_{4b}$ and $R_{5b}$ each independently represent a hydrogen atom, an alkyl group which may be substituted, a cycloalkyl group which may be substituted, an alkoxy group which may be substituted, an alkoxycarbonyl group which may be substituted, an alkylsulfonylimino group which may be substituted or an alkenyl group which may be substituted, or two of $R_{1b}$, $R_{2b}$, $R_{3b}$, $R_{4b}$ and $R_{5b}$ may be combined with each other to form a ring.

The alkyl group or alkyl moiety in the alkoxy group, alkoxycarbonyl group or alkylsulfonylimino group represented by any one of $R_{1b}$, $R_{2b}$, $R_{3b}$, $R_{4b}$ and $R_{5b}$ in formulae (V-1) to (V-5) includes a straight chain or branched alkyl group which may be substituted.

The straight chain or branched alkyl group includes preferably a straight chain or branched alkyl group having from 1 to 12 carbon atoms, more preferably a straight chain or branched alkyl group having from 1 to 10 carbon atoms, and still more preferably methyl, ethyl, propyl, isopropyl, n-butyl, isobutyl, sec-butyl, tert-butyl, pentyl, hexyl, heptyl, octyl, nonyl and decyl groups.

The cycloalkyl group represented by any one of $R_{1b}$, $R_{2b}$, $R_{3b}$, $R_{4b}$ and $R_{5b}$ in formulae (V-1) to (V-5) includes preferably a cycloalkyl group having from 3 to 8 carbon atoms, for example, cyclopropyl, cyclopentyl, cyclohexyl, cycloheptyl or cyclooctyl group.

The alkenyl group represented by any one of $R_{1b}$, $R_{2b}$, $R_{3b}$, $R_{4b}$ and $R_{5b}$ in formulae (V-1) to (V-5) includes preferably an alkenyl group having from 2 to 6 carbon atoms, for example, vinyl, propenyl, butenyl or hexenyl group.

The ring formed by combining two of $R_{1b}$, $R_{2b}$, $R_{3b}$, $R_{4b}$ and $R_{5b}$ in any one of formulae (V-1) to (V-5) includes preferably a 3-membered to 8-membered ring, for example, cyclopropane, cyclobutane, cyclopentane, cyclohexane or cyclooctane ring.

The group represented by $R_{1b}$, $R_{2b}$, $R_{3b}$, $R_{4b}$ and $R_{5b}$ in formulae (V-1) to (V-5) can be bonded to any one of the carbon atoms constituting the cyclic structure.

Preferred examples of the substituent for the alkyl group, cycloalkyl group, alkoxy group, alkoxycarbonyl group, alkylsulfonylimino group or alkenyl group described above include an alkoxy group having from 1 to 4 carbon atoms, a halogen atom (e.g., fluorine, chlorine, bromine or iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of repeating unit having the group represented by any one of formulae (V-1) to (V-5) include a repeating unit represented by formula (II-A): or (II-B) described above wherein one of $R_{13}'$ to $R_{16}'$ has the group represented by any one of formulae (V-1) to (V-5), for example, $R_5$ of —COOR$_5$ is the group represented by any one of formulae (V-1) to (V-5), and a repeating unit represented by formula (AI) shown below.

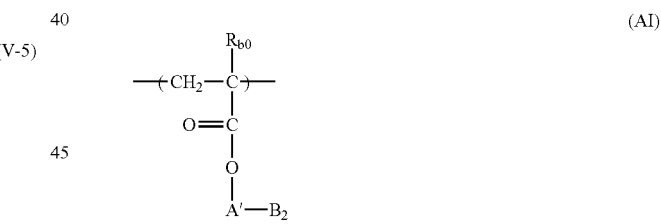
(AI)

In formula (AI), $R_{b0}$ represents a hydrogen atom, a halogen atom, a substituted or unsubstituted alkyl group having from 1 to 4 carbon atoms. Preferred examples of the substituent for the alkyl group represented by $R_{b0}$ include the preferred examples of substituent for the alkyl group represented by $R_{1b}$ in any one of formulae (V-1) to (V-5) described above.

The halogen atom represented by $R_{b0}$ includes fluorine, chlorine, bromine and iodine atoms. $R_{b0}$ is preferably a hydrogen atom.

A' in formula (AI) represents a single bond, an ether group, an ester group, a carbonyl group, an alkylene group or a divalent group formed by combination of these groups.

$B_2$ in formula (AI) represents the group represented by any one of formulae (V-1) to (V-5).

Examples of the divalent group formed by combination of the groups represented by A' include groups represented by the following formulae:

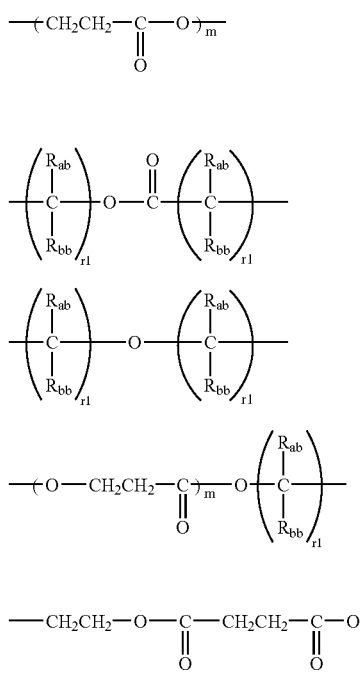

In the above-described formulae, $R_{ab}$ and $R_{bb}$, which may be the same or different, each represent a hydrogen atom, an alkyl group, a substituted alkyl group, a halogen atom, a hydroxy group or an alkoxy group.

The alkyl group represented by any one of $R_{ab}$ and $R_{bb}$ is preferably a lower alkyl group, for example, methyl, ethyl, propyl, isopropyl or butyl group, and more preferably methyl, ethyl, propyl or isopropyl group. A substituent for the substituted alkyl group includes a hydroxy group, a halogen atom and an alkoxy group having from 1 to 4 carbon atoms.

The alkoxy group includes an alkoxy group having from 1 to 4 carbon atoms, for example, methoxy, ethoxy, propoxy or butoxy group. The halogen atom includes, for example, chlorine, bromine, fluorine and iodine atoms. r1 represents an integer of from 1 to 10, and preferably from 1 to 4. m represents an integer of from 1 to 3, and preferably 1 or 2.

Specific examples of the repeating unit represented by formula (AI) are set forth below, but the present invention should not be construed as being limited thereto.

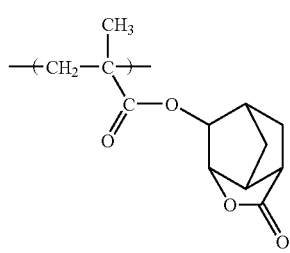 (Ib-1)

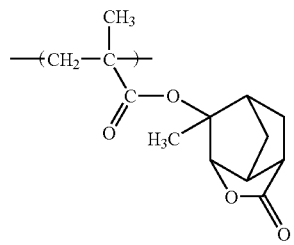 (Ib-2)

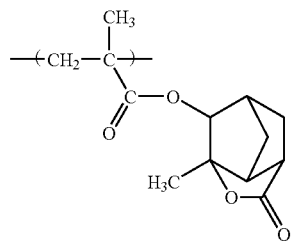 (Ib-3)

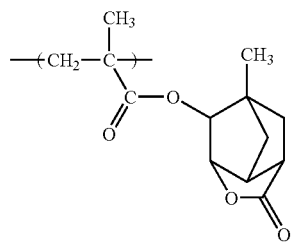 (Ib-4)

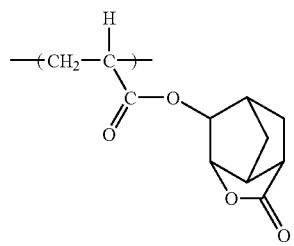 (Ib-5)

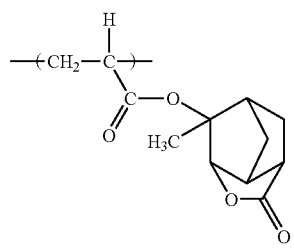 (Ib-6)

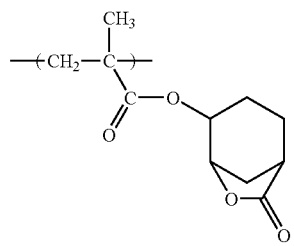 (Ib-7)

(Ib-8)
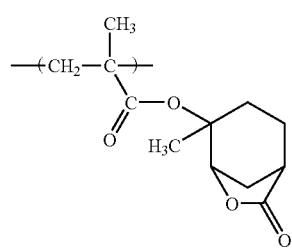
(Ib-9)
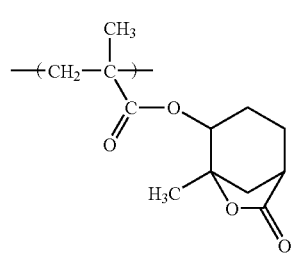
(Ib-10)
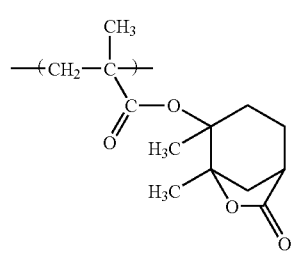
(Ib-11)
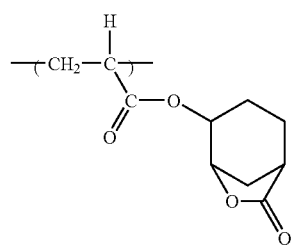
(Ib-12)
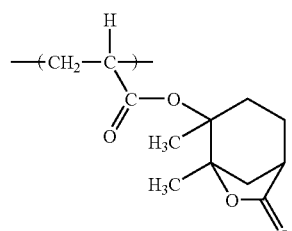
(Ib-13)
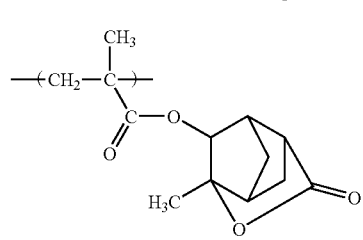
(Ib-14)
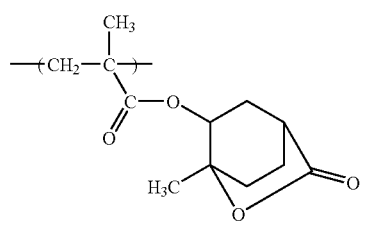
(Ib-15)
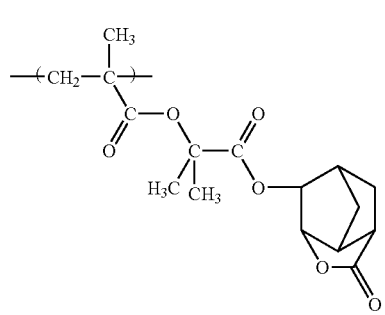
(Ib-16)
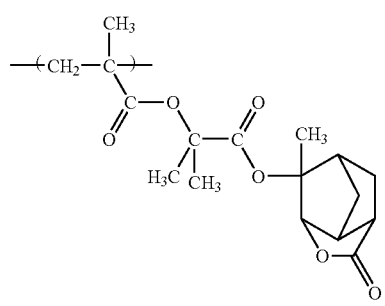
(Ib-17)
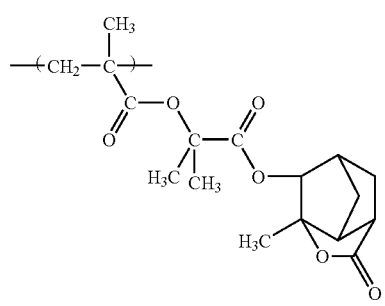
(Ib-18)
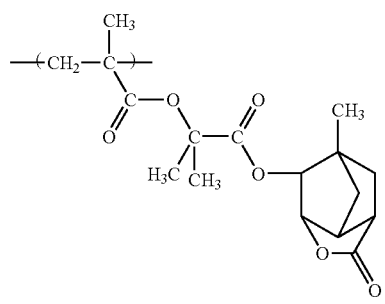

(Ib-19)
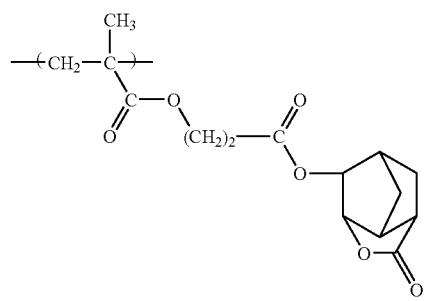
(Ib-20)
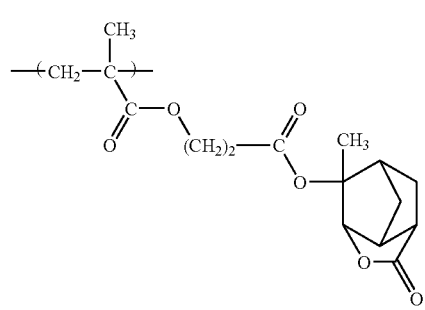
(Ib-21)
(Ib-22)
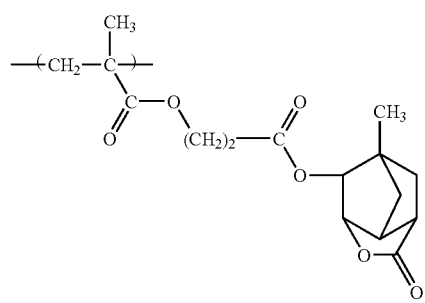
(Ib-23)
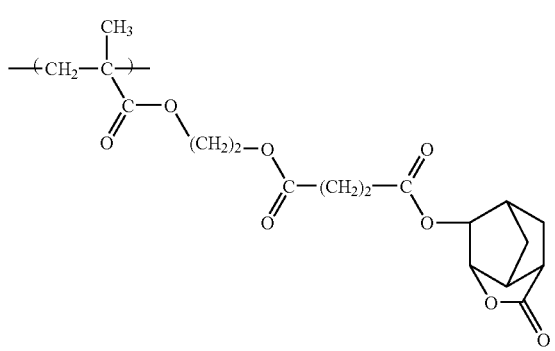
(Ib-27)
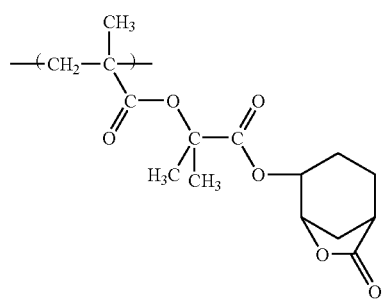
(Ib-28)
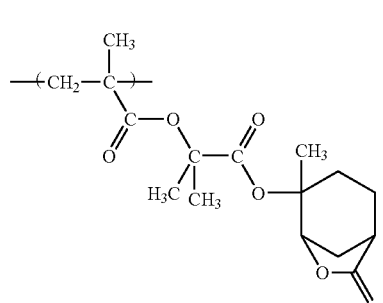
(Ib-29)
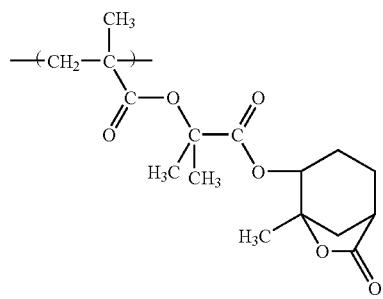
(Ib-30)
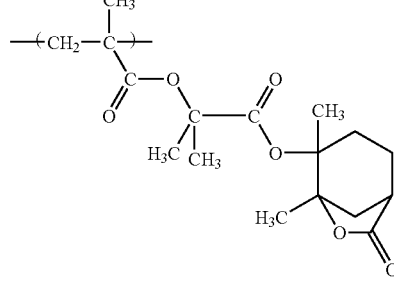
(Ib-31)
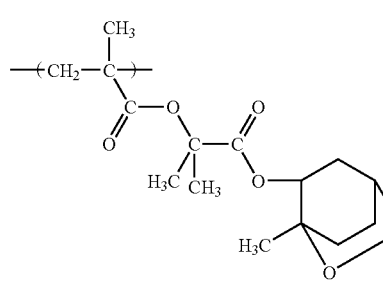

(Ib-32)
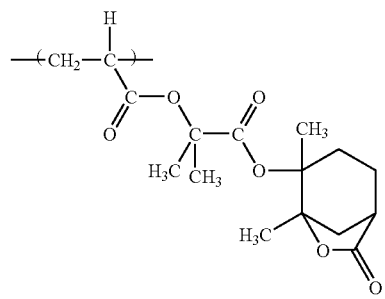
(Ib-33)
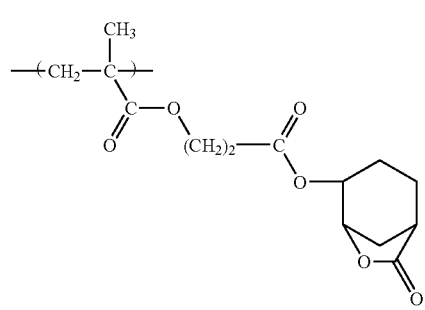
(Ib-34)
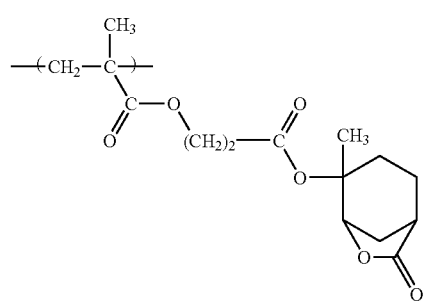
(Ib-35)
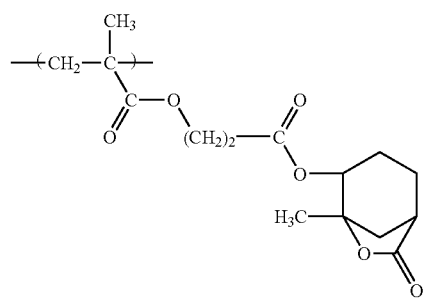
(Ib-36)
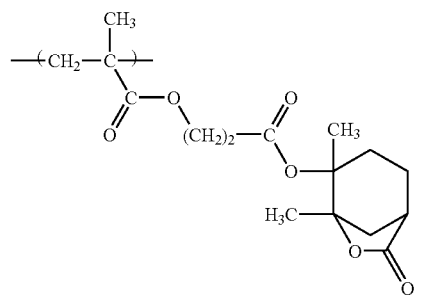
(Ib-37)
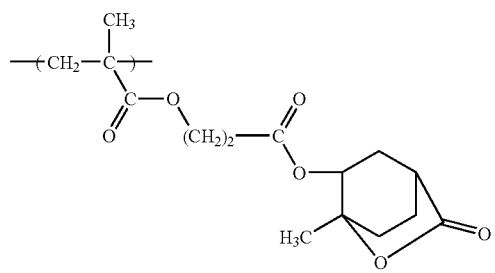
(Ib-38)
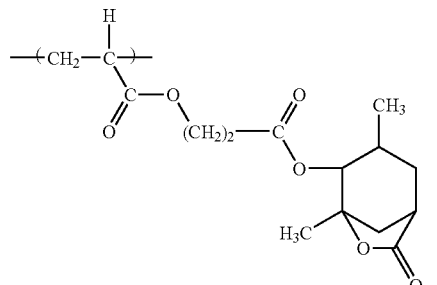
(Ib-39)
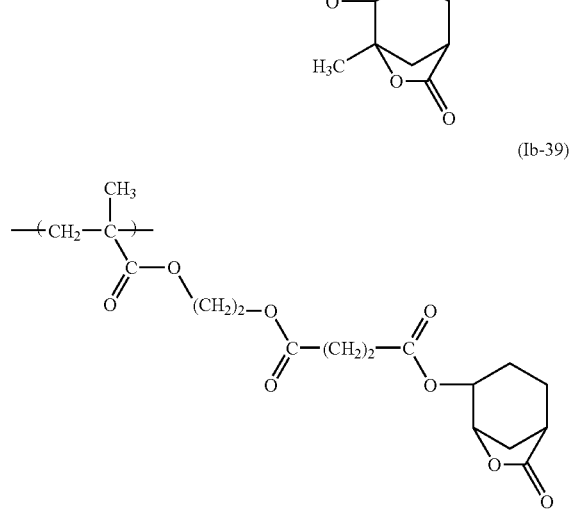
(Ib-40)
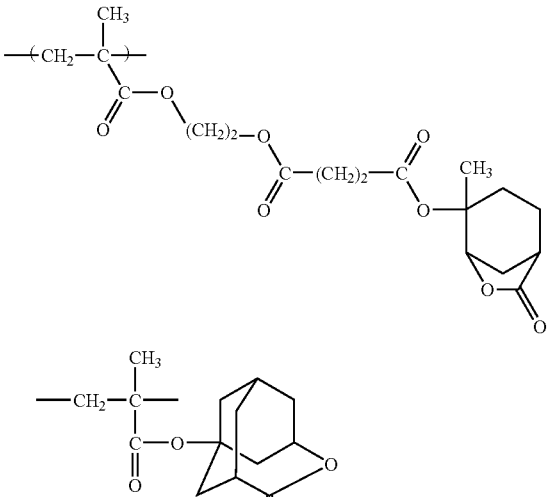

-continued
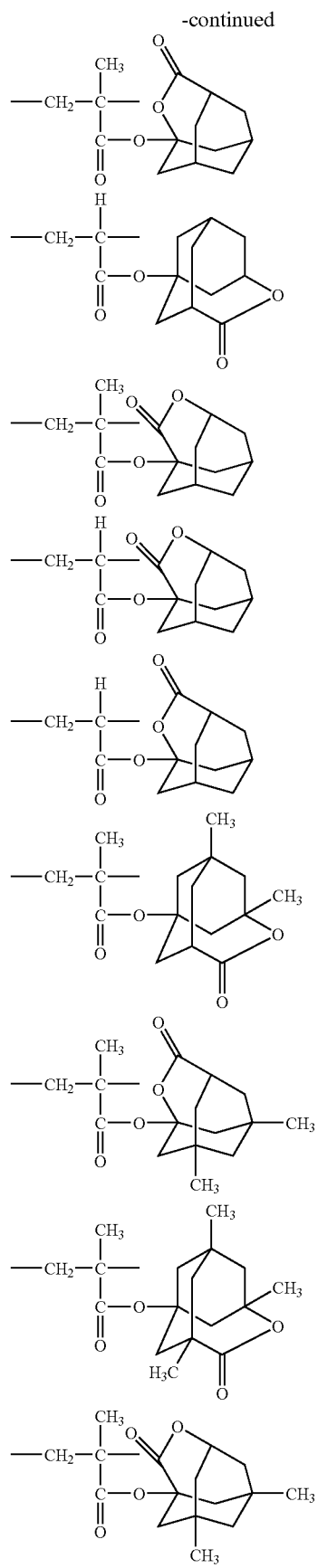
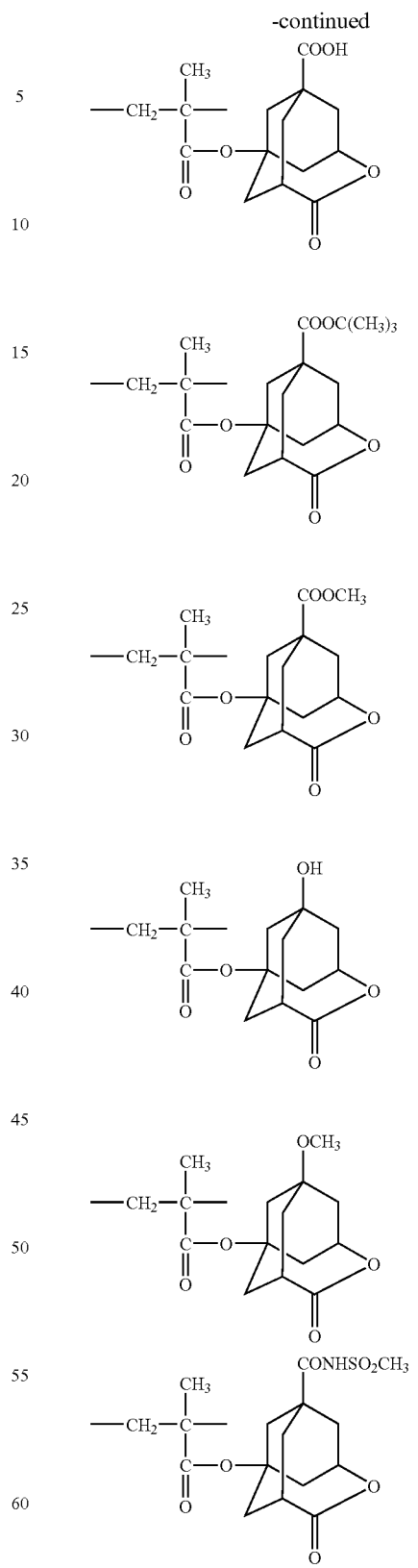
The resin of Component (B) according to the present invention may further contain a repeating unit having a group represented by the following formula (VII):

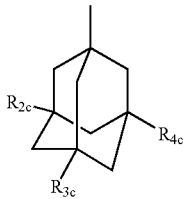
(VII)

In formula (VII), $R_{2c}$, $R_{3c}$ and $R_{4c}$ each represent a hydrogen atom or a hydroxy group, provided that at least one of $R_{2c}$, $R_{3c}$ and $R_{4c}$ represents a hydroxy group.

The group represented by formula (VII) is preferably a dihydroxy body or a monohydroxy body, and more preferably a dihydroxy body.

Examples of the repeating unit having the group represented by formula (VII) include a repeating unit represented by formula (II-A) or (II-B) described above wherein one of $R_{13}'$ to $R_{16}'$ has the group represented by formula (VII), for example, $R_5$ of —COOR$_5$ is the group represented by formula (VII), and a repeating unit represented by the following formula (AII):

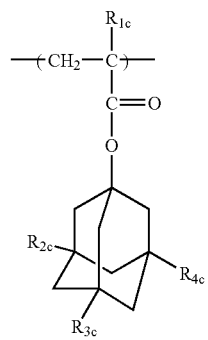
(AII)

In formula (AII), $R_{1c}$ represents a hydrogen-atom or a methyl group, and $R_{2c}$, $R_{3c}$, and $R_{4c}$ each independently represents a hydrogen atom or a hydroxy group, provided that at least one of $R_{2c}$, $R_{3c}$ and $R_{4c}$, represents a hydroxy group.

Specific examples of the repeating unit represented by formula (AII) are set forth below, but the present invention should not be construed as being limited thereto.

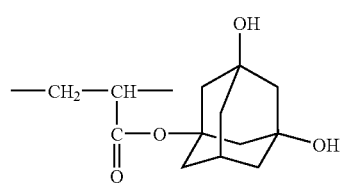
(1)

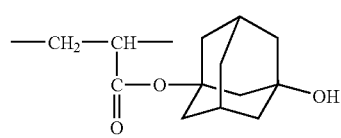
(2)

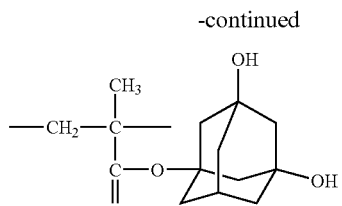
(3)

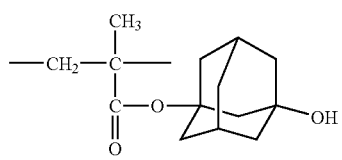
(4)

The resin of Component (B) according to the present invention may further contain a repeating unit having a group represented by the following formula (VIII):

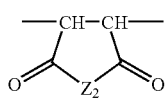
(VIII)

In formula (VIII), $Z_2$ represents —O— or —N($R_{41}$)—, $R_{41}$ represents a hydrogen atom, a hydroxy group, an alkyl group, a haloalkyl group or —O—SO$_2$—$R_{42}$, and $R_{42}$ represents an alkyl group, a haloakyl group, a cycloalkyl group or a camphor residue.

Examples of the alkyl group represented by $R_{41}$ or $R_{42}$ include preferably a straight chain or branched alkyl group having form 1 to 10 carbon atoms, more preferably a straight chain or branched alkyl group having form 1 to 6 carbon atoms, and still more preferably methyl, ethyl, propyl, isopropyl, n-butyl, isobutyl, sec-butyl and tert-butyl groups.

Examples of the haloalkyl group represented by $R_{41}$ or $R_{42}$ include trifluoromethyl, nonafluorobutyl, pentadecafluorooctyl and trichloromethyl groups.

Examples of the cycloalkyl group represented by $R_{42}$ include cyclopentyl, cyclohexyl and cyclooctyl groups.

The alkyl group and haloalkyl group represented by $R_{41}$ or $R_{42}$ and the cycloalkyl group and camphol residue represented by $R_{42}$ may have one or more substituents.

Examples of the substituent for the alkyl group, haloalkyl group, cycloalkyl group and camphol residue include a hydroxy group, a carboxy group, a cyano group, a halogen atom (e.g., chlorine, bromine, fluorine or iodine atom), an alkoxy group (preferably an alkoxy group having from 1 to 4 carbon atoms, e.g., methoxy, ethoxy, propoxy or butoxy group), an acyl group (preferably an acyl group having from 2 to 5 carbon atoms, e.g., formyl or acetyl group), an acyloxy group (preferably an acyloxy group having from 2 to 5 carbon atoms, e.g., acetoxy group) and an aryl group (preferably an aryl group having from 6 to 14 carbon atoms, e.g., phenyl group).

Specific examples of the repeating unit represented by formula (VIII) are set forth below as formulae [I'-1] to [I'-7], but the present invention should not be construed as being limited thereto.

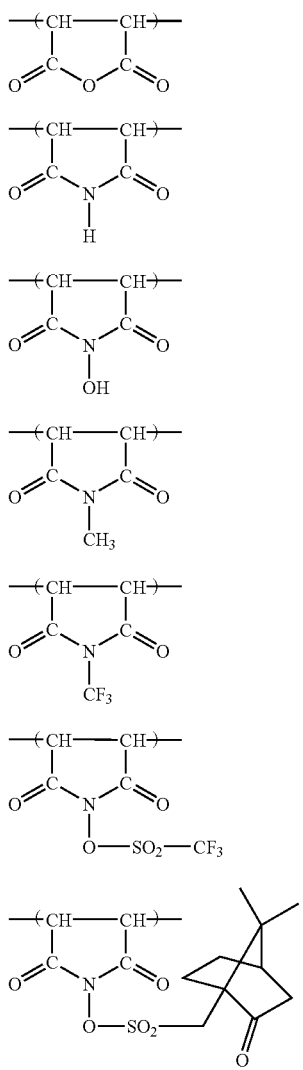

The acid-decomposable resin of Component (B) according to the present invention may contain various repeating units in addition to the repeating units described above for the purposes of adjusting dry etching resistance, standard developing solution aptitude, adhesion to substrate, resist profile, and other characteristics ordinarily required for resist, for example, resolution, heat resistance and sensitivity.

Examples of such repeating units include repeating units corresponding to monomers described below, but the present invention should not be construed as being limited thereto.

The introduction of additional repeating unit makes possible the minute control of characteristics required for the acid-decomposable resin, particularly (1) solubility in a coating solvent, (2) film forming property (glass transition temperature), (3) developing property with alkali, (4) reduction in a film thickness (hydrophilic/hydrophobic property, selection of alkali-soluble group), (5) adhesion of the unexposed area to a substrate, and (6) dry etching resistance.

Examples of such monomers include compounds having one addition-polymerizable unsaturated bond, for example, acrylates, methacrylate, acrylamides, methacrylamides, allyl compounds, vinyl ethers and vinyl esters.

In addition, any addition-polymerizable unsaturated compounds copolymerizable with monomers corresponding to the repeating units described above may be employed.

A molar ratio of each repeating unit in the acid-decomposable resin of Component (B) can be appropriately determined taking the adjustment of many factors including dry etching resistance of resist, standard developing solution aptitude, adhesion to substrate, resist profile, and other characteristics ordinarily required for resist, for example, resolution, heat resistance and sensitivity into consideration.

Preferred embodiments of the acid-decomposable resin of Component (B) according to the present invention include (1) resin (side chain type) containing a repeating unit having a partial structure including an alicyclic hydrocarbon represented by formula (pI), (pII), (pIII), (pIV), (pV) or (pVI).

(2) resin (main chain type) containing a repeating unit represented by formula (II-AB). The resin of (2) includes the following resin of (3).

(3) resin (hybrid type) containing a repeating unit represented by formula (II-AB), a maleic anhydride derivative and a (meth)acrylate structure.

A content of the repeating unit having a partial structure including an alicyclic hydrocarbon represented by formula (pI), (pII), (p:II), (pIV), (pV) or (pVI) is preferably from 30 to 70% by mole, more preferably from 35 to 65% by mole, and still more preferably from 40 to 60% by mole, based on the, total repeating units in the acid-decomposable resin.

A content of the repeating unit represented by formula (II-AB) is preferably from 10 to 60% by mole, more preferably from 15 to 55% by mole, and still more preferably from 20 to 50% by mole, based on the total repeating units in the acid-decomposable resin.

A content of the repeating unit corresponding to the additional copolymerization component described above can be appropriately determined depending on the desired performance of resist. In general, the content is preferably 99% by mole or less, more preferably 90% by mole or less, and still more preferably 80% by mole or less, to the sum total of the repeating unit having a partial structure including an alicyclic hydrocarbon represented by formula (pI), (pII), (pIII), (pIV), (pV) or (pVI) and the repeating unit represented by formula (II-AB).

When the photosensitive composition of the present invention is used for ArF exposure, it is preferred that the acid-decomposable resin does not contain an aromatic group in order to ensure transparency of the ArF beam.

The acid-decomposable resin for use in the present invention can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the composition of the present invention, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to correct the resulting powder or solid, thereby obtaining the polymer. The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

A weight average molecular weight of the resin of Component (B) for use in the present invention is preferably form 1,000 to 200,000 measured by a GPC method and calculated in terms of polystyrene. It is not preferred that the weight average molecular weight of the resin is less than 1,000, since the degradation of heat resistance and dry etching resistance may occur. On the other hand, when the weight average molecular weight of the resin is more than 200,000, undesirable results, for example, the degradation of developing property and the degradation of film-forming property due to severe increase in viscosity may occur.

A content of the resin of Component (B) in the positive photosensitive composition suitable for a far ultraviolet ray of the present invention is preferably from 40 to 99.99% by weight, and more preferably from 50 to 99.97% by weight, based on the total solid content of the photosensitive composition.

<<(C) Compound that has at Least Three Hydroxy or Substituted Hydroxy Groups and at Least One Cyclic Structure>>

The positive photosensitive composition of the present invention further contains the compound that has at least three hydroxy or substituted hydroxy groups and at least one cyclic structure of Component (C).

The term "compound that has at least three hydroxy or substituted hydroxy groups and at least one cyclic structure" used herein means a compound containing a cyclic skeleton, for example, an alicyclic group, as the main skeleton or in the side chain. However, the term "cyclic structure" used in the definition does not include a cyclic structure capable of forming a cyclic ketal structure as represented by the following formula:

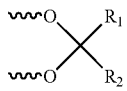

The cyclic structure includes preferably a 5-membered ring or 6-membered ring, and specifically a cyclohexane ring, a cyclopentane ring or a tetrahydrofuran or tetrahydropyran ring having an ether-oxygen atom.

The substituted hydroxy group includes a hydroxy group substituted, e.g., with an alkyl group, an aralkyl group or an aryl group, that is, an alkoxy group, an aralkyloxy group or an aryloxy group, an acid-decomposable group and an hydroxy group substituted with other group to form an ether structure.

The acid-decomposable group means a group that is decomposed by the action of an acid and specifically includes an acetal group, a ketal group, a tert-butoxycarbonyl group and a tert-butyl ester group.

Further, the acid-decomposable group may be formed by combining two hydroxy groups as described below:

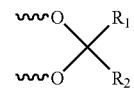

wherein $R_1$ and $R_2$ each independently represent an alkyl group, an aralkyl group or an aryl group, or $R_1$ and $R_2$ may be combined with each other to form a ring.

Two or more of the acid-decomposable groups may be present in one molecule. It is preferred that two or more acid-decomposable groups are present in one molecule, and that in such a case, at least one of the acid-decomposable groups has the following structure:

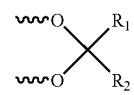

The compound of Component (C) according to the present invention must have at least three hydroxy or substituted hydroxy groups. The compound preferably has from 3 to 10 hydroxy groups, and more preferably from 4 to 8 hydroxy groups.

Although the compound of Component (C) according to the present invention may be any compounds that fulfill the above-described requirements, cyclic sugar derivatives are preferably used.

Examples of skeleton of the cyclic sugar derivative specifically include arabinose, xylose, fucose, rhamnose, galactose, glucose, fructose, fructpyranose, sorbose, mannose, allopyranose, altrose, talose, tagatose, arabinopyranoside, thioagalactopyranose, mannopyranoside, glucopyranose, glucopyranoside, mannitol, sucrose, paratinose, lactitol, lactose, malturose, maltose, maltoside, maltitol, sellobiose, turanose, trehalose, melibiose, marloriose, melezitose, raffinose, stachyose, maltotetraose, maltohexaose and cyclodextrin.

Specific examples of the cyclic sugar derivative are set forth below, but the present invention should not be construed as being limited thereto.

1

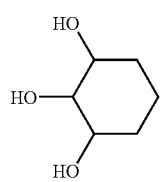

2

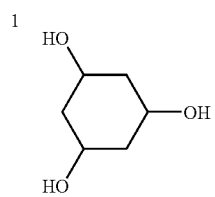

-continued
| 3 | 4 |
|---|---|
| 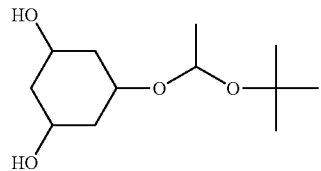 | 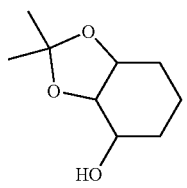 |
| 5 | 6 |
| 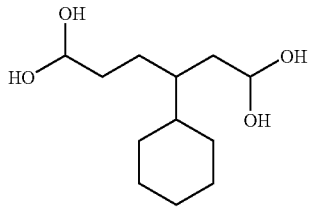 | |
| 7 | 8 |
| 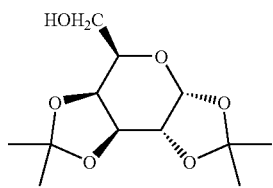 | |
| 9 | 10 |
| 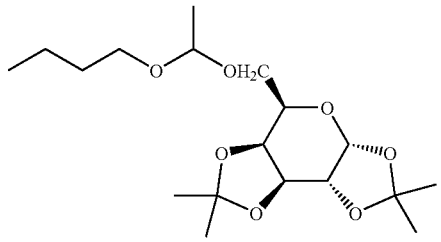 | |
| 11 | 12 |
| 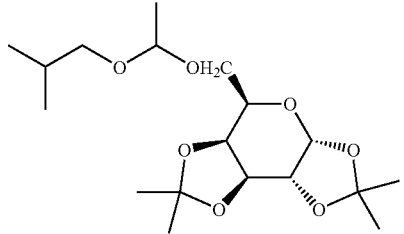 | |
| 13 | 14 |
| 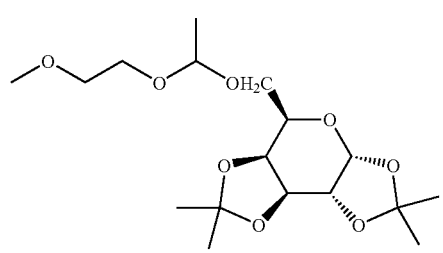 | 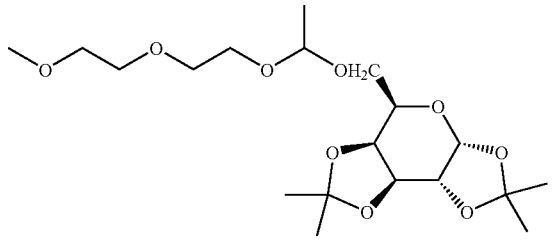 |
| 15 | |
| 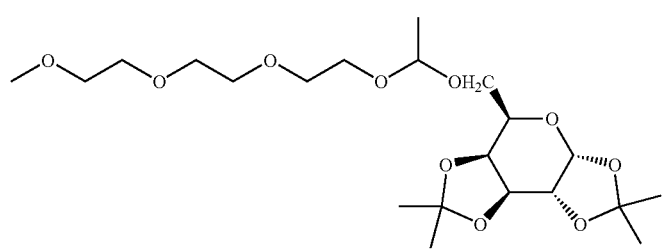 | |

-continued
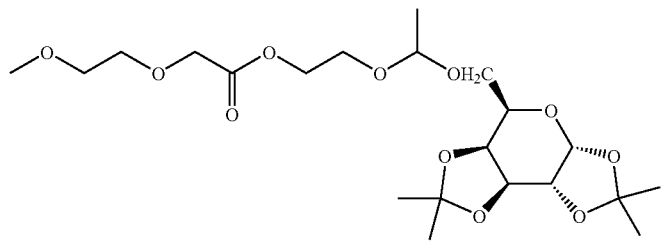
16
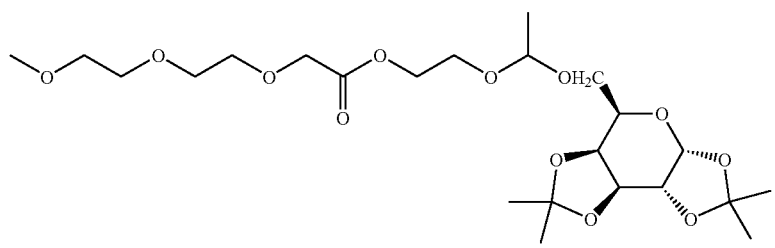
17
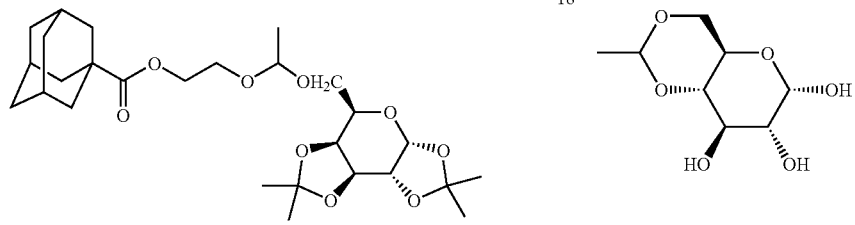
18
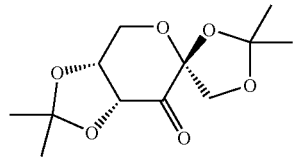
20
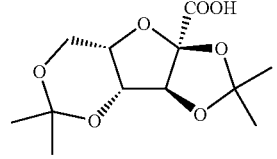
19
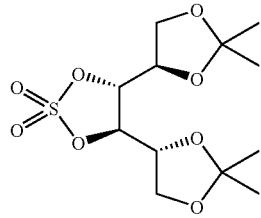
22
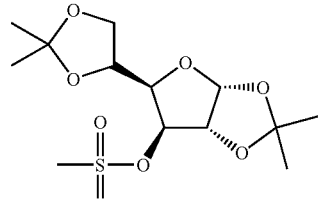
21
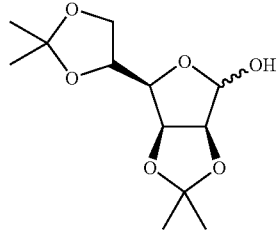
24
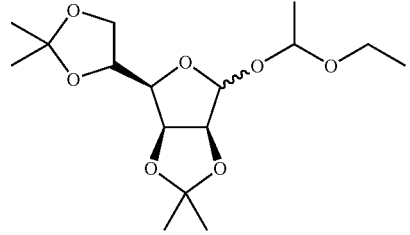
23
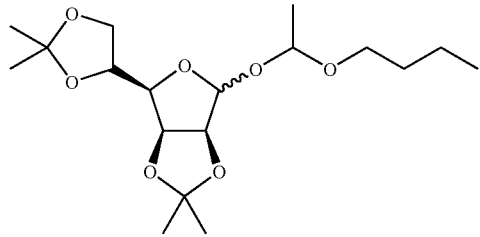
26
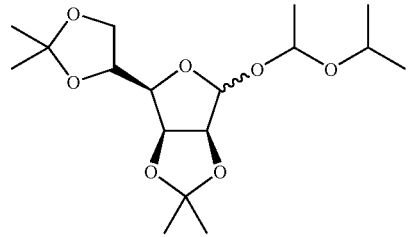
25
27

-continued
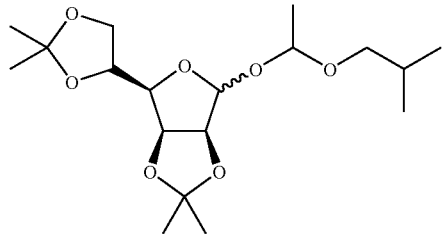
28
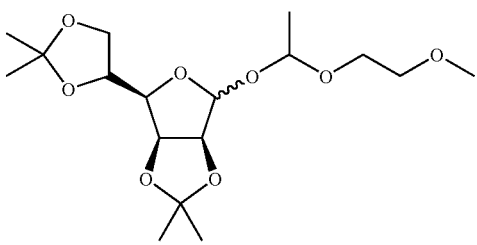
29
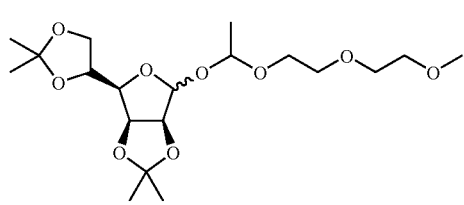
30
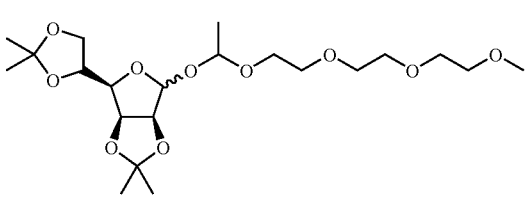
31
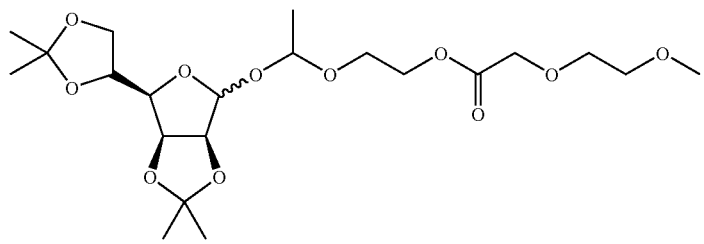
32
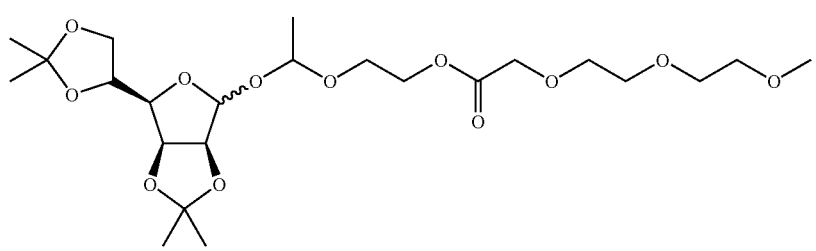
33
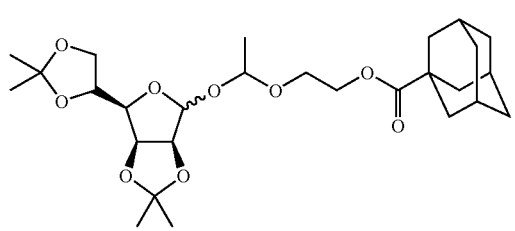
34
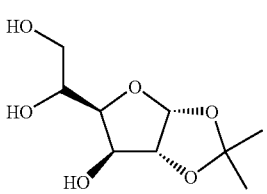
35
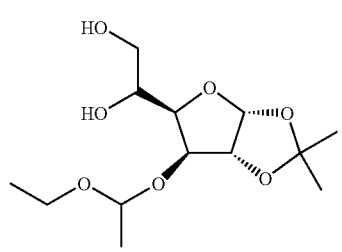
36
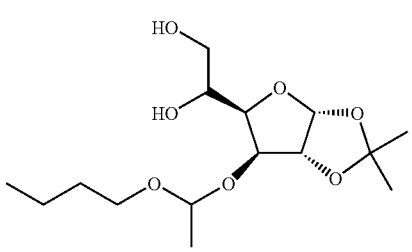
37

-continued
| 38 | 39 |
|---|---|
| 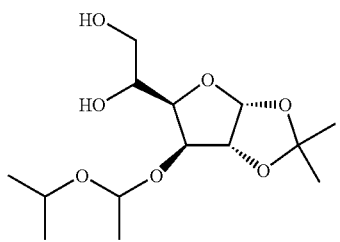 | 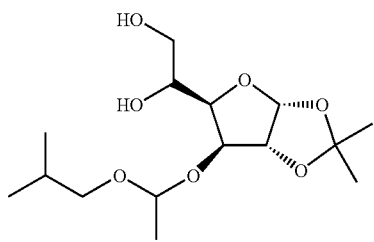 |
| 40 | 41 |
| 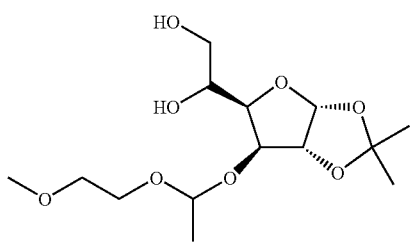 | 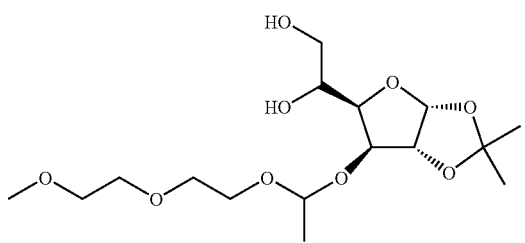 |
| 42 | 43 |
| 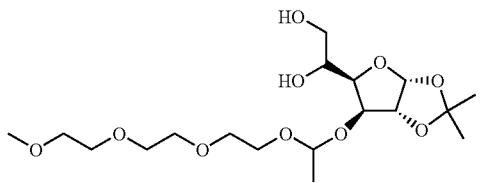 | 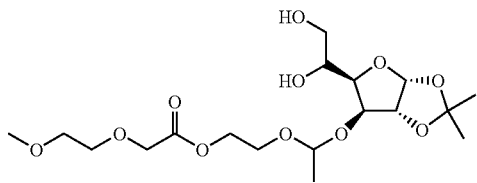 |
44
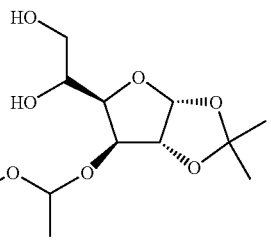
| 45 | 46 |
|---|---|
| 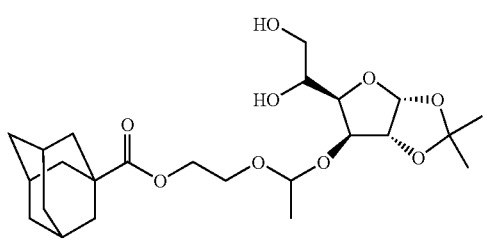 | 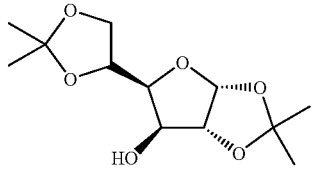 |
| 47 | 48 |
| 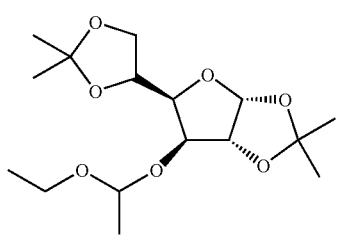 | 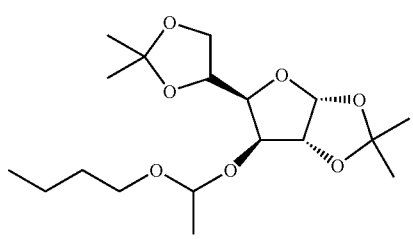 |
| 49 | 50 |
| 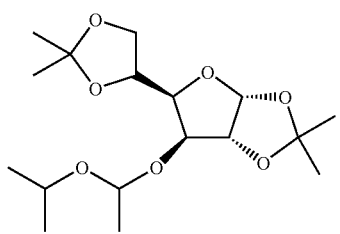 | 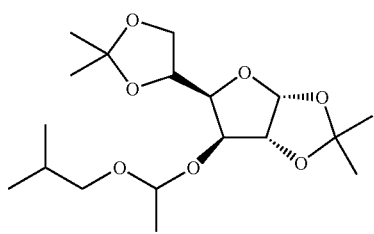 |

-continued
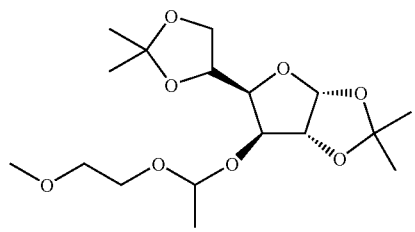 51
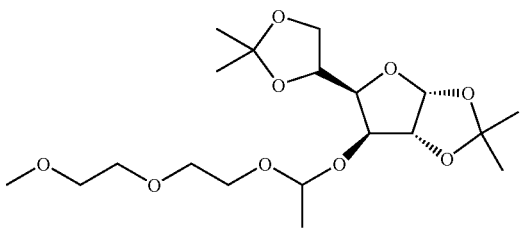 52
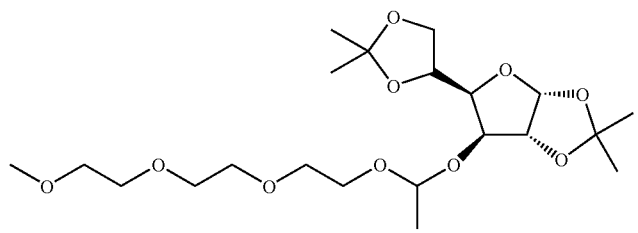 53
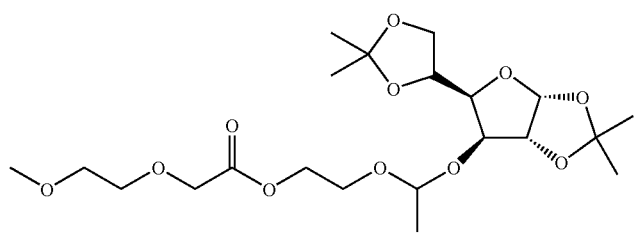 54
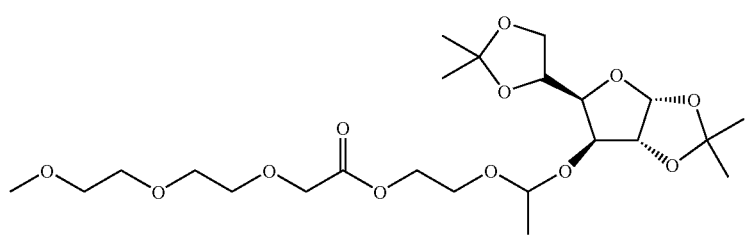 55
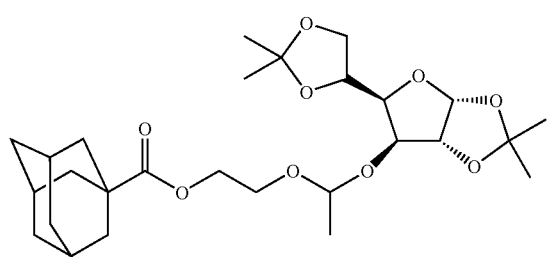 56
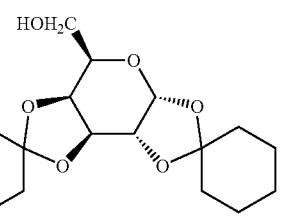 57
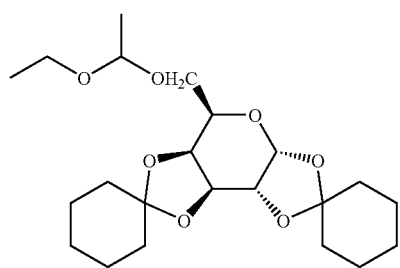 58
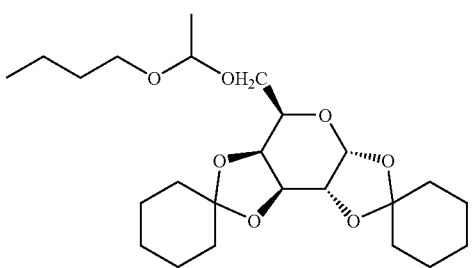 59

-continued
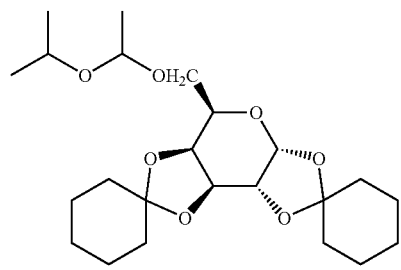
60
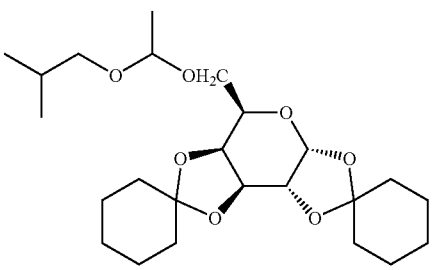
61
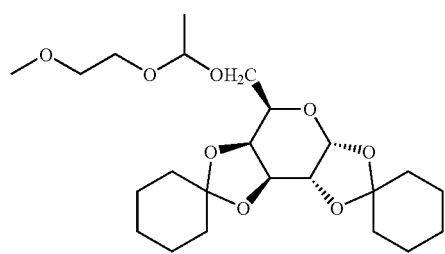
62
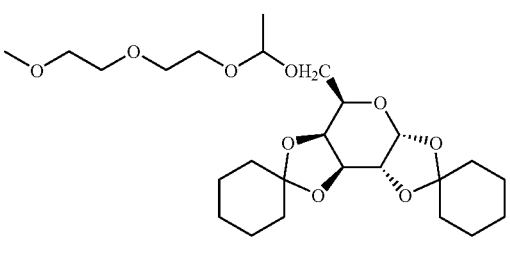
63
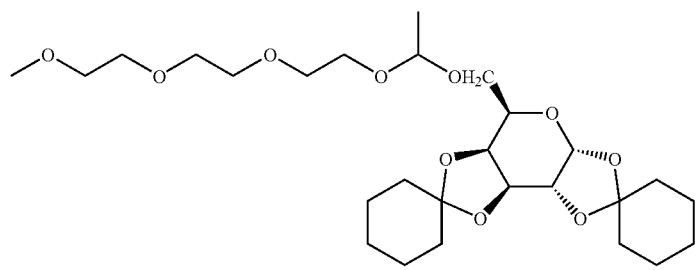
64
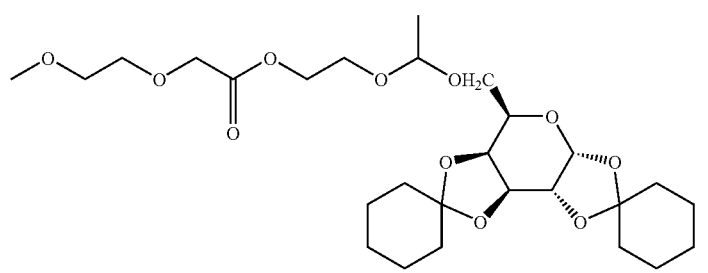
65
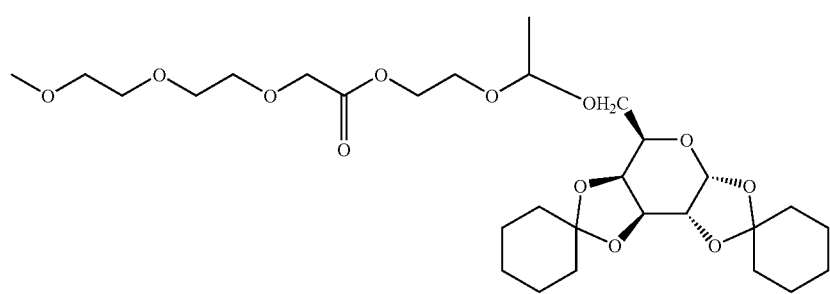
66
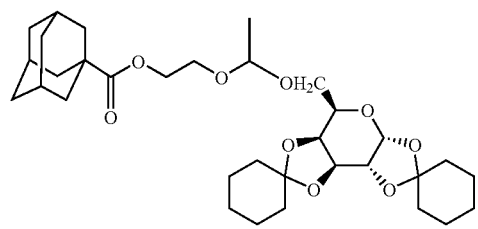
67
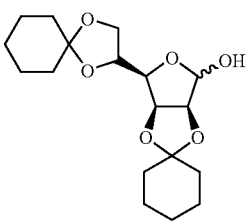
68

-continued
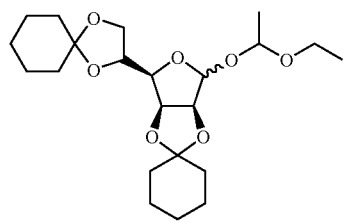
69
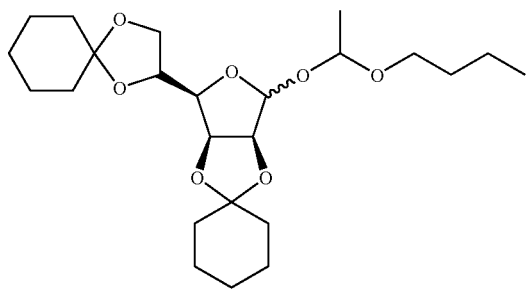
70
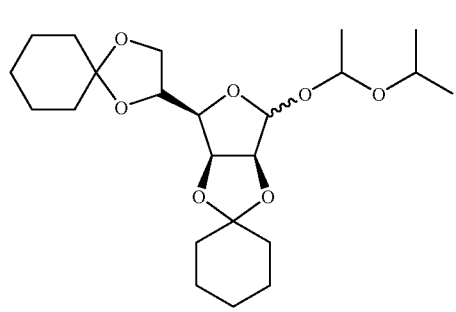
71
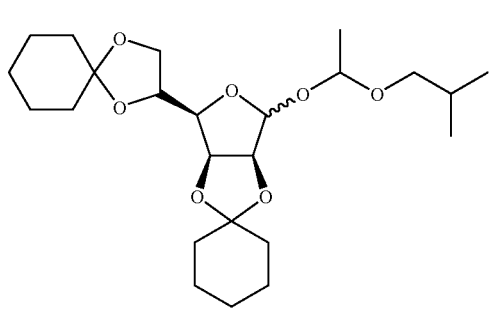
72
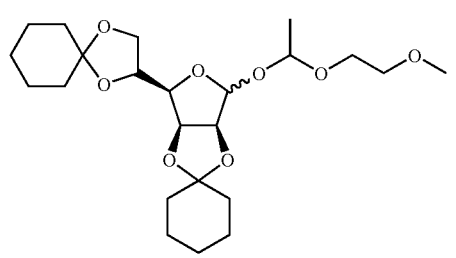
73
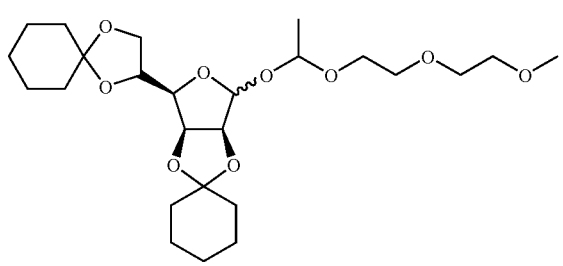
74
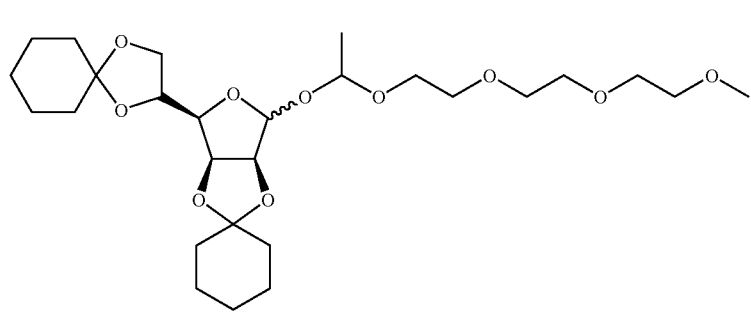
75
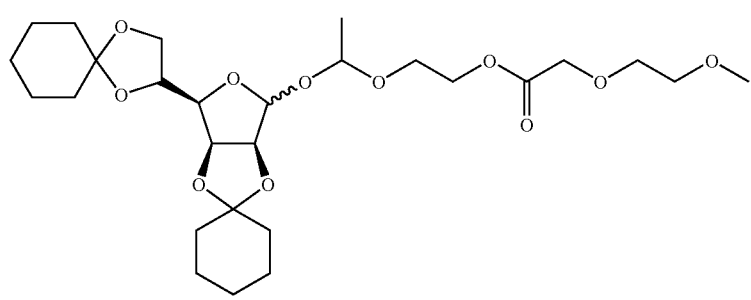
76

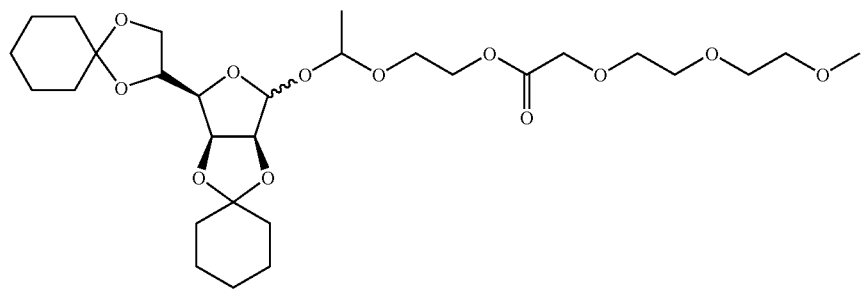
77
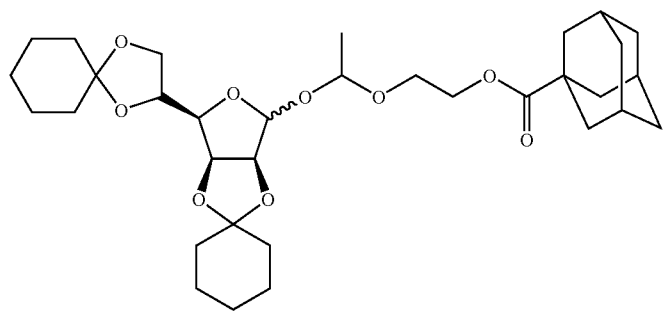
78
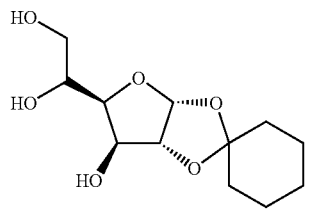
79
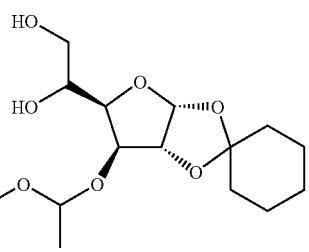
80
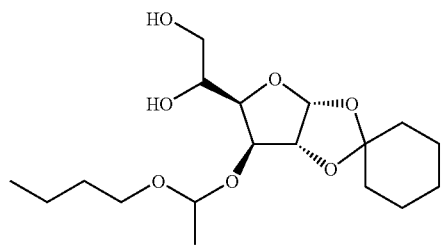
81
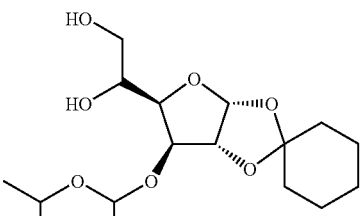
82
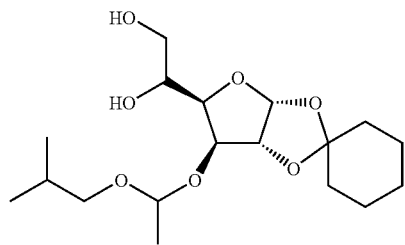
83
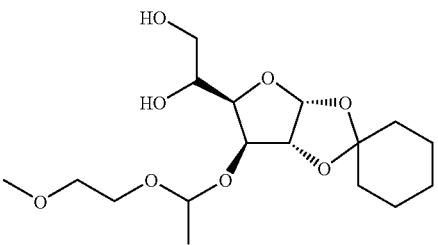
84
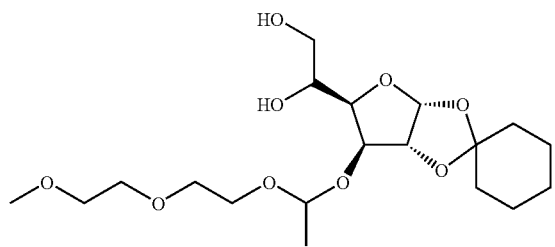
85

-continued
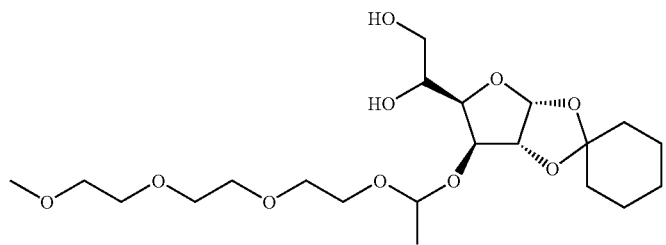
86
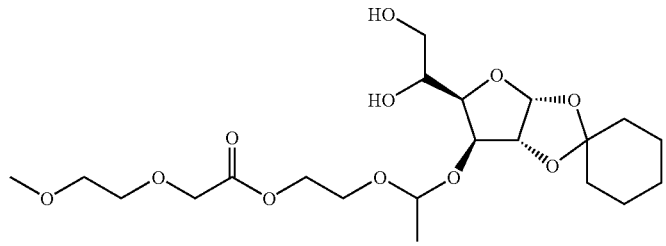
87
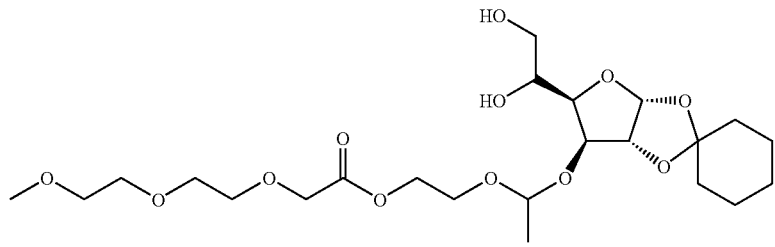
88
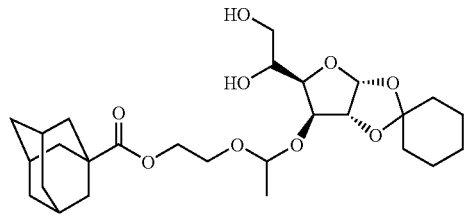
89
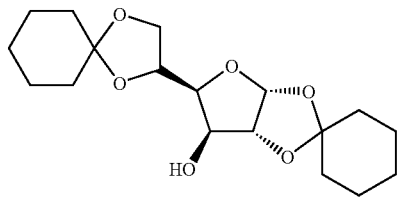
90
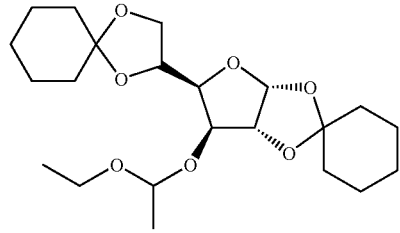
91
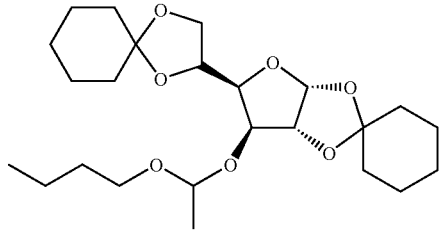
92
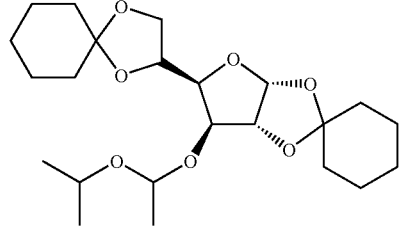
93
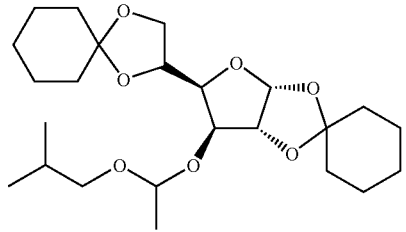
94

-continued

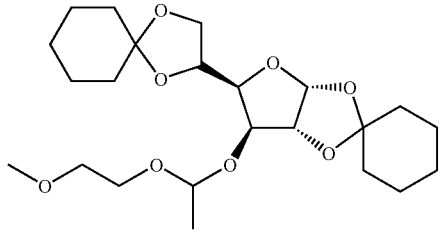
95

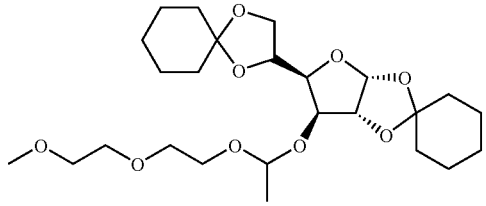
96

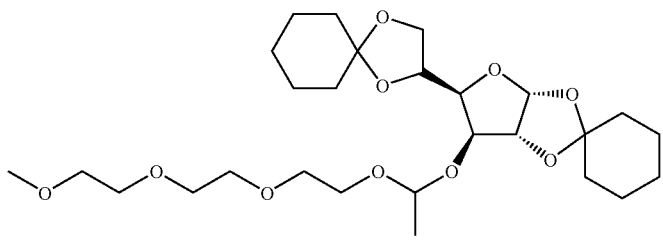
97

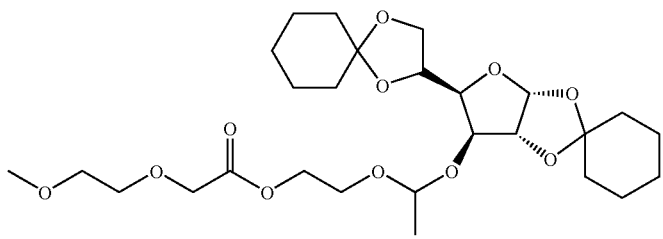
98

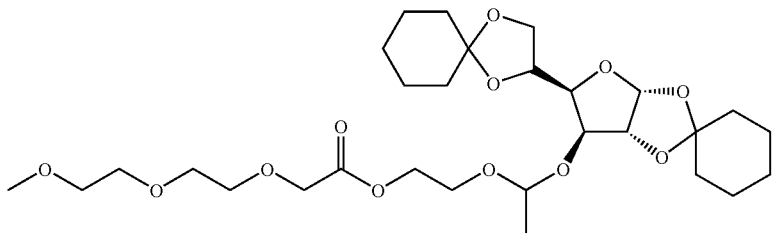
99

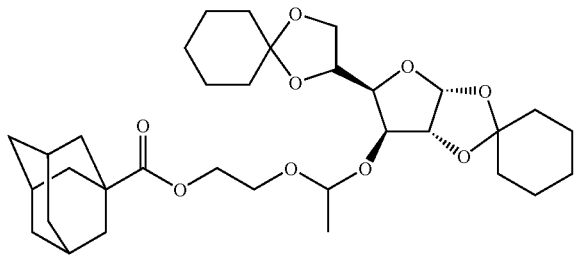
100

The compounds of Component (C) may be used individually or in combination of two or more thereof. The amount of compound of Component (C) used is ordinarily from 0.001 to 10% by weight, preferably from 0.01 to 5% by weight, based on the total solid content of the positive photosensitive composition.

>>(D) Basic Compound>>

The positive photosensitive composition of the present invention preferably contains a basic compound of Component (D) for restraining fluctuations in performances occurred with the passage of time from exposure to heat treatment.

The basic compounds used preferably have a structure represented by any one of formulae (A) to (E) shown below.

The structure represented by any one of formulae (B) to (E) may be a part of cyclic structure.

$$R^{250}-\underset{\underset{R^{252}}{|}}{\overset{\overset{R^{251}}{|}}{N}} \quad (A)$$

In the above formula, $R^{250}$, $R^{251}$ and $R^{252}$, which may be the same or different, each independently represent a hydrogen atom, an alkyl group having from 1 to 20 carbon atoms, an aminoalkyl group having from 1 to 20 carbon atoms, a hydroxyalkyl group having from 1 to 20 carbon atoms or a substituted or unsubstituted aryl group having from 6 to 20 carbon atoms, or $R^{250}$ and $R^{251}$ may be combined with each other to form a ring, and the alkyl chain may contain an oxygen atom, a sulfur atom or a nitrogen atom,

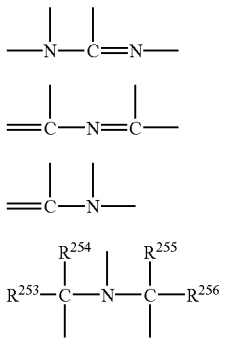

In the above formulae, $R^{253}$, $R^{254}$, $R^{255}$ and $R^{256}$, which may be the same or different, each independently represent an alkyl group having from 1 to 6 carbon atoms.

Preferred examples of the basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, substituted or unsubstituted aminoalkylmorpholines, mono-, di- or trialkylamines, substituted or unsubstituted anilines, substituted or unsubstituted piperidines and mono- or diethanolamine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Preferred specific examples of the basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 2,4,5-triphenylimidazole, tri(n-butyl)amine, tri(n-octyl)amine, N-phenyldiethanolamine, N-hydroxyethylpiperidine, 2,6-diisopropylaniline and N-cyclohexyl-N'-morpholinoethylthiourea. However, the basic compounds for use in the present invention should not be construed as being limited thereto.

More preferred compounds include substituted or unsubstituted guanidines, substituted or unsubstituted aminopyrrolidines, substituted or unsubstituted pyrazoles, substituted or unsubstituted pyrazolines, substituted or unsubstituted piperazines, substituted or unsubstituted aminomorpholines, substituted or unsubstituted aminoalkylmorpholines and substituted or unsubstituted piperidines. Compounds having an imidazole structure, a diazabicyclo structure, an onium hydroxide structure, an onium carboxylate structure or an aniline structure are also preferred.

The compound having an imidazole structure includes imidazole, 2,4,5-triphenylimidazole and benzimidazole. The compound having a diazabicyclo structure includes 1,4-diazabicyclo[2.2.2]octane, 1,5-diazabicyclo[4.3.0]non-5-ene and 1,8-diazabicyclo[5.4.0]undec-7-ene. The compound having an onium hydroxide structure includes a triarylsulfonium hydroxide, phenacyl sulfonium hydroxide and a 2-oxoalkyl group-containing sulfonium hydroxide, e.g., triphenylsulfonium hydroxide, tris(tert-butylphenyl)sulfonium hydroxide, bis(tert-butylphenyl)iodonium hydroxide, phenacyl thiophenium hydroxide or 2-oxopropylthiophenium hydroxide. The compound having an onium carboxylate structure includes a compound wherein an anion portion of the compound having an onium hydroxide structure is replaced by a carboxylate, e.g., acetate, adamantane-1-carboxylate or a perfluoroalkyl carboxylate. The compound having an aniline structure includes 2,6-diisopropylaniline and N,N-dimethylaniline. The basic compound for use in the present invention should not be construed as being limited to these specific examples.

<<(E) Fluorine-base and/or Silicon-base Surface Active Agent>>

It is preferred that the positive photosensitive composition of the present invention contains one or more of fluorine-base and/or silicon-base surface active agents (a fluorine atom-containing surface active agent, a silicon atom-containing surface active agent and a surface active agent containing both a fluorine atom and a silicon atom).

By the addition of the surface active agent of Component (E), the positive photosensitive composition of the present inventions can provide, with high sensitivity and good resolution, resist patterns having good adhesion and less development defect, when an exposure light source of 250 nm or less, especially 220 nm or less is used.

Specific examples of the surface active agent of Component (E) include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. Commercially available surface active agents described below may also be used as they are.

Examples of the commercially available surface active agent used include fluorine-base or silicon-base surface active agents, e.g., Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-base surface active agent.

The amount of surface active agent of Component (E) used is preferably from 0.0001 to 2% by weight, and more preferably from 0.001 to 1% by weight, based on the total amount of the positive photosensitive composition (excluding a solvent).

<<(F) Organic Solvent>>

The positive photosensitive composition of the present invention is used by dissolving the above-described components in a desired organic solvent.

Examples of the organic solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone and tetrahydrofuran.

In the present invention, the organic solvents may be used individually or as a mixture of two or more thereof. It is preferred to use, as the organic solvent, a mixture of a solvent containing a hydroxy group and a solvent free from a hydroxy group. This makes it possible to restrain the generation of particles during storage of the solution of photosensitive composition.

Examples of the solvent containing a hydroxy group include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate are particularly preferred.

Examples of the solvent free from a hydroxy group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Of these solvents, propylene glycol monomethyl ether acetate, ethyl ethoxypropionate, 2-heptanone, γ-butyrolactone, cyclohexanone and butyl acetate are particularly preferred, and propylene glycol monomethyl ether acetate, ethyl ethoxypropionate and 2-heptanone are most preferred.

A mixing ratio (by weight) of the solvent containing a hydroxy group to the solvent free from a hydroxy group ranges from 1/99 to 99/1, preferably from 10/90 to 90/10, and more preferably from 20/80 to 60/40. A mixed solvent containing not less than 50% by weight of the solvent free from a hydroxy group is also particularly preferred in view of uniform coating.

<<(G) Acid Decomposable Dissolution Inhibiting Compound>>

It is preferred that the positive photosensitive composition of the present invention contains a dissolution inhibiting low molecular weight compound of Component (G) (hereinafter also referred to as an "acid-decomposable dissolution inhibiting compound") having a group capable of being decomposed by the action of an acid to increase solubility in an alkali developing solution and having a molecular weight of not more than 3,000.

In order to prevent deterioration in transmittance at 220 nm or less, an alicyclic or aliphatic compound having an acid-decomposable group, for example, a cholic acid derivative having an acid-decomposable group as described in *Proceeding of SPIE*, 2724, 355(1966) is preferred as the acid-decomposable dissolution inhibiting compound of Component (G). Examples of the acid-decomposable group and alicyclic structure are similar to those described regarding the acid-decomposable resin of Component (B) hereinbefore.

The molecular weight of acid-decomposable dissolution inhibiting compound of Component (G) is not more than 3,000, preferably from 300 to 3,000, and more preferably from 500 to 2,500.

The amount of acid-decomposable dissolution inhibiting compound of Component (G) used is preferably from 3 to 50% by weight, and more preferably 5 to 40% by weight, based on the total solid content of the positive photosensitive composition.

Specific examples of the acid-decomposable dissolution inhibiting compound of Component (G) are set forth below, but the present invention should not be construed as being limited thereto.

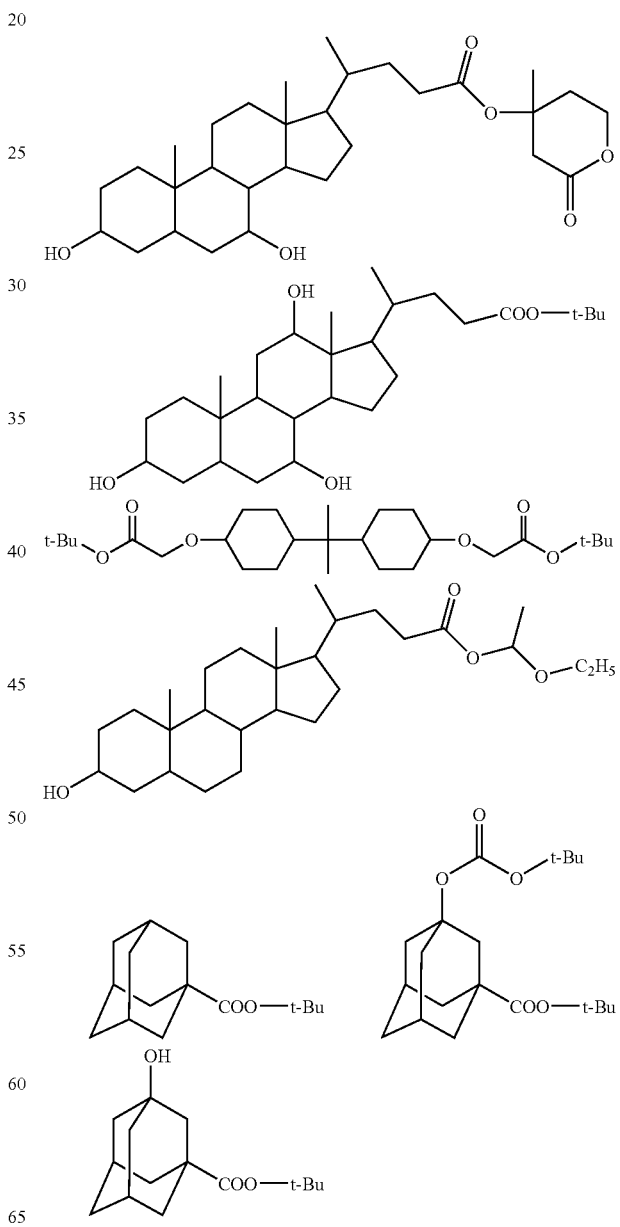

<(H) Alkali-soluble Resin>

The positive photosensitive composition of the present invention may contain a resin of Component (H), which does not contain an acid-decomposable group, insoluble in water but soluble in an alkali developing solution. By the addition of such a resin, the sensitivity of the photosensitive composition can be improved.

In the present invention, a novolac resin having a molecular weight of from about 1,000 to about 20,000 and a polyhydroxystyrene derivative having a molecular weight of from about 3,000 to about 50,000 are used as such a resin. Since these resins have a large absorption of light of 250 nm or less, they are preferably used after being subjected to partial hydrogenation or in an amount not larger than 30% by weight based on the total amount of resin.

Resins having a carboxy group as an alkali-solubilizing group are also used. The carboxy group-containing resin preferably has a monocyclic or polycyclic alicyclic hydrocarbon group for improving dry etching resistance. Specific examples of such a resin include a methacrylic ester/(meth)acrylic acid copolymer having an alicyclic hydrocarbon structure which does not exhibit acid decomposability and a (meth)acrylic ester resin containing an alicyclic hydrocarbon group having a carboxy group at the terminal thereof.

<Other Additives>

Into the positive photosensitive composition of the present invention, a dye, a plasticizer, a surface active agent other than the surface active agent of Component (E), a photosensitizer and a compound for promoting dissolution in a developing solution may be incorporated.

The dissolution promoting compound in a developing solution for use in the present invention is a low molecular weight compound having a molecular weight of not more than 1,000 and having at least two phenolic hydroxy groups or at least one carboxy group. In case of containing a carboxy group, an alicyclic or aliphatic compound is preferred because of the same reason as described above.

The amount of dissolution promoting compound used is preferably from 2 to 50% by weight, and more preferably from 5 to 30% by weight, based on the resin capable of being decomposed by the action of an acid to increase a solubility rate in an alkali developing solution of Component (B). The amount exceeding 50% by weight is not preferred, because another problem of the increase in development residue or the deformation of pattern at the development may occur.

Such a phenolic compound having a molecular weight of not more than 1,000 can be easily synthesized by one skilled in the art with reference to methods as described, for example, in JP-A-4-122938, JP-A-2-28531, U.S. Pat. No. 4,916,210 and European Patent 219,294.

Specific examples of the carboxy group-containing alicyclic or aliphatic compound include a carboxylic acid derivative having a steroid structure, e.g., cholic acid, deoxycholic acid or lithocholic acid, an adamantanecarboxylic acid derivative, adamantanedicarboxylic acid, cyclohexanecarboxylic acid and cyclohexanedicarboxylic acid, but the present invention should not be construed as being limited thereto.

To the photosensitive composition of the present invention, a surface active agent other than the fluorine-base and/or silicon-base surface active agent of Component (E) may be added. Specific examples of such surface active agent include a nonionic surface active agent, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate, and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The surface active agents may be used individually or in combination with two or more thereof.

<Method for Use>

The positive photosensitive composition of the present invention is applied onto a desired substrate after dissolving the above components in a desired organic solvent, preferably in the mixed solvent as described above.

Specifically, the positive photosensitive composition is applied to a substrate (e.g., silicon/silicon dioxide coating) as used for the production of a precision integrated circuit device by appropriate coating means, for example, a spinner or a coater.

After the application, the resulting photosensitive layer is exposed to light through a desired mask, followed by baking and development. Thus, good resist patterns are obtained. As light for the exposure, a far ultraviolet ray having preferably a wavelength of 250 nm or shorter, more preferably 220 nm or shorter is used. Specific examples thereof include a KrF excimer laser beam (248 nm), an ArF excimer laser beam (193 nm), an F2 excimer laser beam (157 nm), an X-ray and an electron beam. The ArF excimer laser beam is particularly preferred.

In the development step, a developing solution as described below is used. The developing solution for the positive photosensitive composition of the present invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A developing solution prepared by adding an appropriate amount of an alcohol or a surface active agent to the aqueous alkaline solution is also used.

The present invention will be described in more detail with reference to the following examples, but the present invention should not be construed as being limited thereto.

<Synthesis Example of Acid Generator>

(Synthesis of Tetramethylammonium Pentafluorobenzenesulfonate)

In 100 ml of methanol was dissolved 25 g of pentafluorobenzenesulfonyl chloride under cooling with ice, and to the solution was gradually added 100 g of a 25% aqueous solution of tetramethylammonium hydroxide. The mixture was stirred at room temperature for 3 hours to obtain a solution of tetramethylammonium pentafluorobenzenesulfonate. The solution was used for conducting salt exchange with a sulfonium salt or an iodonium salt.

(Synthesis of Triphenylsulfonium Pentafluorobenzenesulfonate: Compound (A1I-1))

In 800 ml of benzene was dissolved 50 g of diphenylsulfoxide, and to the solution was added 200 g of aluminum chloride followed by refluxing for 24 hours. The reaction solution was gradually poured into 2 liters of water, and to the mixture was added 400 ml of concentrated sulfuric acid, followed by heating at 70° C. for 10 minutes. The aqueous reaction solution was washed with 500 ml of ethyl acetate and filtered, and to the filtrate was added a solution containing 200 g of ammonium iodide dissolved in 400 ml of water.

The powder thus deposited was collected by filtration, washed with water and then with ethyl acetate, and dried to obtain 70 g of triphenylsulfonium iodide.

In 1,000 ml of methanol was dissolved 30.5 g of triphenylsulfonium iodide, and to the solution was added 19.1 g of silver oxide, follower by stirring at room temperature for 4 hours. The solution was filtered and to the filtrate was added an excess amount of the solution of tetramethylammonium pentafluorobenzenesulfonate synthesized above. The reaction solution was concentrated, the resulting residual product was dissolved in 500 ml of dichloromethane, and the solution was washed with a 5% aqueous solution of tetramethylammonium hydroxide and then with water. The organic phase was dried with anhydrous sodium sulfate and concentrated to obtain triphenylsulfonium pentafluorobenzenesulfonate.

(Synthesis of Triarylsulfonium Pentafluorobenzenesulfonate: Mixture of Compounds (A1I-9) and (A1II-1))

In 500 ml of water was dissolved 50 g of triarylsulfonium chloride (50% aqueous solution of triphenylsulfonium chloride manufactured by Fluka), and to the solution was added an excess amount of the solution of tetramethylammonium pentafluorobenzenesulfonate synthesized above to deposit an oily substance. The supernatant was removed by decantation and the oily substance obtained was washed with water and dried to obtain triarylsulfonium pentafluorobenzenesulfonate (containing Compounds (A1I-9) and (A1II-1) as the main components)

(Synthesis of di(4-tert-amylphenyl)iodonium pentafluorobenzenesulfonate (Compounds (A1III-1))

A mixture of 60 g of tert-amylbenzene, 39.5 g of potassium iodate, 81 g of acetic anhydride and 170 ml of dichloromethane was prepared and 66.8 g of concentrated sulfuric acid was gradually added dropwise thereto under cooling with ice. The mixture was stirred under cooling with ice for 2 hours and the stirred at room temperature for 10 hours. To the reaction solution was added 500 ml of water under cooling with ice and extracted with dichloromethane. The organic phase was washed with an aqueous solution of sodium hydrogen carbonate and then with water, and concentrated to obtain di-(4-tertamylphenyl)iodonium sulfate. The sulfate was added to an excess amount of the solution of tetramethylammonium pentafluorobenzenesulfonate synthesized above. To the solution was added 500 ml of water, and mixture was extracted with dichloromethane. The organic phase was washed with a 5% aqueous solution of tetramethylammonium hydroxide and then with water, and concentrated to obtain di(4-tert-amylphenyl)iodonium pentafluorobenzenesulfonate.

(Synthesis of Compound (A1VIII-1))

In 100 ml of acetonitrile was dissolved 16.6 g of phenacyl bromide, and to the solution was added 25 g of tetrahydrothiophene, followed by stirring at room temperature over night. The solid deposited was collected by filtration, and the powder obtained was reslurryed with 300 ml of ethyl acetate to obtain 22 g of phenacylteterahydrothiophenium bromide. The phenacylteterahydrothiophenium bromide was subjected to salt exchange with tetramethylammonium 3,5-bistrifluoromethylbenzenesulfonate to obtain Compound (A1VIII-1).

SYNTHESIS EXAMPLE OF RESIN

Synthesis Example 1

Synthesis of Resin (1) (Side Chain Type)

2-Ethyl-2-adamantyl methacrylate and butyrolactone methacrylatein a molar ratio of 55/45 were dissolved-in a mixed solvent of methyl ethyl ketone and tetrahydrofuran (5/5 by weight) to prepare 100 ml of a solution having a solid concentration of 20% by weight. To the solution was added 2% by mole of V-65 manufactured by Wako Pure Chemical Industries, Ltd., and the solution was added dropwise to 10 ml of methyl ethyl ketone heated at 60° C. under a nitrogen gas stream over a period of 4 hours. After the completion of the addition, the reaction solution was heated for 4 hours and 1% by mole of V-65 was again added thereto, followed by stirring for 4 hours. Then, the reaction solution was cooled to room temperature and poured into 3 liters of a mixed solvent of distilled water and isopropyl alcohol (1/1 by weight) to crystallize, and the white powder deposited was recovered to obtain Resin (1).

A polymer component ratio of the resin determined by $C^{13}$NMR was 46/54 by mole. A weight average molecular weight thereof measured by GPC method and calculated in terms of standard polystyrene was 10,700.

Resins (2) to (17) and (38) to (39) were synthesized in a similar manner to Synthesis Example (1), respectively.

The polymer component ratio and weight average molecular weight of each of Resins (2) to (17) are shown in Tables 1 and 2 below. In Tables 1 and 2, Repeating Units 1, 2, 3 and 4 denote the repeating units of Resins (2) to (17) shown below in order from left to right, respectively.

TABLE 1

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 2 | 53 | 40 | 7 | — | 13,400 |
| 3 | 46 | 34 | 20 | — | 9,400 |
| 4 | 42 | 31 | 27 | — | 8,300 |
| 5 | 49 | 42 | 9 | — | 9,900 |
| 6 | 42 | 30 | 28 | — | 10,300 |
| 7 | 39 | 35 | 26 | — | 8,900 |
| 8 | 46 | 22 | 30 | 2 | 12,900 |
| 9 | 42 | 20 | 32 | 6 | 11,600 |
| 10 | 46 | 42 | 12 | — | 9,200 |
| 11 | 40 | 20 | 40 | — | 11,300 |
| 12 | 42 | 18 | 38 | 2 | 13,800 |
| 13 | 38 | 31 | 29 | 2 | 11,100 |
| 14 | 50 | 31 | 19 | — | 11,700 |
| 15 | 40 | 20 | 40 | — | 19,000 |

TABLE 2
| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 16 | 40 | 20 | 40 | — | 9,800 |
| 17 | 40 | 20 | 40 | — | 8,700 |
Structures of Resins (1) to (17) are shown below.
(1)
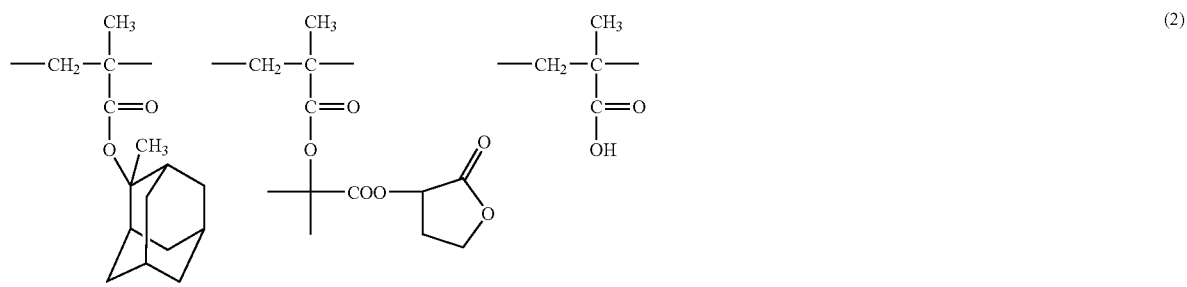
(2)
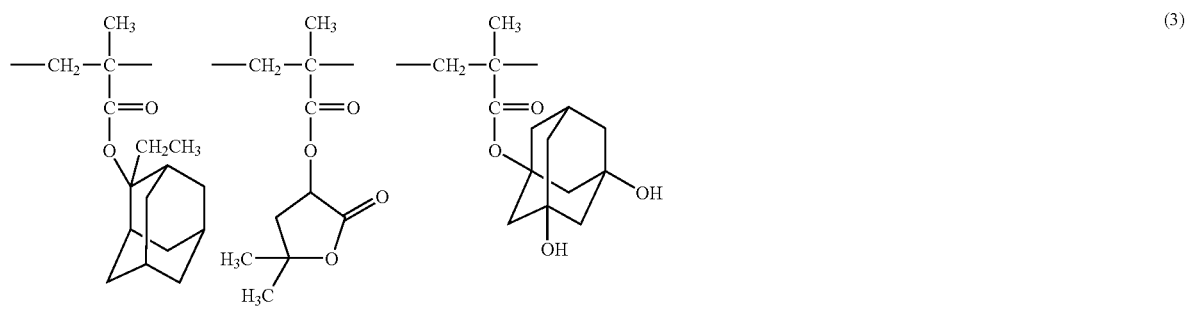
(3)
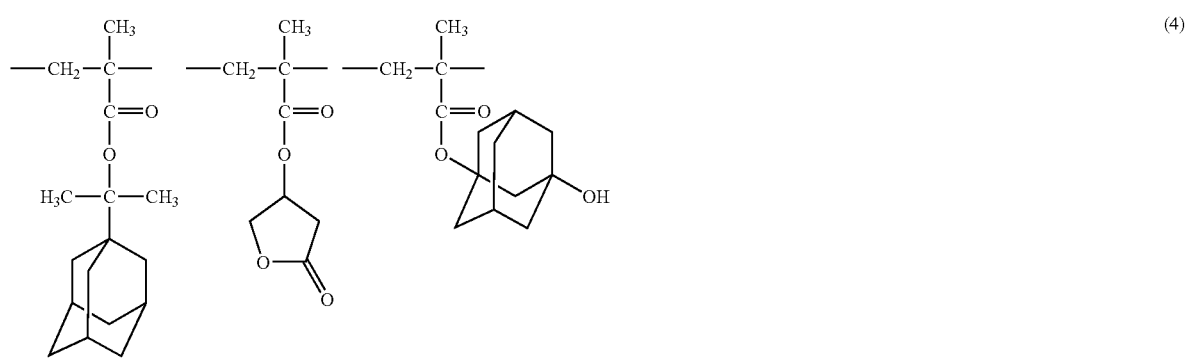
(4)

TABLE 2-continued
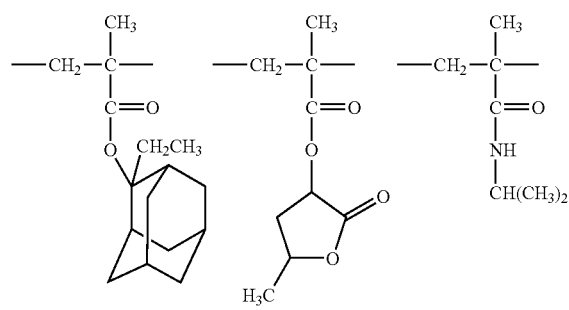 (5)
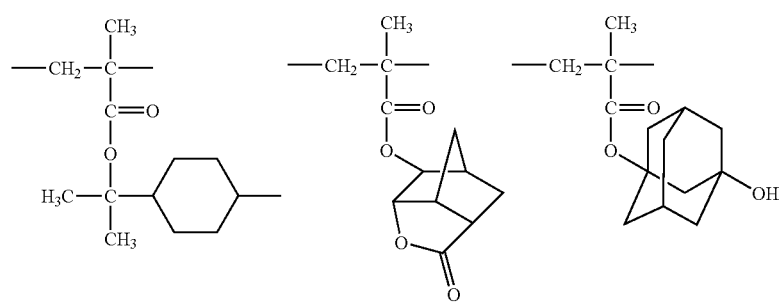 (6)
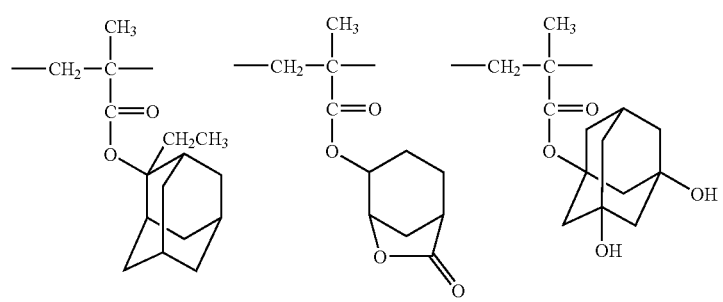 (7)
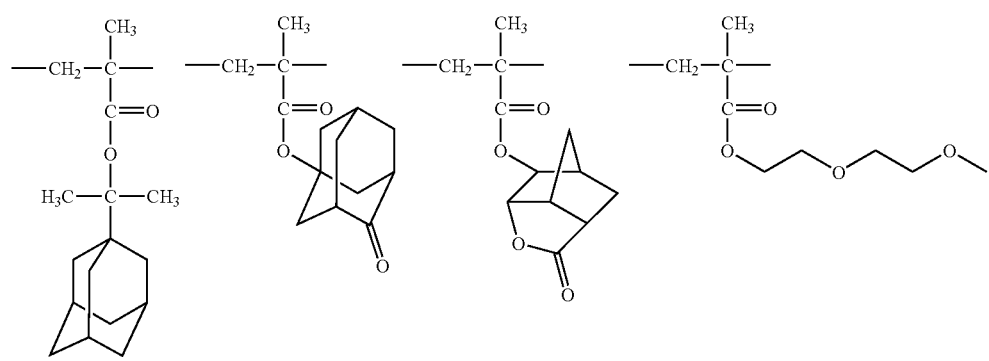 (8)
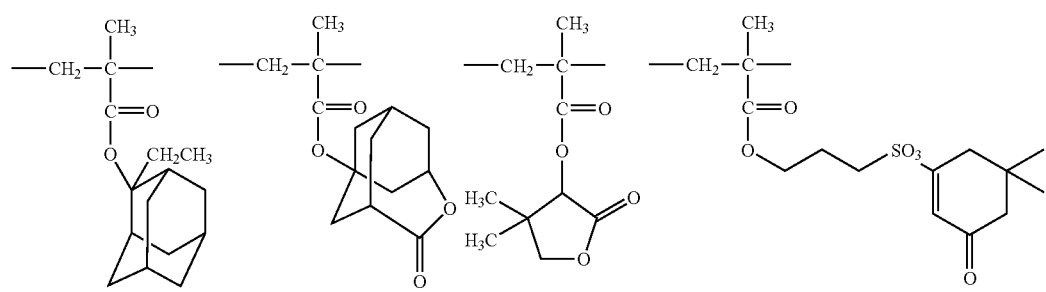 (9)

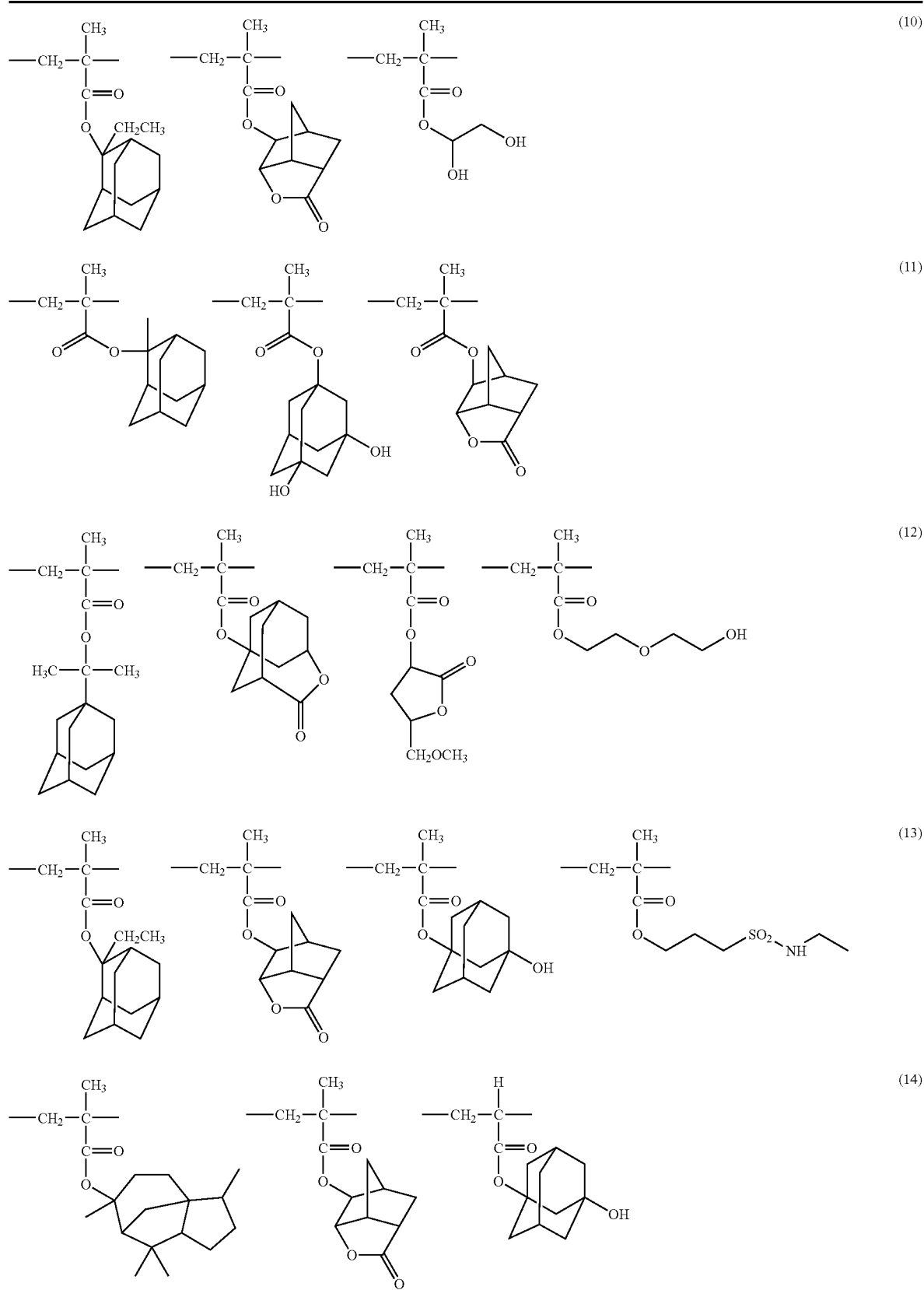

TABLE 2-continued

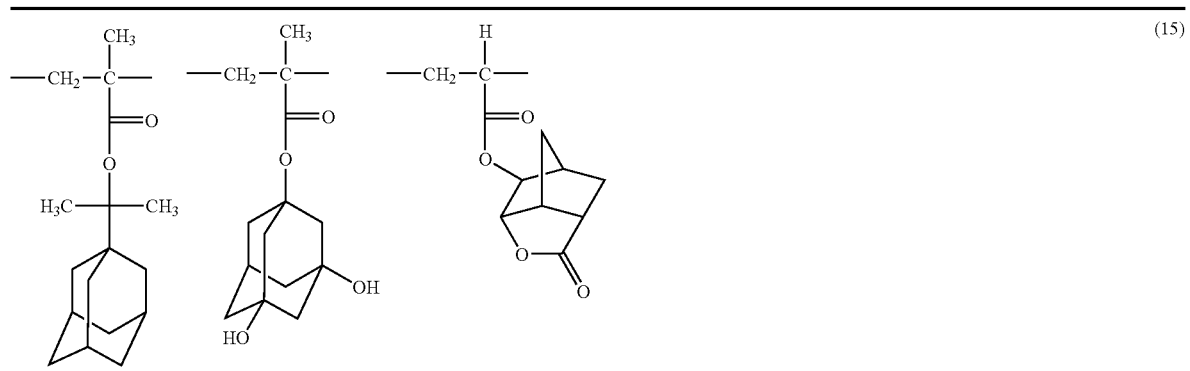
(15)

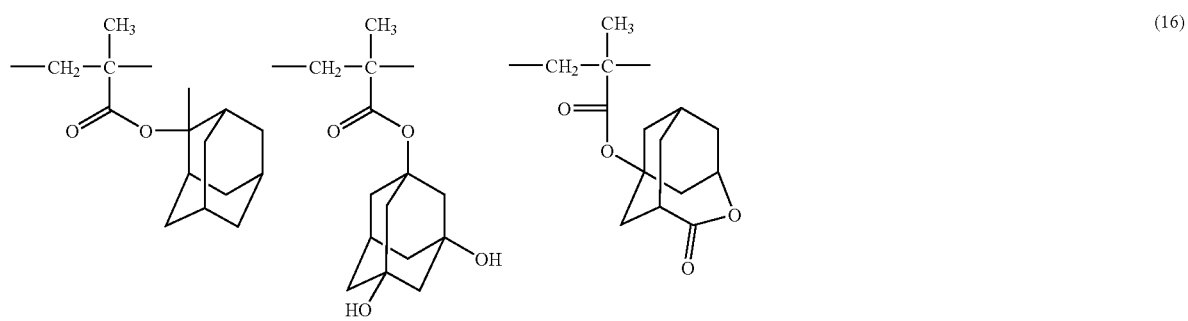
(16)

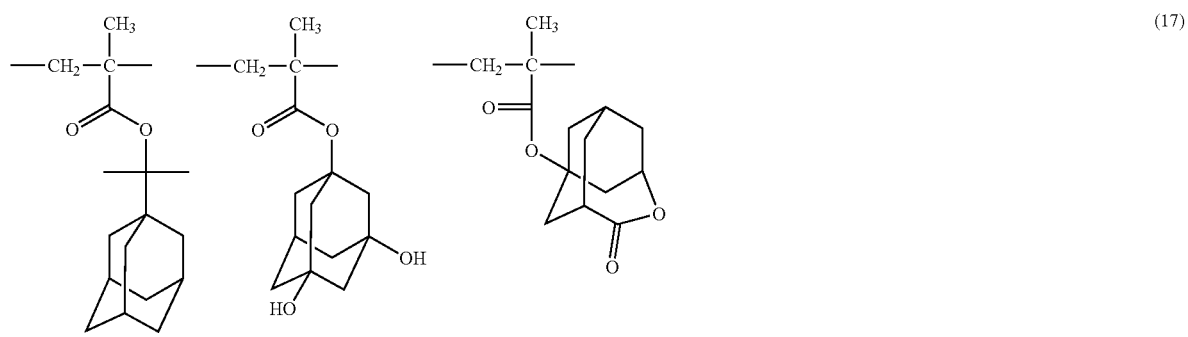
(17)

Synthesis Example 2

Synthesis of Resin (18) (Main Chain Type)

Into a separable flask were put tert-butyl ester of norbornenecarboxylic acid, butyrolactone ester of norbornenecarboxylic acid and maleic anhydride in a molar ratio of 40/10/50 and tetrahydrofuran in an amount necessary for forming a solution having a reaction concentration of 60% by weight, and the solution was heated at 60° C. under a nitrogen gas stream. After the reaction temperature was stabilized, 2% by mole of a radical initiator (V-601 manufactured by Wako Pure Chemical Industries, Ltd.) was added to initiate a reaction. After heating for 12 hours, the resulting reaction mixture was diluted twice with tetrahydrofuran and poured into a solvent mixture of hexane and isopropyl alcohol (1/1 by weight) to deposit white powder. The powder was collected by filtration and dried to obtain Resin (18).

Resin (18) was subjected to molecular weight analysis by a GPC method and it was found that a weight average molecular weight thereof calculated in terms of polystyrene was 8,300. A molar ratio of repeating units corresponding to the tert-butyl ester of norbornenecarboxylic acid, butyrolactone ester of norbornenecarboxylic acid and maleic anhydride determined from an NMR spectrum was 42/8/50.

Resins (19) to (29) were synthesized in a similar manner to Synthesis Example (2), respectively. The polymer component ratio and weight average molecular weight of each of Resins (19) to (29) are shown in Table 3 below. In Table 3, Alicyclic Olefin Units 1, 2 and 3 denotes the repeating units of Resins (19) to (29) shown below in order from left to right, respectively.

TABLE 3
| Resin | Alicyclic Olefin Unit 1 (mol %) | Alicyclic Olefin Unit 2 (mol %) | Alicyclic Olefin Unit 3 (mol %) | Maleic Anhydride Unit (mol %) | Weight Average Molecular Weight |
|---|---|---|---|---|---|
| 19 | 35 | 15 | — | 50 | 6,200 |
| 20 | 20 | 30 | — | 50 | 8,600 |
| 21 | 36 | 14 | — | 50 | 9,100 |
| 22 | 31 | 19 | — | 50 | 7,900 |
| 23 | 35 | 5 | 10 | 50 | 8,300 |
| 24 | 33 | 17 | — | 50 | 8,500 |
| 23 | 38 | 12 | — | 50 | 8,900 |
| 26 | 31 | 6 | 13 | 50 | 8,100 |
| 27 | 33 | 7 | 10 | 50 | 9,100 |
| 28 | 40 | 10 | — | 50 | 9,300 |
| 29 | 34 | 16 | — | 50 | 8,800 |
Structures of Resins (19) to (29) are shown below.
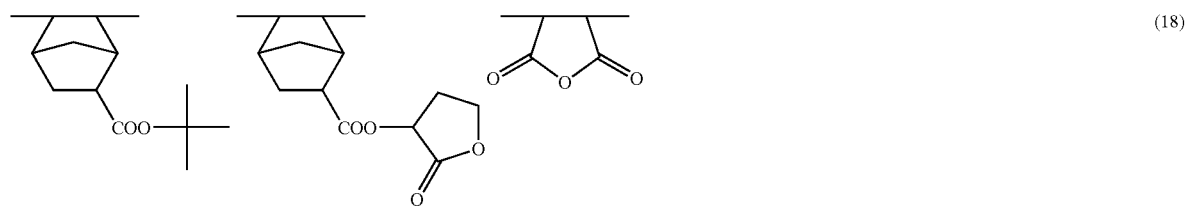
(18)
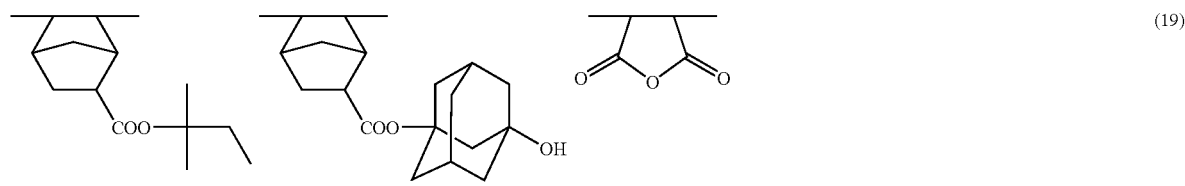
(19)
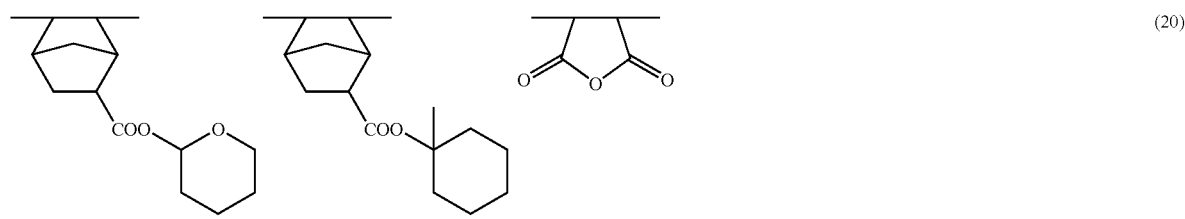
(20)
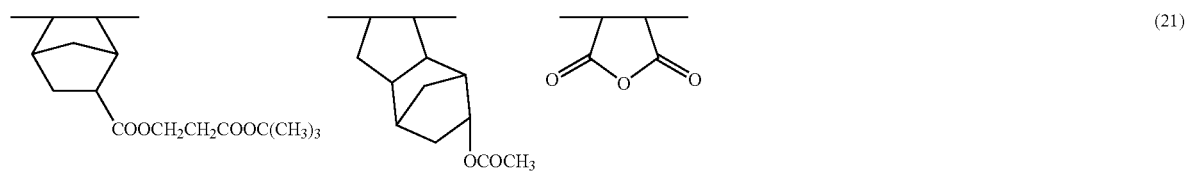
(21)
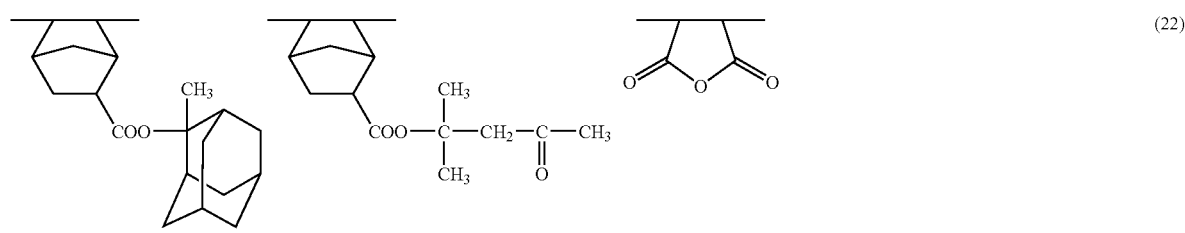
(22)

TABLE 3-continued
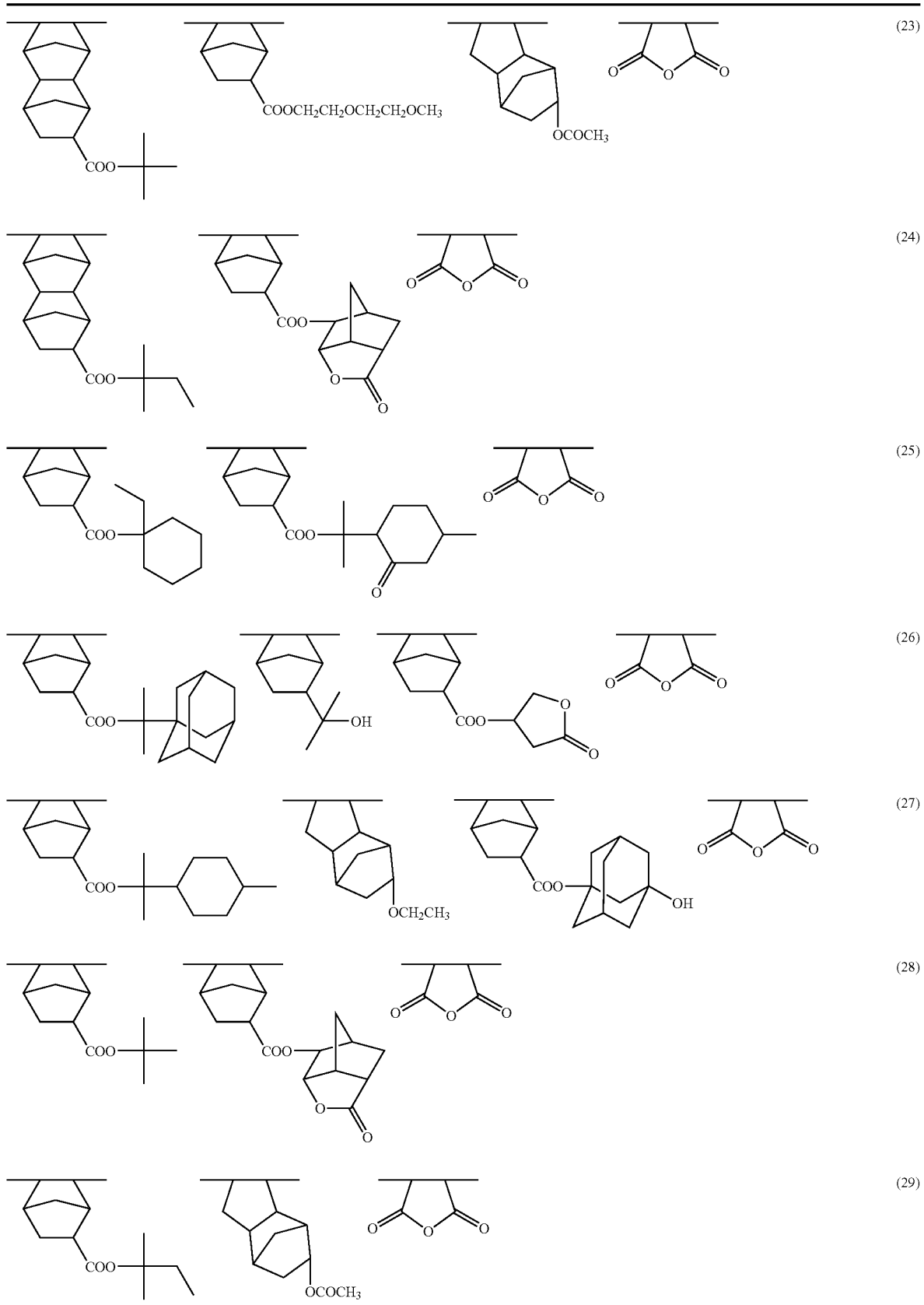

Synthesis Example 3

Synthesis of Resin (30) (Hybrid Type)

Into a reaction vessel were put norbornene, maleic anhydride, tert-butyl acrylate and 2-methylcyclohexyl-2-propyl acrylate in a molar ratio of 35/35/20/10 and dissolved in tetrahydrofuran to form a solution having a solid content of 60% by weight, and the solution was heated at 65° C. under a nitrogen gas stream. After the reaction temperature was stabilized, 1% by mole of a radical initiator (V-601 manufactured by Wako Pure Chemical Industries, Ltd.) was added to initiate a reaction. After heating for 8 hours, the reaction mixture was diluted twice with tetrahydrofuran and poured into hexane of five times in volume to deposit white powder. The powder was collected by filtration and dissolved in methyl ethyl ketone and the solution was poured into a mixed solvent of hexane and tert-butyl methyl ether (1/1 by weight) of five times in volume to reprecipitate. The white powder deposited was collected by filtration and dried to obtain Resin (30).

Resin (30) was subjected to molecular weight analysis by a GPC method and it was found that a weight average molecular weight thereof calculated in terms of polystyrene was 12,100. A molar ratio of repeating units corresponding to the norbornene, maleic anhydride, tert-butyl acrylate and 2-methylcyclohexyl-2-propyl acrylate determined from an NMR spectrum was 32/39/19/10.

Resins (31) to (37) were synthesized in a similar manner to Synthesis Example (3), respectively. The polymer component ratio and weight average molecular weight of each of Resins (31) to (37) and Resins (38) to (39) described above are shown in Tables 4 and 5 below.

TABLE 4

| Resin | Norbornene Unit (mol %) | Acid Anhydride Unit (mol %) | (Meth)acrylate Unit (mol %) | Weight Average Molecular Weight |
|---|---|---|---|---|
| 31 | 20/15 | 40 | 15/10 | 11,900 |
| 32 | 32 | 37 | 20/8/3 | 10,500 |
| 33 | 16 | 21 | 36/27 | 13,900 |
| 34 | 15 | 22 | 34/29 | 12,300 |
| 35 | 17 | 20 | 33/30 | 12,400 |
| 36 | 18 | 24 | 32/26 | 13,000 |
| 37 | 15 | 19 | 36/30 | 12,700 |

TABLE 5

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 38 | 40 | 40 | 20 | — | 9,300 |
| 39 | 40 | 50 | 10 | — | 7,600 |

Structures of Resins (30) to (37) and Resins (38) to (39) described above are shown below.

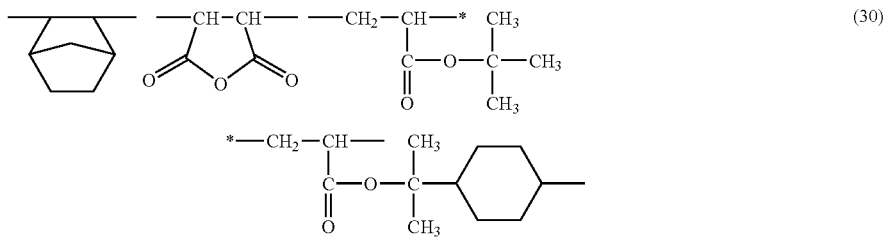

(30)

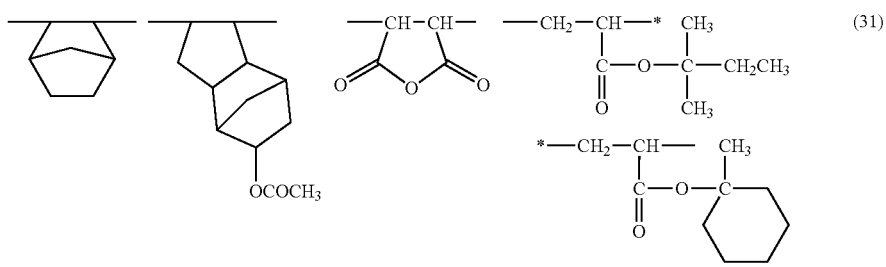

(31)

TABLE 5-continued
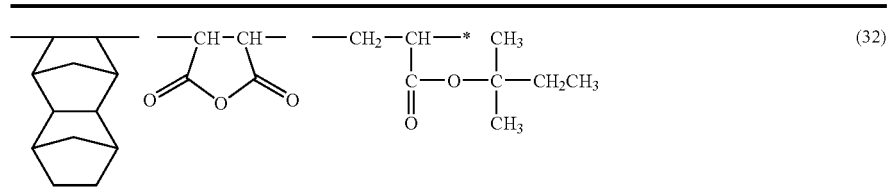 (32)
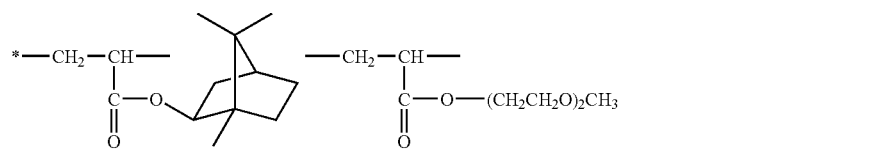
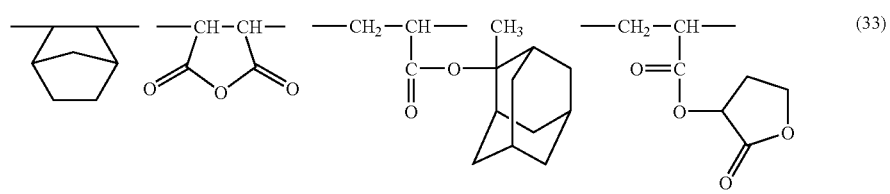 (33)
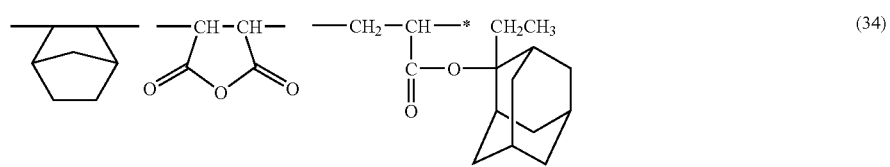 (34)
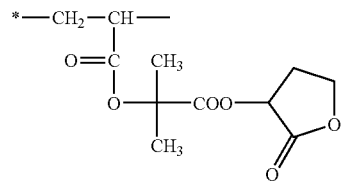
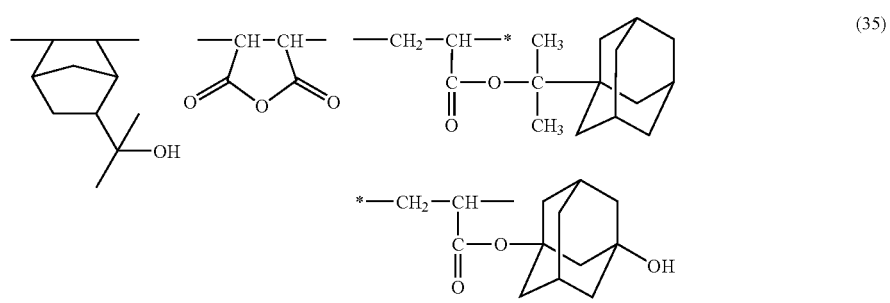 (35)
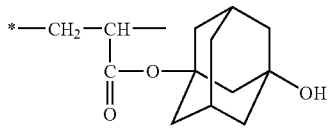
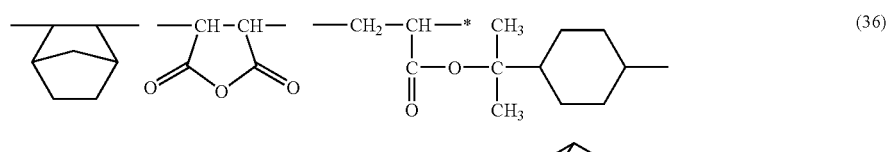 (36)
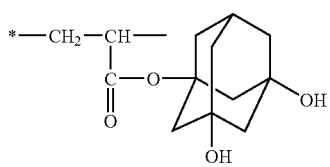

TABLE 5-continued

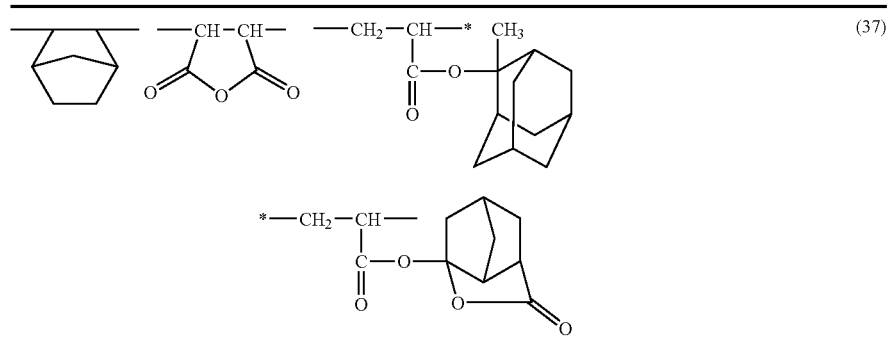

(37)

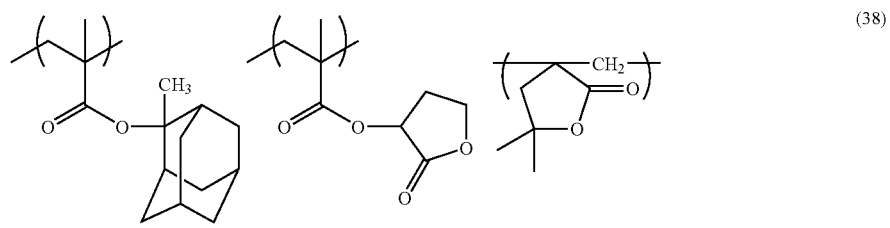

(38)

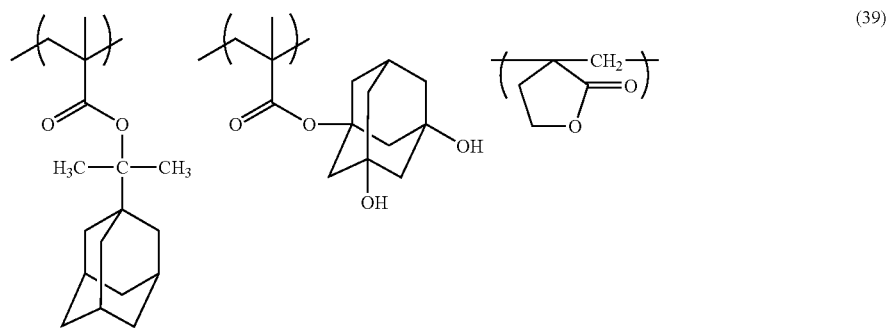

(39)

Examples 101 to 139 and Comparative Examples 101 and 102

<Preparation of Resist>

In each of Examples 101 to 139 and Comparative Examples 101 and 102, the components as shown in Tables 6 and 7 below were dissolved to prepare a solution having a solid concentration of 12% by weight. The resulting solution was filtered through a Teflon filter having a pore size of 0.1 μm, whereby a photosensitive composition was prepared.

The amount of surface active agent added was 100 ppm based the total solution of photosensitive composition (including the solvent).

On a silicon substrate which had been subjected to a hexamethyldisilazane treatment was uniformly coated a reflection preventing film (ARC 25 manufactured by Brewer Science, Inc.) at a thickness of 600 angstroms by a spin coater, dried at 100° C. for 90 seconds on a hot plate, and further dried by heating at 190° C. for 240 seconds. Then, each of the photosensitive compositions described above was coated thereon by a spin coater and dried at 120° C. for 90 seconds to form a resist film having a thickness of 0.30 μm.

The resist film was subjected to exposure using an ArF excimer laser stepper (manufacture by ISI Co., Ltd.; NA=0.6 (σ=0.75, ⅔ annular illumination) through a mask and immediately after the exposure, it was heated at 120° C. for 90 seconds on a hot plate. Then the resist film was developed with a 2.38% by weight aqueous solution of tetramethylammonium hydroxide at 23° C. for 60 seconds, rinsed with pure water for 30 seconds, and dried to form a resist line pattern.

The resist pattern was evaluated according to the methods shown below.

The results obtained are shown in Tables 8 and 9 below.

TABLE 6

| Example | Resin (10 g) | Acid Generator (A1) (g) | Sugar Derivative (0.5 g in total) (weight ratio) | Other Acid Generator (g) | Basic Compound (g) | Surface Active Agent | Solvent (weight ratio) |
|---|---|---|---|---|---|---|---|
| 101 | 1 | A1I-1 (0.05) | 1 | Z6 (0.20) | DBN (0.02) | W-1 | A1 = 100 |
| 102 | 2 | A1I-2 (0.075) | 3 | Z2 (0.10) | TMEA (0.02) | W-1 | A1 = 100 |
| 103 | 3 | A1I-3 (0.10) | 4 | — | TPSA (0.02) | W-2 | A1 = 100 |
| 104 | 4 | A1I-5 (0.02) | 6 | Z14 (0.20) | HEP (0.01) | W-2 | A3/B1 = 80/20 |
| 105 | 5 | A1I-7 (0.01) | 8 | Z14 (0.20) | TOA (0.03) | W-3 | A2/B1 = 90/10 |
| 106 | 6 | A1I-8 (0.075) | 10 | — | TBAH (0.01) | W-3 | A4/B1 = 90/10 |
| 107 | 7 | A1I-13 (0.20) | 12 | — | TPA (0.007) | W-4 | A1/B1 = 50/50 |
| 108 | 8 | A1I-18 (0.03) | 14 | Z27 (0.50) | DBN (0.02) | W-4 | A1/B1 = 90/10 |
| 109 | 9 | A1I-20 (0.075) | 17 | Z27 (0.50) | TPI (0.03) | W-1 | A5/B2 = 90/10 |
| 110 | 10 | A1I-26 (0.30) | 18 | — | PDEA (0.02) | W-1 | A1/A4 = 95/5 |
| 111 | 11 | A1I-20 (0.06) | 20 | Z33 (0.20) | DIA (0.02) | W-2 | A1/B1 = 70/30 |
| 112 | 12 | A1II-4 (0.10) | 21 | — | DIA/PDEA (0.01/0.01) | W-2 | A1/B1 = 95/5 |
| 113 | 13 | A1III-1 (0.20) | 23 | — | TPI (0.03) | W-3 | A1/B1 = 95/5 |
| 114 | 14 | A1III-4 (0.05) | 24 | — | DBN (0.02) | W-3 | A1/B1 = 95/5 |
| 115 | 15 | A1I-20 (0.03) | 27 | Z33 (0.20) | DIA (0.02) | W-4 | A1/B1 = 60/40 |
| 116 | 16 | A1VIII-1 (0.10) | 32/46 = 1/1 | — | TPA (0.01) | W-4 | A1 = 100 |
| 117 | 17 | A1VIII-2 (0.30) | 34 | — | TPI (0.03) | W-1 | A1 = 100 |
| 118 | 18 | A1VIII-4 (0.30) | 35 | Z2 (0.10) | DCMA (0.01) | W-1 | A1 = 100 |
| 119 | 19 | A1VIII-15 (0.30) | 37 | — | TPI (0.02) | W-2 | A1/B1 = 95/5 |
| 120 | 20 | A1VIII-18 (0.20) | 40 | — | TPI (0.03) | W-2 | A1/B1 = 95/5 |
| 121 | 21 | A1VIII-23 (0.075) | 43/90 = 3/7 | Z26 (0.50) | DBN (0.02) | W-3 | A1/B1 = 95/5 |
| 122 | 22 | A1VIII-26 (0.01) | 45 | — | PDEA (0.02) | W-3 | A1/B1 = 80/20 |
| 123 | 23 | A1IX-2 (0.50) | 46 | — | TPSA (0.02) | W-4 | A1/B1 = 90/10 |
| 124 | 24 | A1IX-3 (0.40) | 48 | — | HEP (0.01) | W-4 | A3/B2 = 80/20 |
| 125 | 25 | A1IX-9 (0.50) | 52 | — | DIA (0.02) | W-1 | A2/B1 = 90/10 |
| 126 | 26 | A1I-19 (0.10) | 56 | — | TOA (0.03) | W-1 | A4/B1 = 90/10 |
| 127 | 27 | A1I-20 (0.05) | 57 | Z33 (0.20) | DIA (0.03) | W-2 | A1/B1 = 50/50 |

TABLE 7

| Example | Resin (10 g) | Acid Generator (A1) (g) | Sugar Derivative (0.5 g in total) | Other Acid Generator (g) | Basic Compound (g) | Surface Active Agent | Solvent (weight ratio) |
|---|---|---|---|---|---|---|---|
| 128 | 28 | A1I-16 (0.075) | 62 | Z14 (0.20) | TBAH (0.01) | W-2 | A1/B1 = 90/10 |
| 129 | 29 | A1I-17 (0.15) | 63 | — | DCMA (0.01) | W-3 | A5/B2 = 90/10 |
| 130 | 30 | A1I-20 (0.03) | 65 | Z2 (0.10) | TPI (0.02) | W-3 | A1/B1 = 95/5 |
| 131 | 31 | A1I-25 (0.02) | 68 | Z2 (0.10) | TPI (0.03) | W-4 | A1/B1 = 90/10 |
| 132 | 32 | A1I-18 (0.075) | 70 | Z6 (0.20) | TPI (0.03) | W-4 | A1/B1 = 95/5 |
| 133 | 33 | A1I-22 (0.075) | 78 | Z6 (0.20) | TPI (0.02) | W-1 | A1/B1 = 95/5 |
| 134 | 34 | A1IX-8 (0.2) | 79 | — | TMEA (0.02) | W-1 | A1/B1 = 95/5 |
| 135 | 35 | A1I-11 (0.01) | 84 | Z33 (0.20) | TPI (0.02) | W-1 | A1/B1 = 80/20 |
| 136 | 36 | A1I-20 (0.05) | 90 | Z33 (0.20) | DBN (0.02) | W-1 | A1/B1 = 80/20 |
| 137 | 37 | A1VIII-1 (0.1) | 95 | — | TMEA (0.02) | W-1 | A1/B1 = 95/5 |

TABLE 7-continued

| Example | Resin (10 g) | Acid Generator (A1) (g) | Sugar Derivative (0.5 g in total) | Other Acid Generator (g) | Basic Compound (g) | Surface Active Agent | Solvent (weight ratio) |
|---|---|---|---|---|---|---|---|
| 138 | 38 | A1I-1 (0.05) | 98 | Z14 (0.20) | DBN (0.02) | W-1 | A1 = 100 |
| 139 | 39 | A1I-2 (0.075) | 100 | Z14 (0.20) | DBN (0.02) | W-1 | A1 = 100 |
| Comparative Example 101 | 1 | TPSNF (0.2) | — | — | DBN (0.02) | W-1 | A1 = 100 |
| Comparative Example 102 | 1 | A1I-1 (0.2) | — | — | DBN (0.02) | W-1 | A1 = 100 |

The abbreviations used in Tables 6 and 7 are explained below.
TPSNF: Triphenylsulfonium nonaflate
DBN: 1,5-Diazabicyclo[4.3.0]non-5-ene
TPI: 2,4,5-Triphenylimidazole
TPSA: Triphenylsulfonium acetate
HEP: N-Hydroxyethylpiperidine
DIA: 2,6-Diisopropylaniline
DCMA: Dicyclohexylmethylamine
TPA: Tripentylamine
TOA: Tri-n-octylamine
HAP: Hydroxyantipyrine
TBAH: Tetrabutylammoniumhydroxide
TMEA: Tris(methoxyethoxyethyl)amine
PDEA: N-Phenyldiethanolamine
W-1: Megafac F176 (manufactured by Dainippon Ink and Chemicals, Inc.) (fluorine-base)
W-2: Megafac R08 (manufactured by Dainippon Ink and Chemicals, Inc.) (fluorine- and silicon-base)
W-3: Polysiloxane Polymer KP-341 (manufactured by Shin-Etsu Chemical Co., Ltd.) (silicon-base)
W-4: Troysol S-366 (manufactured by Troy Chemical Co., Ltd.)

The abbreviations used for the solvents are explained below. When plural solvents were used, a ratio of the solvents was indicated by weight in Tables 6 and 7.
A1: Propylene glycol methyl ether acetate
A2: 2-Heptanone
A3: Ethyl ethoxypropionate
A4: γ-Butyrolactone
A5: Cyclohexanone
B1: Propylene glycol methyl ether
B2: Ethyl lactate <Evaluation of Resist Pattern>

[Development Defect]
With respect to the resist pattern obtained above, a number of the development defect occurred was measured by an apparatus (KLA-2112 manufactured by KLA Tencor Corp.). The primary data value obtained was designated as the number of development defect.

[PED Stability]
The resist film was exposed in an amount for reproducing 0.13 μm-line pattern and subjected to PED (allowing to stand at 23° C. for 60 minutes after the exposure), followed by the heat treatment and development as described above to form a line pattern. A fluctuation rate of linewidth was evaluated by means of the equation shown below. The value obtained was designated as the PED stability.

PED Stability (%)=[(linewidth of 0.13 μm-line pattern formed with the lapse of time after the exposure until the heat treatment)−(linewidth of 0.13 μm-line pattern formed by conducting the heat treatment immediately after the exposure)]/(0.13 μm)×100

TABLE 8

| Example | Development Defect (number) | PED Stability |
|---|---|---|
| 101 | 520 | 3.2 |
| 102 | 630 | 3.8 |
| 103 | 1030 | 5.7 |
| 104 | 412 | 2.7 |
| 105 | 340 | 2.4 |
| 106 | 774 | 4.4 |
| 107 | 1100 | 6.0 |
| 108 | 340 | 2.4 |
| 109 | 267 | 2.0 |
| 110 | 1136 | 6.2 |
| 111 | 50 | 1.0 |
| 112 | 883 | 5.0 |
| 113 | 955 | 5.3 |
| 114 | 702 | 4.1 |
| 115 | 86 | 1.2 |
| 116 | 484 | 3.1 |
| 117 | 991 | 5.5 |
| 118 | 629 | 3.8 |
| 119 | 484 | 3.1 |
| 120 | 470 | 3.0 |
| 121 | 267 | 2.0 |
| 122 | 448 | 2.9 |
| 123 | 629 | 3.8 |
| 124 | 557 | 3.4 |
| 125 | 650 | 3.9 |
| 126 | 991 | 5.5 |
| 127 | 557 | 3.4 |

TABLE 9

| Example | Development Defect (number) | PED Stability |
|---|---|---|
| 128 | 666 | 3.9 |
| 129 | 1064 | 5.8 |
| 130 | 557 | 3.4 |
| 131 | 602 | 3.6 |
| 132 | 670 | 4.0 |
| 133 | 622 | 3.7 |
| 134 | 1100 | 6.0 |
| 135 | 629 | 3.8 |
| 136 | 521 | 3.2 |
| 137 | 1064 | 5.8 |
| 138 | 629 | 3.8 |
| 139 | 712 | 4.2 |
| Comparative Example 101 | 8200 | 15.3 |

TABLE 9-continued

| Example | Development Defect (number) | PED Stability |
|---|---|---|
| Comparative Example 102 | 9300 | 16.0 |

From the results shown in Tables 8 and 9, it is apparent that the positive photosensitive composition according to the present invention is refrained from the occurrence of development defect and is excellent in the PED stability.

Examples 201 to 239 and Comparative Examples 201 and 202

<Preparation of Resist>

In each of Examples 201 to 239 and Comparative Example 201 and 202, the components as shown in Tables 10 and 11 below were dissolved to prepare a solution having a solid concentration of 12% by weight. The resulting solution was filtered through a Teflon filter having a pore size of 0.1 μm, whereby a photosensitive composition was prepared.

The amount of surface active agent added was 100 ppm based the total solution of photosensitive composition (including the solvent).

On a silicon substrate which had been subjected to a hexamethyldisilazane treatment was uniformly coated a reflection preventing film (ARC 25 manufactured by Brewer Science, Inc.) at a thickness of 600 angstroms by a spin coater, dried at 100° C. for 90 seconds on a hot plate, and further dried by heating at 190° C. for 240 seconds. Then, each of the photosensitive compositions described above was coated thereon by a spin coater and dried at 120° C. for 90 seconds to form a resist film having a thickness of 0.30 μm.

The resist film was subjected to exposure using an ArF excimer laser stepper (manufacture by ISI Co., Ltd.; NA=0.6 (σ=0.75, ⅔ annular illumination) through a mask and immediately after the exposure, it was heated at 120° C. for 90 seconds on a hot plate. Then the resist film was developed with a 2.38% by weight aqueous solution of tetramethylammonium hydroxide at 23° C. for 60 seconds, rinsed with pure water for 30 seconds, and dried to form a resist line pattern.

The resist pattern was evaluated according to the methods shown below.

The results obtained are shown in Tables 12 and 13 below.

TABLE 10

| Example | Resin (10 g) | Acid Generator (A1) (g) | Onium Salt (A2) (g) | Other Acid Generator (g) | Basic Compound (g) | Surface Active Agent | Solvent (weight ratio) |
|---|---|---|---|---|---|---|---|
| 201 | 1 | A1I-1 (0.05) | A2-1-1 (0.01) | Z6 (0.20) | DBN (0.02) | W-1 | A1 = 100 |
| 202 | 2 | A1I-2 (0.075) | A2-1-2 (0.01) | Z2 (0.10) | TMEA (0.02) | W-1 | A1 = 100 |
| 203 | 3 | A1I-3 (0.10) | A2-1-3 (0.01) | — | TPSA (0.02) | W-2 | A1 = 100 |
| 204 | 4 | A1I-5 (0.02) | A2-1-5 (0.02) | Z14 (0.20) | HEP (0.01) | W-2 | A3/B1 = 80/20 |
| 205 | 5 | A1I-7 (0.01) | A2-1-7 (0.03) | Z14 (0.20) | TOA (0.03) | W-3 | A2/B1 = 90/10 |
| 206 | 6 | A1I-8 (0.075) | A2-1-8 (0.01) | — | TBAH (0.01) | W-3 | A4/B1 = 90/10 |
| 207 | 7 | A1I-13 (0.20) | A2-1-10 (0.03) | — | TPA (0.007) | W-4 | A1/B1 = 50/50 |
| 208 | 8 | A1I-18 (0.03) | A2-1-11 (0.03) | Z27 (0.50) | DBN (0.02) | W-4 | A1/B1 = 90/10 |
| 209 | 9 | A1I-20 (0.075) | A2-1-28 (0.04) | Z27 (0.50) | TPI (0.03) | W-1 | A5/B2 = 90/10 |
| 210 | 10 | A1I-26 (0.30) | A2-1-29 (0.01) | — | PDEA (0.02) | W-1 | A1/A4 = 95/5 |
| 211 | 11 | A1I-20 (0.06) | A2-1-39 (0.01) | Z33 (0.20) | DIA (0.02) | W-2 | A1/B1 = 70/30 |
| 212 | 12 | A1II-4 (0.10) | A2-1-40 (0.01) | — | DIA/PDEA (0.01/0.01) | W-2 | A1/B1 = 95/5 |
| 213 | 13 | A1III-1 (0.20) | A2-1-43 (0.02) | — | TPI (0.03) | W-3 | A1/B1 = 95/5 |
| 214 | 14 | A1III-4 (0.05) | A2-2-1 (0.05) | — | DBN (0.03) | W-3 | A1/B1 = 95/5 |
| 215 | 15 | A1I-20 (0.03) | A2-3-1 (0.03) | Z33 (0.20) | DIA (0.02) | W-4 | A1/B1 = 60/40 |
| 216 | 16 | A1VIII-1 (0.10) | A2-3-2 (0.01) | — | TPA (0.01) | W-4 | A1 = 100 |
| 217 | 17 | A1VIII-2 (0.30) | A2-3-5 (0.03) | — | TPI (0.03) | W-1 | A1 = 100 |
| 218 | 18 | A1VIII-4 (0.30) | A2-1-5 (0.015)/ A2-3-1 (0.015) | Z2 (0.10) | DCMA (0.01) | W-1 | A1 = 100 |

TABLE 10-continued

| Example | Resin (10 g) | Acid Generator (A1) (g) | Onium Salt (A2) (g) | Other Acid Generator (g) | Basic Compound (g) | Surface Active Agent | Solvent (weight ratio) |
|---|---|---|---|---|---|---|---|
| 219 | 19 | A1VIII-15 (0.30) | A2-1-39 (0.01)/ A2-3-1 (0.015) | — | TPI (0.02) | W-2 | A1/B1 = 95/5 |
| 220 | 20 | A1VIII-18 (0.20) | I-1 (0.015) | — | TPI (0.03) | W-2 | A1/B1 = 95/5 |
| 221 | 21 | A1VIII-23 (0.075) | I-2 (0.005) | Z26 (0.50) | DBN (0.02) | W-3 | A1/B1 = 95/5 |
| 222 | 22 | A1VIII-26 (0.01) | I-3 (0.02) | — | PDEA (0.02) | W-3 | A1/B1 = 80/20 |
| 223 | 23 | A1IX-2 (0.50) | I-9 (0.06) | — | TPSA (0.02) | W-4 | A1/B1 = 90/10 |
| 224 | 24 | A1IX-3 (0.40) | I-10 (0.05) | — | HEP (0.01) | W-4 | A3/B2 = 80/20 |
| 225 | 25 | A1IX-9 (0.50) | II-1 (0.05) | — | DIA (0.02) | W-1 | A2/B1 = 90/10 |
| 226 | 26 | A1I-9 (0.10) | II-2 (0.02) | — | TOA (0.03) | W-1 | A4/B1 = 90/10 |
| 227 | 27 | A1I-20 (0.05) | II-3 (0.075) | Z33 (0.20) | DIA (0.03) | W-2 | A1/B1 = 50/50 |

TABLE 11

| Example | Resin (10 g) | Acid Generator (A1) (g) | Onium Salt (A2) (g) | Other Acid Generator (g) | Basic Compound (g) | Surface Active Agent | Solvent (Weight ratio) |
|---|---|---|---|---|---|---|---|
| 228 | 28 | A1I-16 (0.075) | II-7 (0.075) | Z14 (0.20) | TBAH (0.01) | W-2 | A1/B1 = 90/10 |
| 229 | 29 | A1I-17 (0.15) | II-14 (0.02) | — | DCMA (0.01) | W-3 | A5/B2 = 90/10 |
| 230 | 30 | A1I-20 (0.03) | II-17 (0.005) | Z2 (0.10) | TPI (0.02) | W-3 | A1/B1 = 95/5 |
| 231 | 31 | A1I-25 (0.02) | II-20 (0.005) | Z2 (0.10) | TPI (0.03) | W-4 | A1/B1 = 90/10 |
| 232 | 32 | A1I-18 (0.075) | II-25 (0.03) | Z6 (0.20) | TPI (0.03) | W-4 | A1/B1 = 95/5 |
| 233 | 33 | A1I-22 (0.075) | II-30 (0.03) | Z6 (0.20) | TPI (0.02) | W-1 | A1/B1 = 95/5 |
| 234 | 34 | A1IX-8 (0.2) | II-40 (0.03) | — | TMEA (0.02) | W-1 | A1/B1 = 95/5 |
| 235 | 35 | A1I-11 (0.01) | II-45 (0.01) | Z33 (0.20) | TPI (0.02) | W-1 | A1/B1 = 80/20 |
| 236 | 36 | A1I-20 (0.005) | II-56 (0.05) | Z33 (0.20) | DBN (0.02) | W-1 | A1/B1 = 80/20 |
| 237 | 37 | A1VIII-I (0.1) | II-61 (0.01) | — | TMEA (0.02) | W-1 | A1/B1 = 95/5 |
| 238 | 38 | A1I-1 (0.05) | II-1 (0.015)/ A2-3-1 (0.015) | Z14 (0.20) | DBN (0.02) | W-1 | A1 = 100 |
| 239 | 39 | A1I-2 (0.075) | A2-1-39 (0.01)/ II-2 (0.015) | Z14 (0.20) | DBN (0.02) | W-1 | A1 = 100 |
| Comparative Example 201 | 1 | TPSNF (0.2) | — | — | DBN (0.02) | W-1 | A1 = 100 |
| Comparative Example 202 | 1 | A1I-1 (0.2) | — | — | DBN (0.02) | W-1 | A1 = 100 |

The abbreviations used in Tables 10 and 11 are explained below.
TPSNF: Triphenylsulfonium nonaflate
DBN: 1,5-Diazabicyclo[4.3.0]non-5-ene
TPI: 2,4,5-Triphenylimidazole
TPSA: Triphenylsulfonium acetate
HEP: N-Hydroxyethylpiperidine
DIA: 2,6-Diisopropylaniline
DCMA: Dicyclohexylmethylamine
TPA: Tripentylamine
TOA: Tri-n-octylamine
HAP: Hydroxyantipyrine
TBAH: Tetrabutylammoniumhydroxide
TMEA: Tris(methoxyethoxyethyl)amine
PDEA: N-Phenyldiethanolamine W-1: Megafac F176 (manufactured by Dainippon Ink and Chemicals, Inc.) (fluorine-base)
W-2: Megafac R08 (manufactured by Dainippon Ink and Chemicals, Inc.) (fluorine- and silicon-base)
W-3: Polysiloxane Polymer KP-341 (manufactured by Shin-Etsu Chemical Co., Ltd.) (silicon-base)
W-4: Troysol S-366 (manufactured by Troy Chemical Co., Ltd.)

The abbreviations used for the solvents are explained below. When plural solvents were used, a ratio of the solvents was indicated by weight in Tables 10 and 11.
A1: Propylene glycol methyl ether acetate
A2: 2-Heptanone
A3: Ethyl ethoxypropionate
A4: γ-Butyrolactone
A5: Cyclohexanone
B1: Propylene glycol methyl ether
B2: Ethyl lactate <Evaluation of Resist Pattern>

[Line Edge Roughness]

At 50 points in the range of length of 5 μm in the longitudinal direction of the trench pattern, distance was measured from the standard line where the edge should be present to the edge of 0.13 μm-trench pattern obtained by the minimum exposure amount for reproducing the 0.13 μm-trench pattern in a mask using a scanning electron microscope (S-8840, manufactured by Hitachi, Ltd.), thereby determining standard deviation and calculating 3σ. As the is smaller, the better performance of line edge roughness is obtained.

[Profile]

On the section of 0.13 μm-trench pattern obtained by the minimum exposure amount for reproducing the 0.13 μm-trench pattern in a mask, width (La) of the lowermost portion (substrate surface) and width (Lb) of the uppermost portion (surface) were measured and a value of (La−Lb) was calculated. As the value is smaller, the profile becomes rectangular and better.

TABLE 12

| Example | Edge Roughness | Pent Roof Shape (La − Lb) (nm) |
|---|---|---|
| 201 | 8.8 | 9 |
| 202 | 9.1 | 10 |
| 203 | 10.2 | 15 |
| 204 | 8.5 | 7 |
| 205 | 8.3 | 6 |
| 206 | 9.5 | 12 |
| 207 | 10.4 | 16 |
| 208 | 8.3 | 6 |
| 209 | 8.1 | 5 |
| 210 | 10.5 | 16 |
| 211 | 7.5 | 3 |
| 212 | 9.8 | 13 |
| 213 | 10.0 | 14 |
| 214 | 9.3 | 11 |
| 215 | 7.6 | 3 |
| 216 | 8.7 | 8 |
| 217 | 10.1 | 15 |
| 218 | 9.1 | 10 |
| 219 | 8.7 | 8 |
| 220 | 8.7 | 8 |
| 221 | 8.1 | 5 |
| 222 | 8.6 | 8 |
| 223 | 9.1 | 10 |
| 224 | 8.9 | 9 |
| 225 | 9.2 | 10 |
| 226 | 10.1 | 15 |
| 227 | 8.9 | 9 |

TABLE 13

| Example | Edge Roughness | Pent Roof Shape (La − Lb) (nm) |
|---|---|---|
| 228 | 9.2 | 10 |
| 229 | 10.3 | 16 |
| 230 | 8.9 | 9 |
| 231 | 9.2 | 10 |
| 232 | 9.2 | 10 |
| 233 | 9.2 | 10 |
| 234 | 10.4 | 16 |
| 235 | 9.1 | 10 |
| 236 | 8.8 | 9 |
| 237 | 10.3 | 16 |
| 238 | 9.1 | 10 |
| 239 | 9.3 | 11 |
| Comparative Example 201 | 14.0 | 22 |
| Comparative Example 202 | 13.0 | 20 |

From the results shown in Tables 12 and 13, it is apparent that the positive photosensitive composition according to the present invention is improved in the line edge roughness and is excellent in the profile.

According to the present invention, the positive photosensitive composition that is refrained from the occurrence of development defect and is excellent in the PED stability can be provided.

According to the present invention, the positive photosensitive composition that is improved in the line edge roughness and is excellent in the profile can also be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive photosensitive composition comprising (A1) a compound that generates an aromatic sulfonic acid substituted with at least one fluorine atom and/or a group having at least one fluorine atom upon irradiation of an actinic ray or radiation, (B) a resin that has a monocyclic or polycyclic alicyclic hydrocarbon structure and is decomposed by the action of an acid to increase solubility in an alkali developing solution, and (C) a compound that has at least three hydroxy or substituted hydroxy groups and at least one alicyclic group.

2. The positive photosensitive composition as claimed in claim 1, which further comprises (D) a basic compound and (E) a fluorine-based and/or silicon-based surface active agent.

3. The positive photosensitive composition as claimed in claim 2, wherein the basic compound (D) is a compound having at least one structure selected from an imidazole structure, a diazabicyclo structure, an onium hydroxide structure, an onium carboxylate structure, a trialkylamine structure and an aniline structure.

4. The positive photosensitive composition as claimed in claim 1, which further comprises (G) a dissolution-inhibiting low-molecular compound having a molecular weight of not more than 3,000 and a group that is decomposed by the action of an acid to increase solubility in an alkali developing solution.

5. The positive photosensitive composition as claimed in claim 1, which further comprises (F) a mixture solvent of a hydroxy group-containing solvent and a solvent free from a hydroxy group.

6. The positive photosensitive composition as claimed in claim 1, wherein the resin (B) is a resin containing at least one repeating unit selected from a repeating unit having a partial structure including an alicyclic hydrocarbon represented by formula (pI), (pII), (pIII), (pIV), (pV) or (pVI) described below and a repeating unit represented by formula (II-AB) described below:

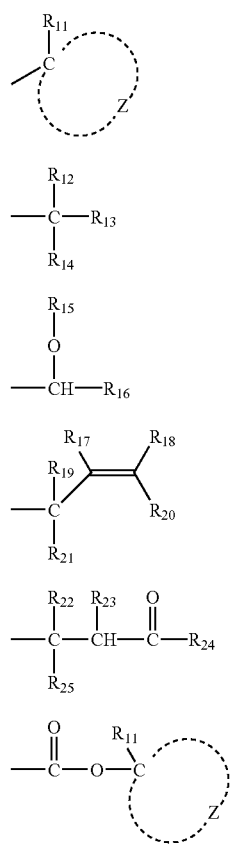

wherein $R_{11}$ represents a methyl group, an ethyl group, an n-propyl group, an isobutyl group or a sec-butyl group; Z represents an atomic group necessary for forming an alicyclic hydrocarbon group together with the carbon atom; $R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group; $R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring,

wherein $R_{11}'$ and $R_{12}'$ each independently represent a hydrogen atom, a cyano group, a halogen atom or an alkyl group which may have a substituent; and Z' represents an atomic group necessary for forming an alicyclic structure, which may be substituted, together with the connected two carbon atoms (C—C).

7. The positive photosensitive composition as claimed in claim 6, wherein the repeating unit represented by formula (II-AB) is a repeating unit represented by the following formula (II-A) or (II-B):

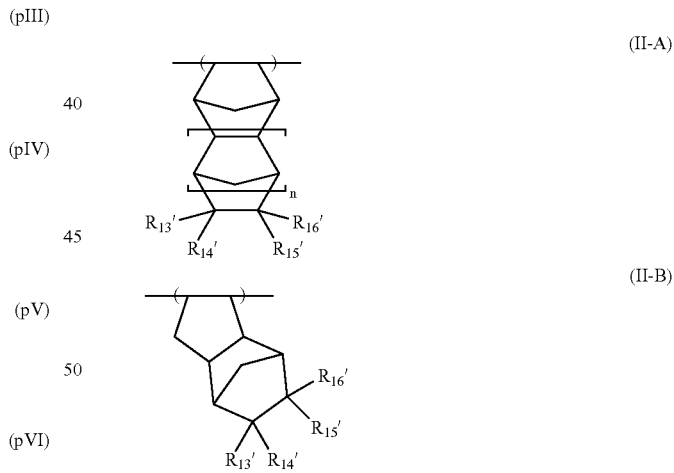

wherein $R_{13}'$ to $R_{16}'$ each independently represent a hydrogen atom, a halogen atom, a cyano group, —COOH, —$COOR_5$, a group capable of being decomposed by the action of an acid, —C(=O)—X-A'-$R_{17}'$, an alkyl group which may have a substituent or a cyclic hydrocarbon group which may have a substituent; $R_5$ represents an alkyl group which may have a substituent, a cyclic hydrocarbon group which may have a substituent or a group represented by Y; X represents an oxygen atom, a sulfur atom, —NH—, —$NHSO_2$— or —$NHSO_2NH$—; A' represents a single bond or a divalent linkage group, or at least two of $R_{13}'$ to $R_{16}'$ may be combined with each other to form a ring; n represents 0 or 1; $R_{17}'$ represents —COOH, —COOR$_5$, a cyano group, a hydroxy group, an alkoxy group which may have a substituent, —CO—NH—R$_6$, —CO—NH—SO$_2$—R$_6$ or a group represented by Y; R$_6$ represents an alkyl group which may have a substituent or a cyclic hydrocarbon group which may have a substituent; and the group represented by Y has the following formula:

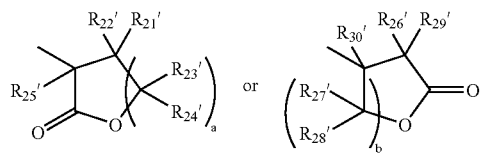

wherein $R_{21}'$ to $R_{30}'$ each independently represent a hydrogen atom or an alkyl group which may have a substituent; and a and b each represent 1 or 2.

8. The positive photosensitive composition as claimed in claim 6, wherein the resin (B) further contains a repeating unit having a lactone structure represented by the following formula (IV):

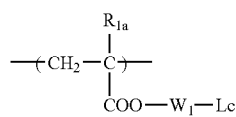
(IV)

Lc:

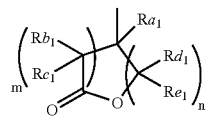

wherein $R_{1a}$ represents a hydrogen atom or a methyl group; $W_1$ represents a single bond, an alkylene group, an ether group, a thioether group, a carbonyl group, an ester group or a combination of two or more thereof; $R_{a1}$, $R_{b1}$, $R_{c1}$, $R_{d1}$ and $R_{e1}$ each independently represent a hydrogen atom or an alkyl group having from 1 to 4 carbon atoms; and m and n each independently represent an integer of from 0 to 3, provided that the sum total of m and n is from 2 to 6.

9. The positive photosensitive composition as claimed in claim 6, wherein the resin (B) further contains a repeating unit having a group represented by any one of the following formulae (V-1) to (V-5):

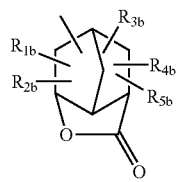
(V-1)

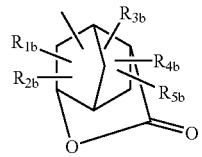
(V-2)

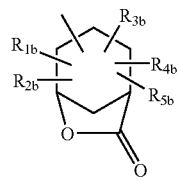
(V-3)

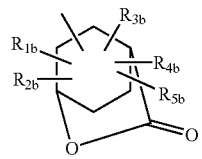
(V-4)

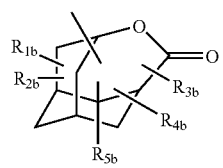
(V-5)

wherein, $R_{1b}$, $R_{2b}$, $R_{3b}$, $R_{4b}$ and $R_{5b}$ each independently represent a hydrogen atom, an alkyl group which may be substituted, a cycloalkyl group which may be substituted, an alkoxy group which may be substituted, an alkoxycarbonyl group which may be substituted, an alkylsulfonylimino group which may be substituted or an alkenyl group which may be substituted, or two of $R_{1b}$, $R_{2b}$, $R_{3b}$, $R_{4b}$ and $R_{5b}$ may be combined with each other to form a ring.

10. The positive photosensitive composition as claimed in claim 6, wherein the resin (B) further contains a repeating unit having a group represented by the following formula (VII):

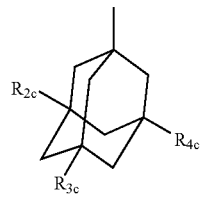
(VII)

wherein $R_{2c}$, $R_{3c}$, and $R_{4c}$ each represent a hydrogen atom or a hydroxy group, provided that at least one of $R_{2c}$, $R_{3c}$ and $R_{4c}$ represents a hydroxy group.

11. The positive photosensitive composition as claimed in claim 6, wherein the resin (B) further contains a repeating unit having a group represented by the following formula (VIII):

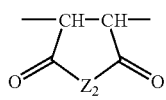
(VIII)
wherein $Z_2$ represents —O— or —N($R_{41}$)—; $R_{41}$ represents a hydrogen atom, a hydroxy group, an alkyl group, a haloalkyl group or —O—SO$_2$—$R_{42}$; and $R_{42}$ represents an alkyl group, a haloakyl group, a cycloalkyl group or a camphor residue.
* * * * *